(12) United States Patent (10) Patent No.: US 8,502,183 B2
Nishimura et al. (45) Date of Patent: Aug. 6, 2013

(54) SEMICONDUCTOR MEMORY DEVICE INCLUDING MEMORY CELL HAVING RECTIFYING ELEMENT AND SWITCHING ELEMENT

(75) Inventors: Jun Nishimura, Yokkaichi (JP);
Nobuaki Yasutake, Yokkaichi (JP);
Takeshi Murata, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 415 days.

(21) Appl. No.: 12/837,386

(22) Filed: Jul. 15, 2010

(65) Prior Publication Data
US 2011/0233500 A1 Sep. 29, 2011

(30) Foreign Application Priority Data
Mar. 23, 2010 (JP) .................................. 2010-066945

(51) Int. Cl.
*H01L 45/00* (2006.01)
(52) U.S. Cl.
USPC ............................. 257/4; 257/5; 257/E45.001
(58) Field of Classification Search
USPC ........................ 257/2–4, E45.001, 5, E45.002
See application file for complete search history.

(56) References Cited

U.S. PATENT DOCUMENTS

| 7,745,812 | B2 * | 6/2010 | Happ et al. ......................... 257/4 |
| 7,851,253 | B2 * | 12/2010 | Chen .............................. 438/102 |
| 8,097,538 | B2 * | 1/2012 | Koide et al. .................... 438/669 |
| 8,233,308 | B2 * | 7/2012 | Schricker et al. ............. 365/148 |
| 8,405,061 | B2 * | 3/2013 | Yasutake ............................ 257/3 |
| 2009/0121208 | A1 | 5/2009 | Nagashima et al. |
| 2010/0032638 | A1 * | 2/2010 | Xu .................................... 257/2 |

FOREIGN PATENT DOCUMENTS

JP 2009-123900 6/2009

* cited by examiner

*Primary Examiner* — Tuan N. Quach
(74) *Attorney, Agent, or Firm* — Knobbe, Martens, Olson & Bear LLP

(57) ABSTRACT

According to one embodiment, a semiconductor memory device includes a first conductive line, a second conductive line, a rectifying element, a switching element, a first side wall film and a second side wall film. The first conductive line extends in a first direction. The second conductive line extends in a second direction crossing the first direction. The rectifying element is connected between the first and second conductive lines. The switching element is connected in series with the rectifying element between the first and second conductive lines. The first side wall film is formed on a side surface of the rectifying element. The second side wall film is formed on a side surface of at least one of the first and second conductive lines. At least one of a film type and a film thickness of the second side wall film is different from that of the first side wall film.

11 Claims, 47 Drawing Sheets

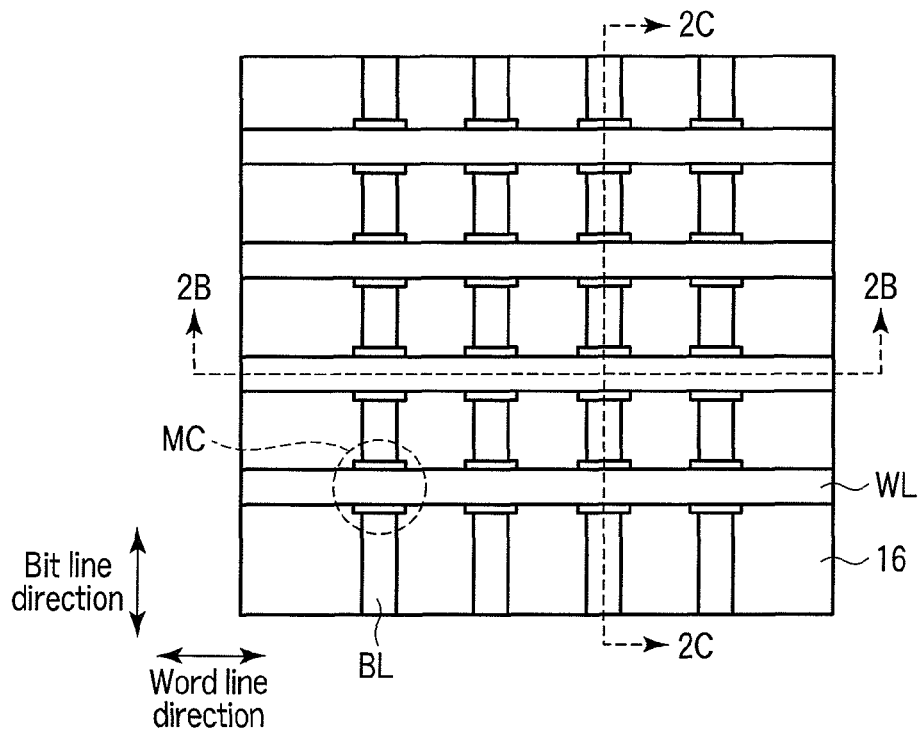
F I G. 2A
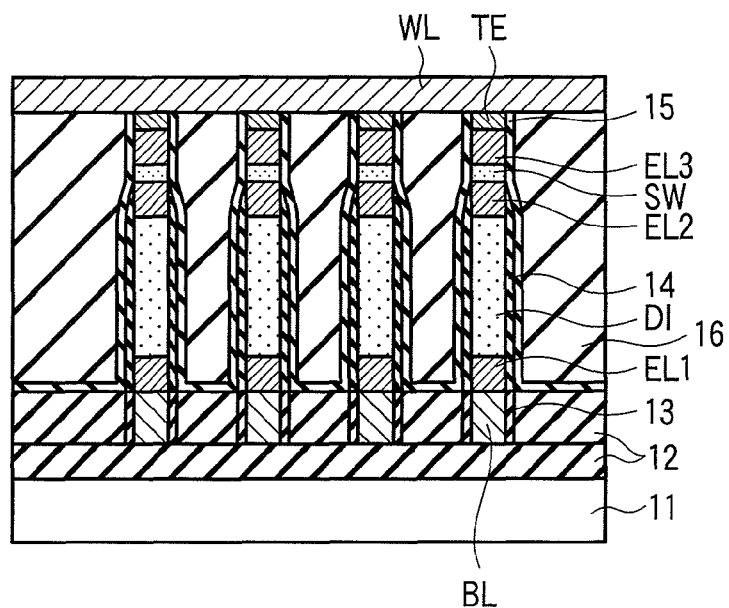
F I G. 2B

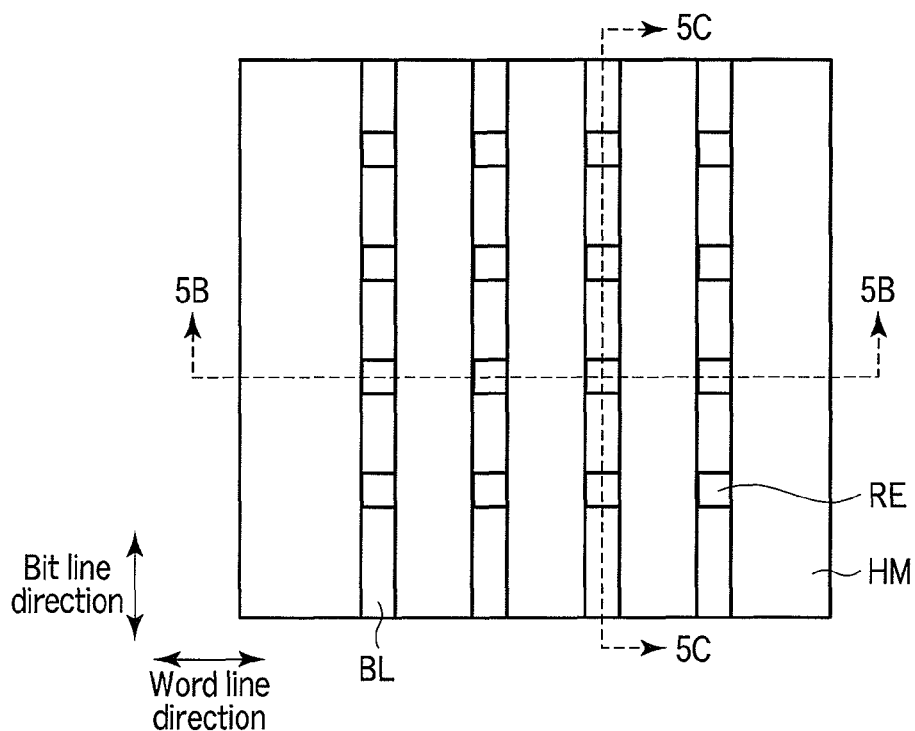
F I G. 5A
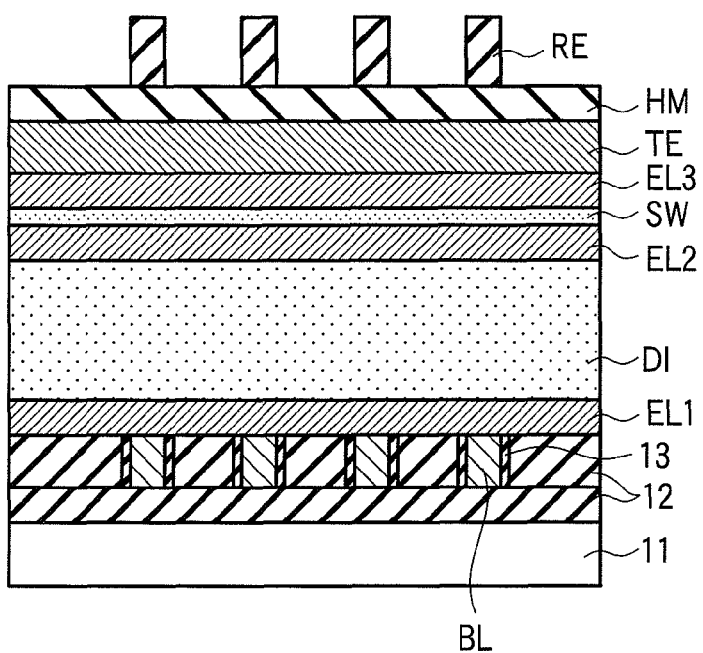
F I G. 5B

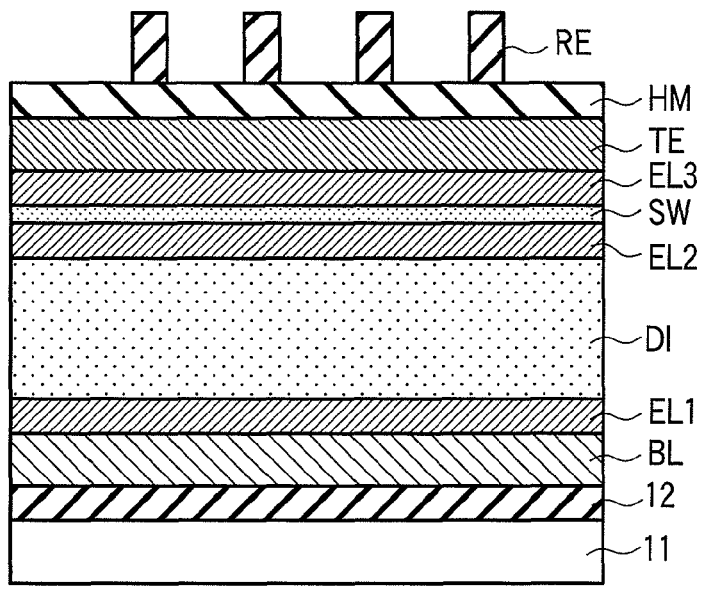
F I G. 5C
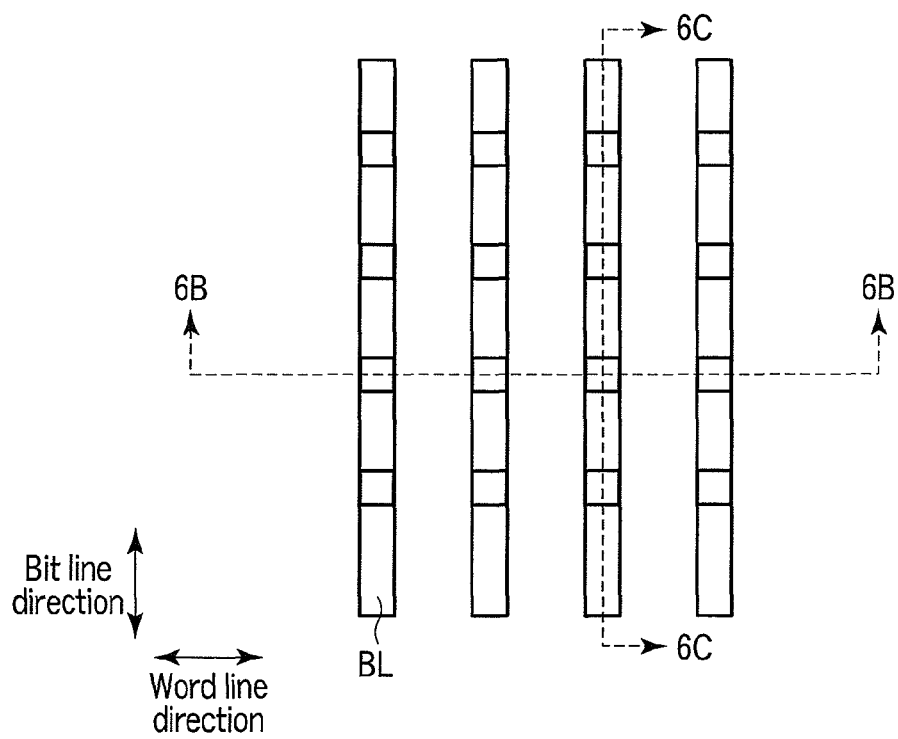
F I G. 6A

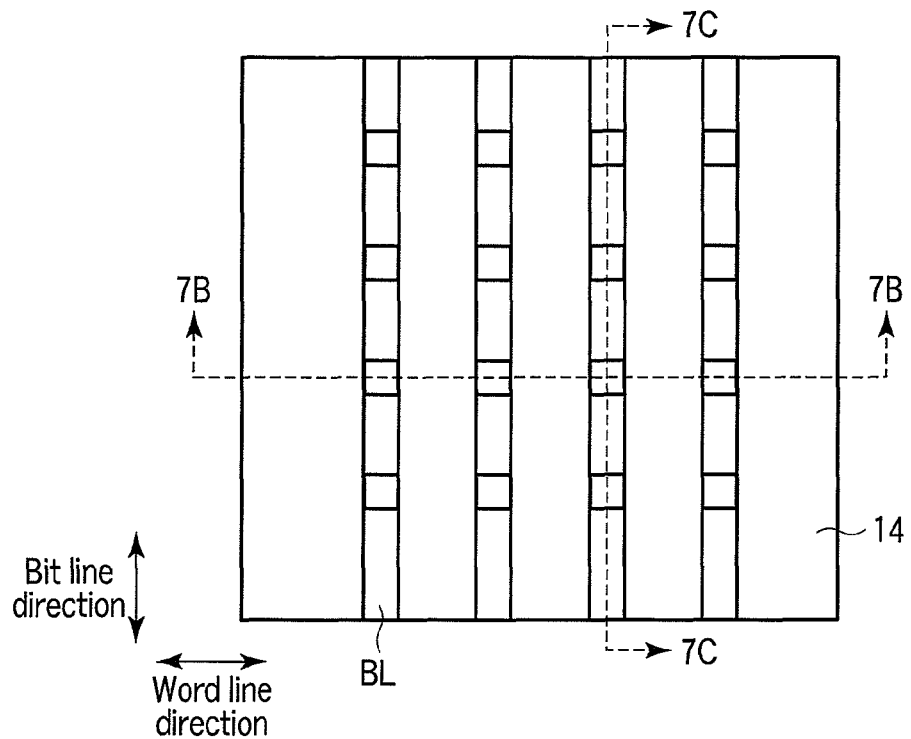
F I G. 7A
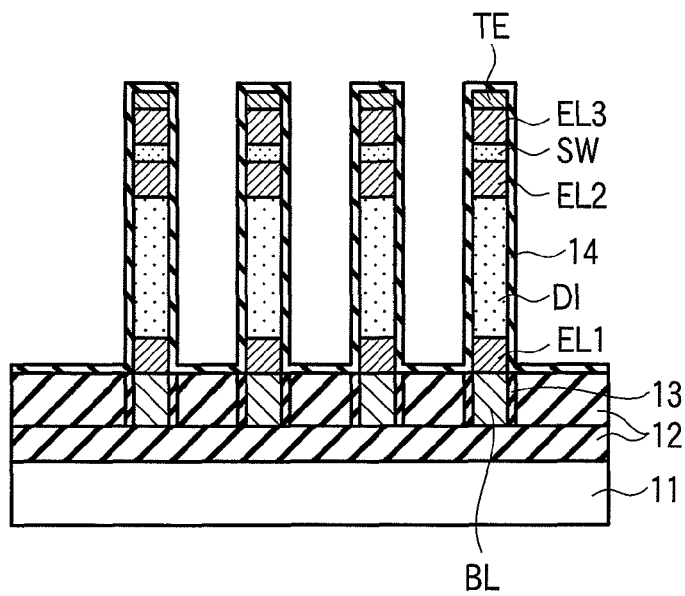
F I G. 7B

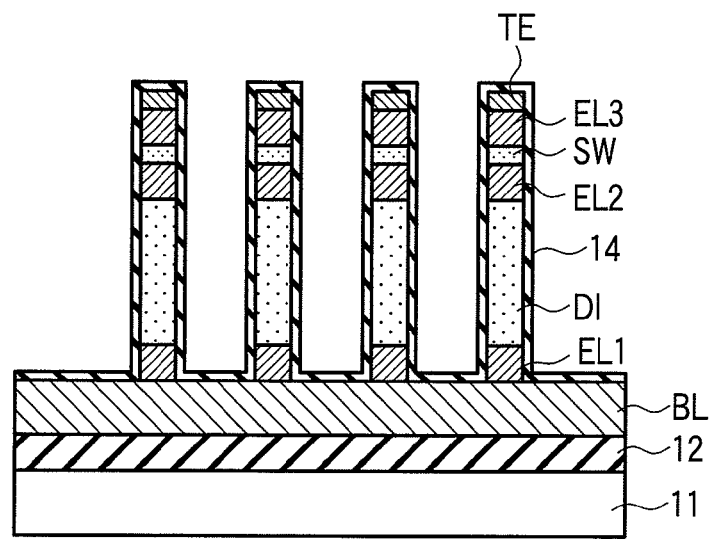
F I G. 7C
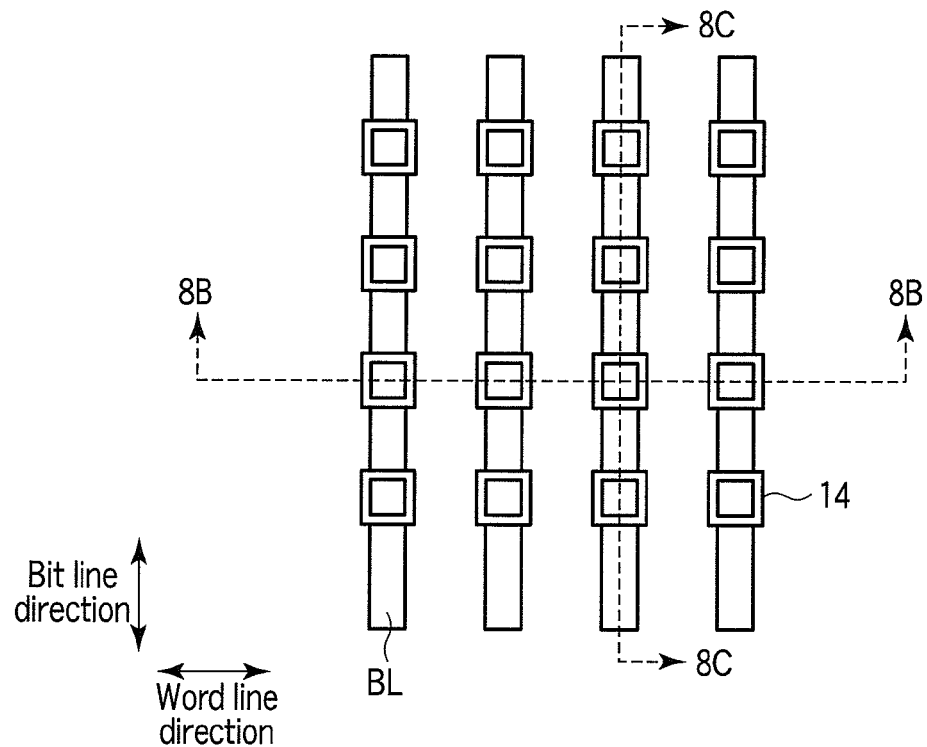
F I G. 8A

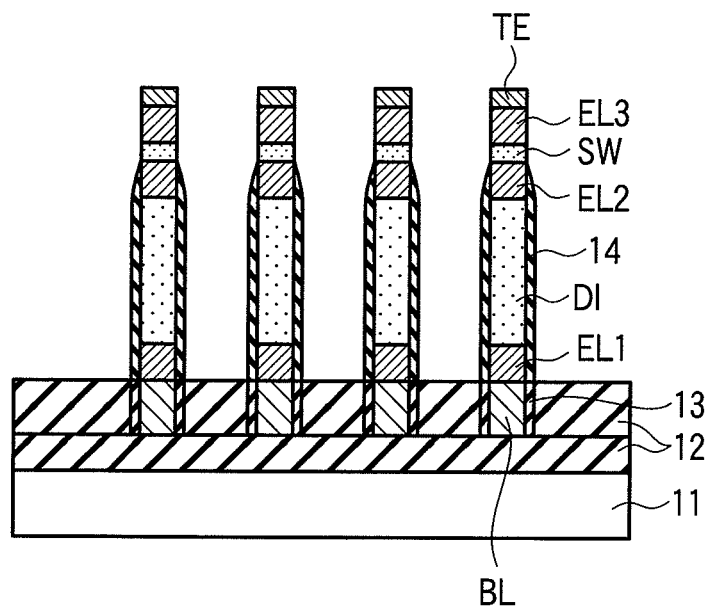
F I G. 8B
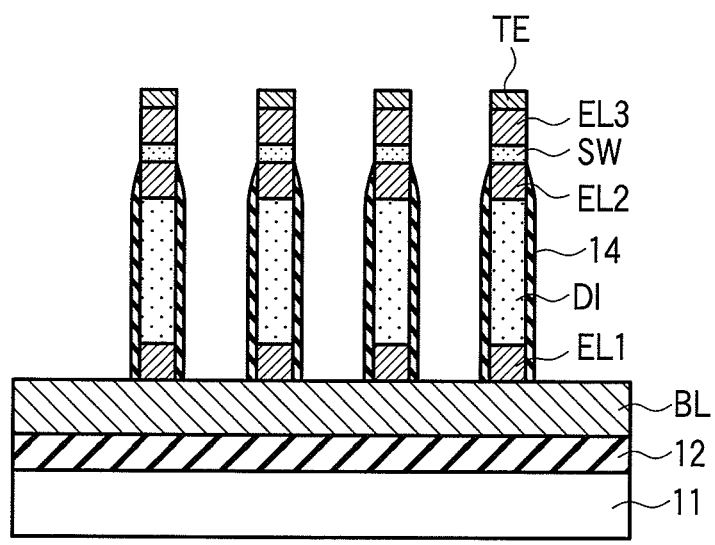
F I G. 8C

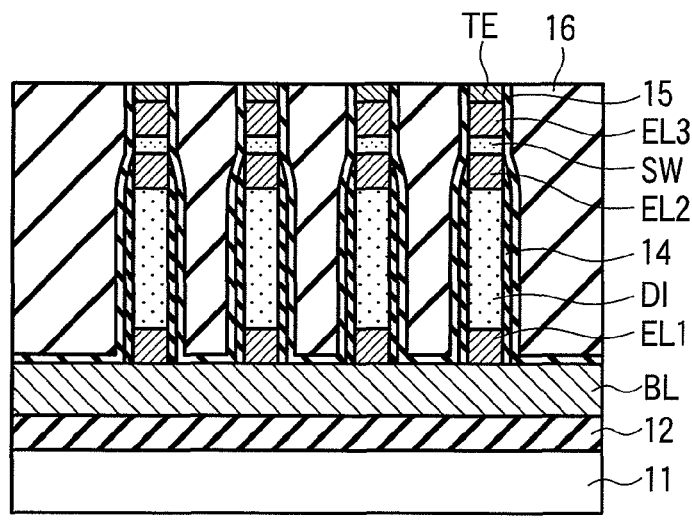
F I G. 11C
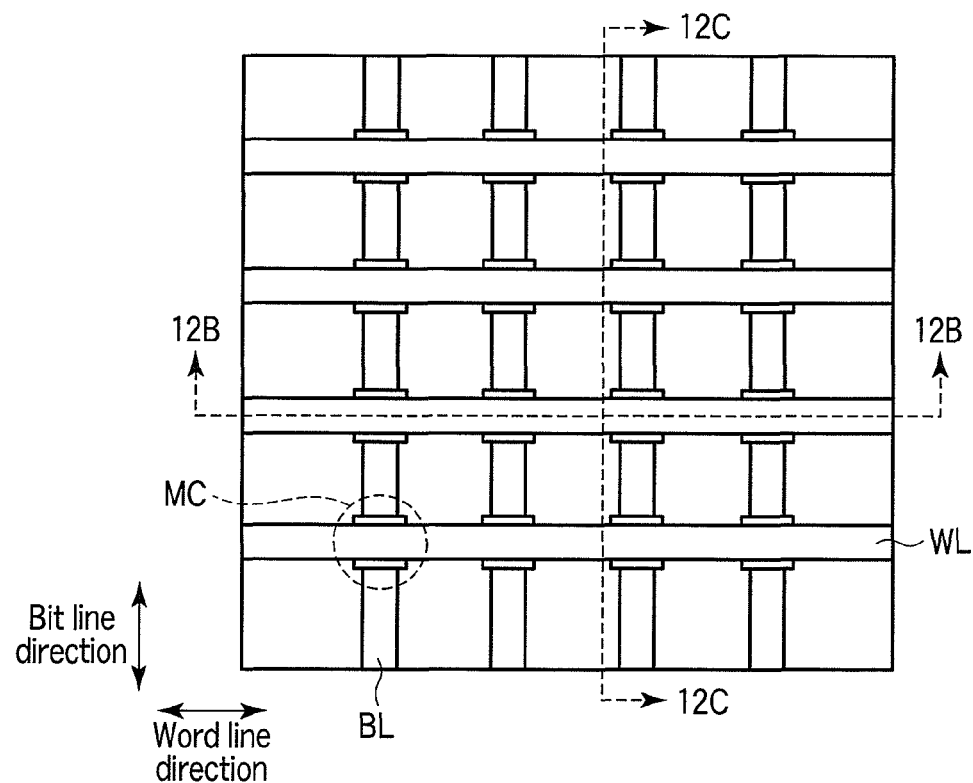
F I G. 12A

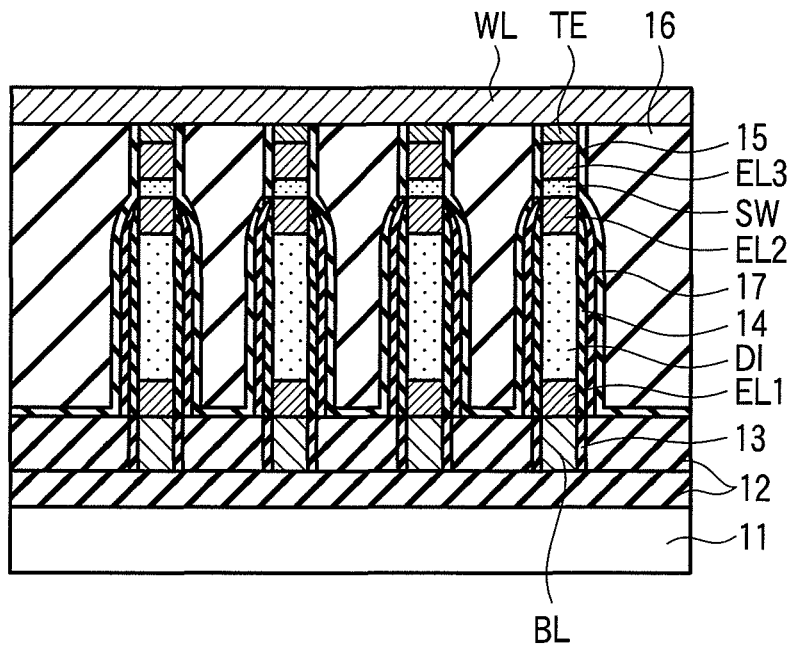
F I G. 12B
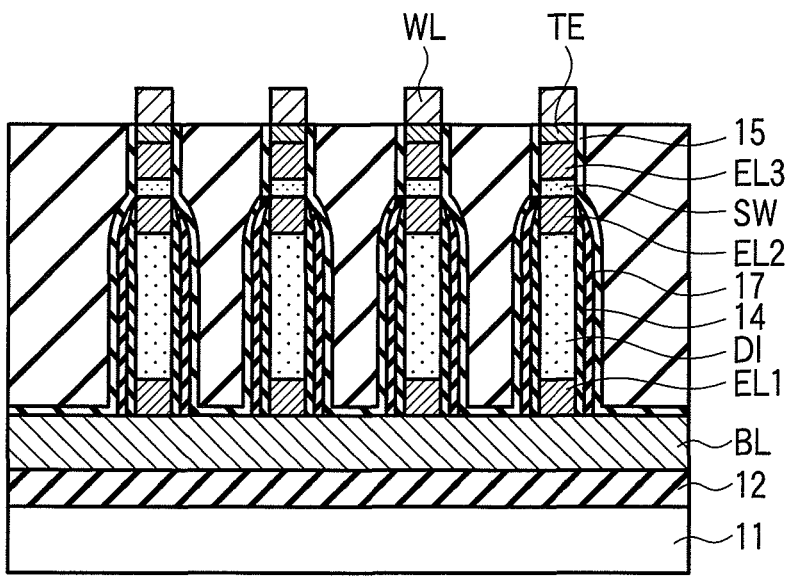
F I G. 12C

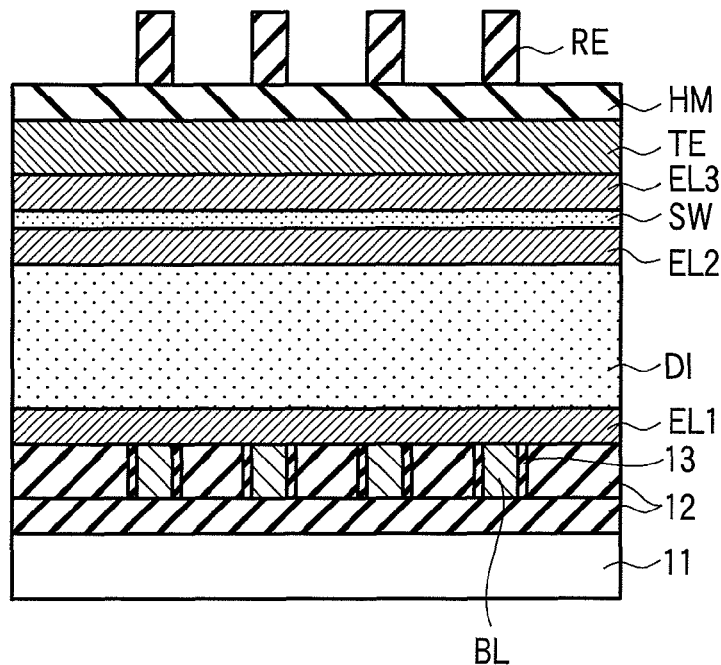
F I G. 14B
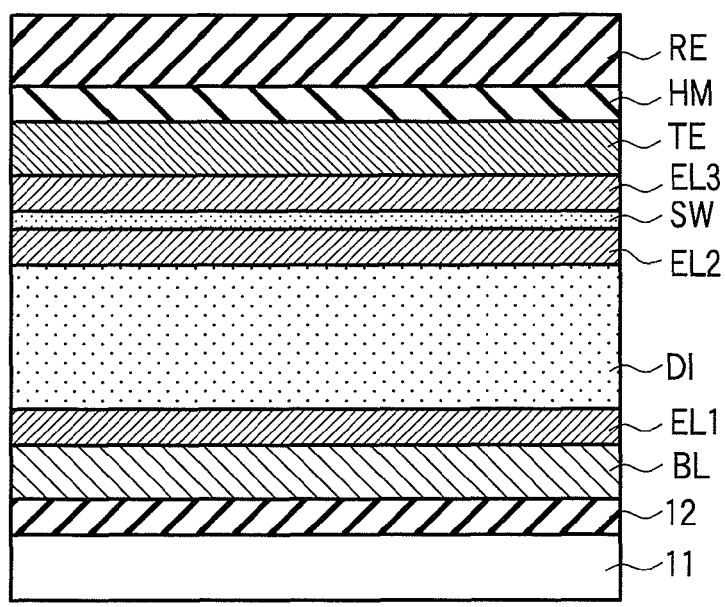
F I G. 14C

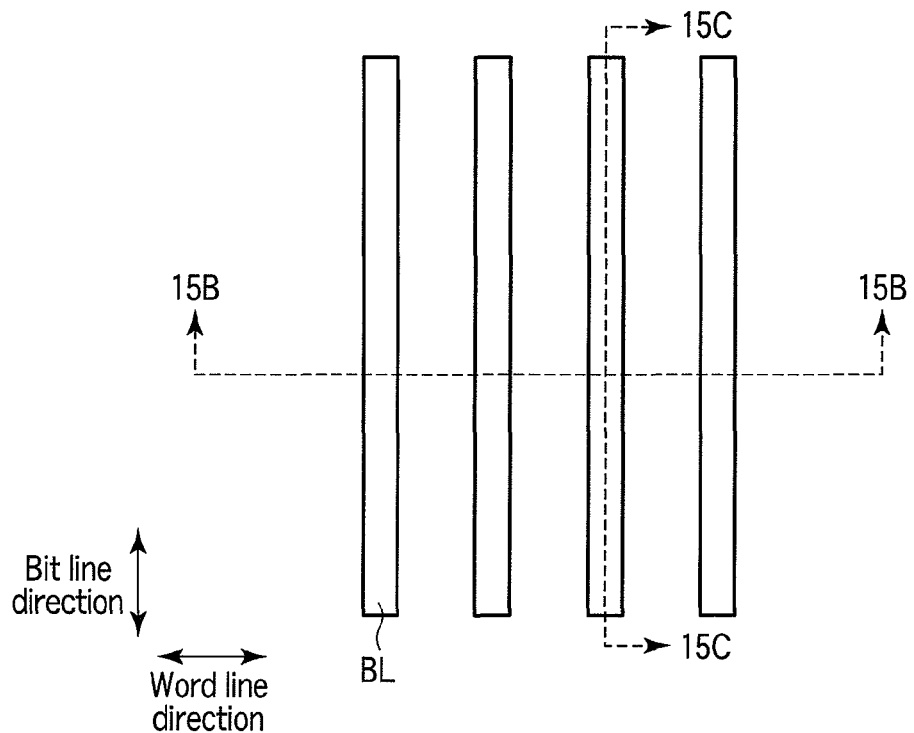
F I G. 15A
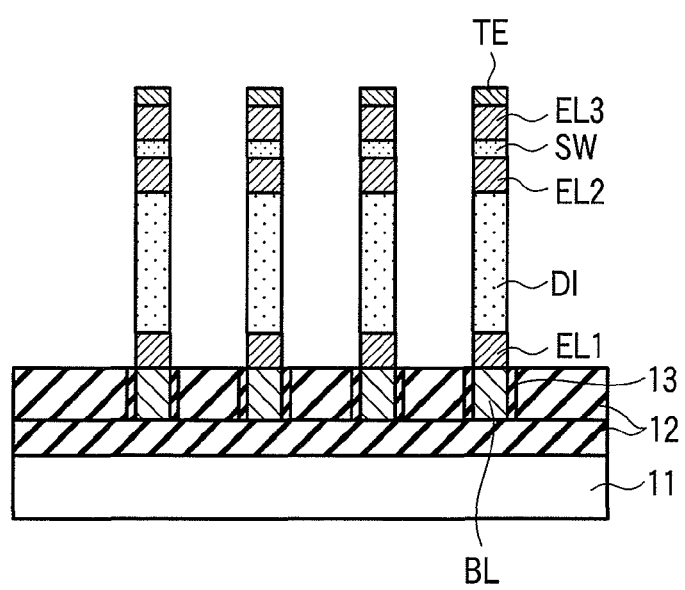
F I G. 15B

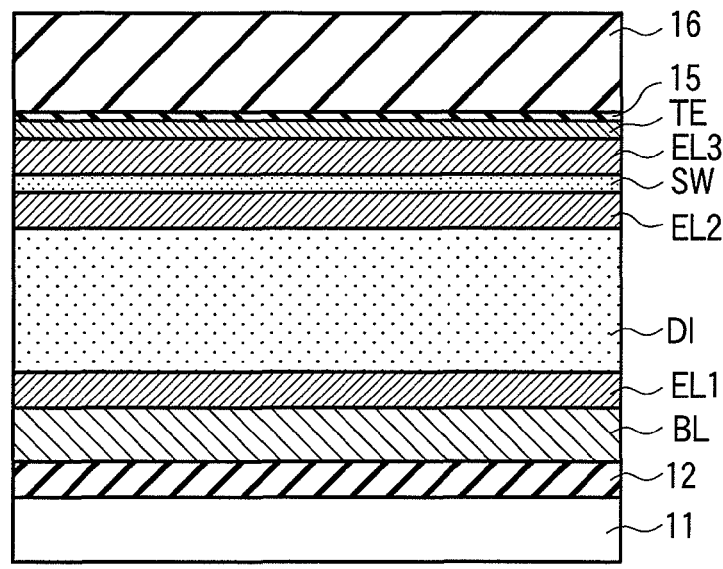
F I G. 17C
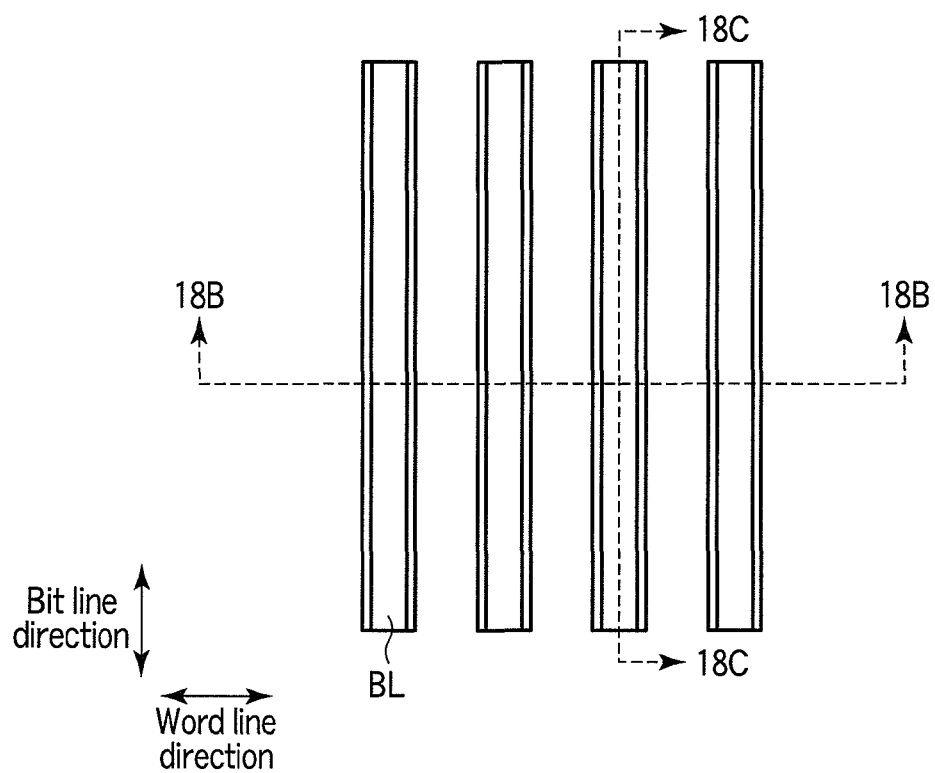
F I G. 18A

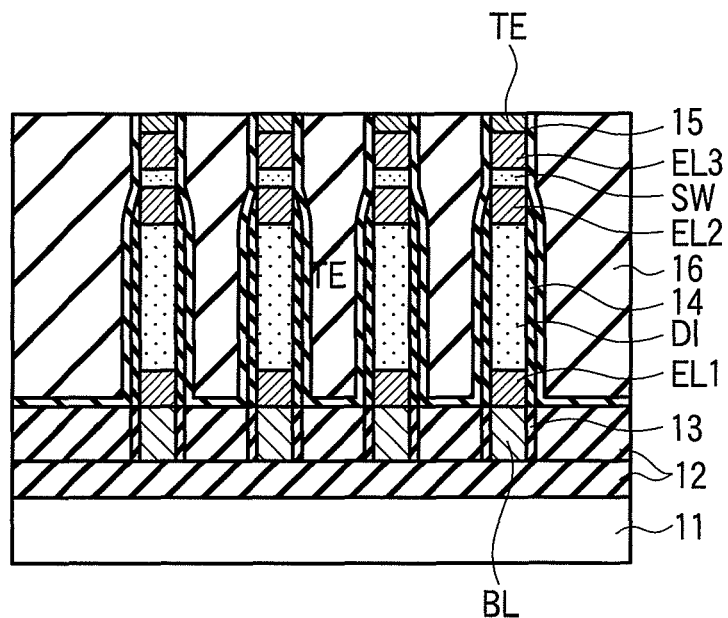
F I G. 18B
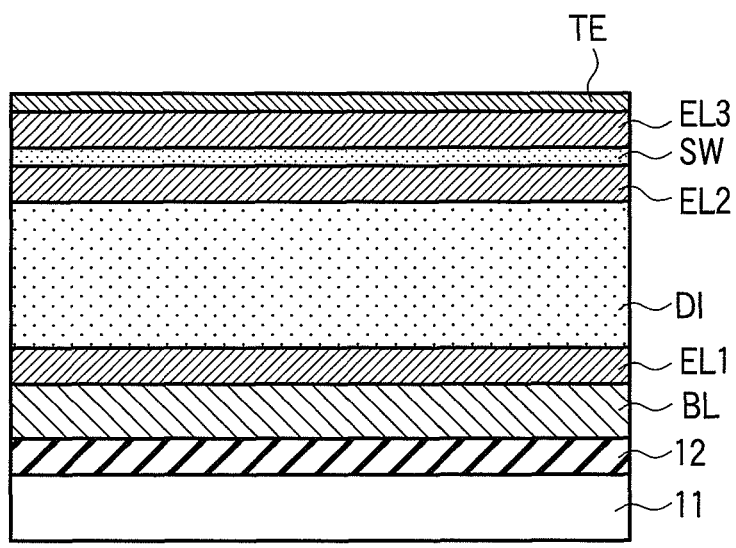
F I G. 18C

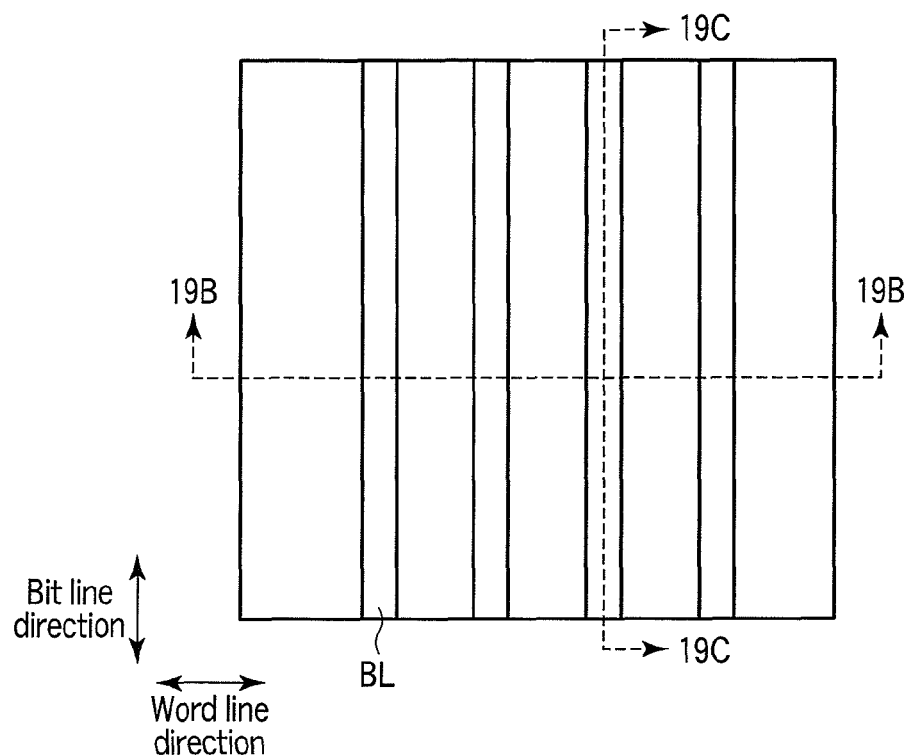
F I G. 19A
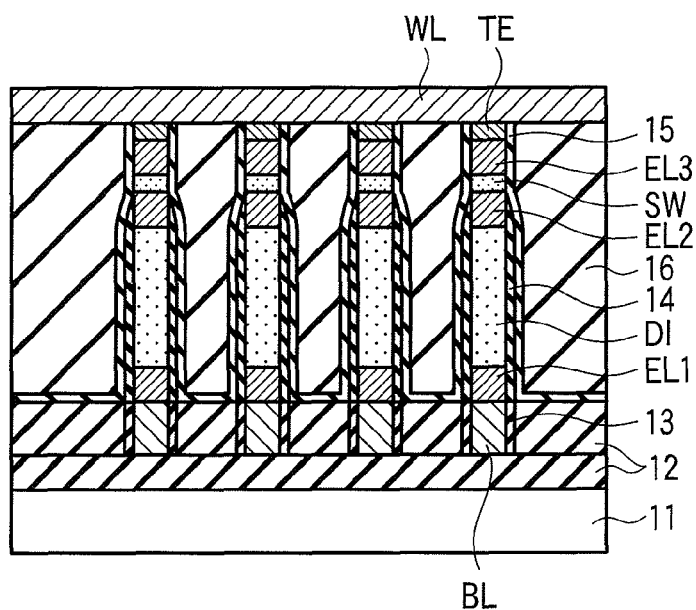
F I G. 19B

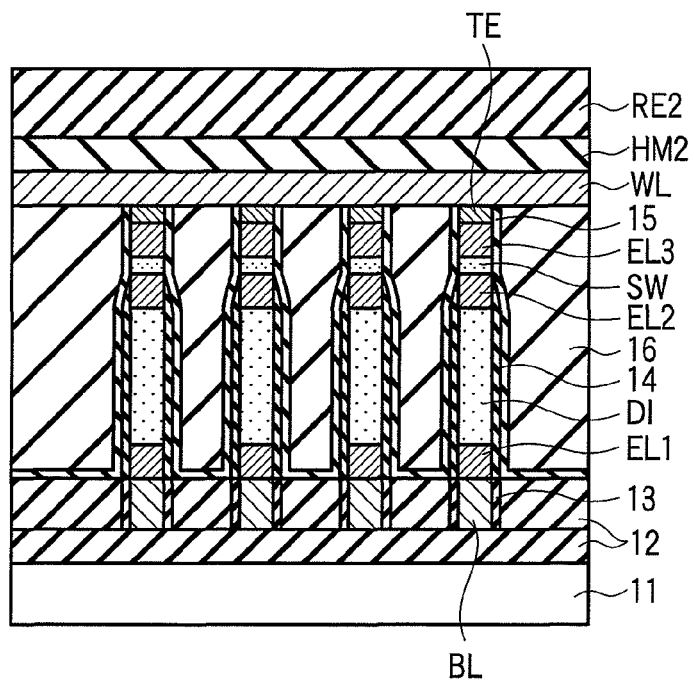
F I G. 20B
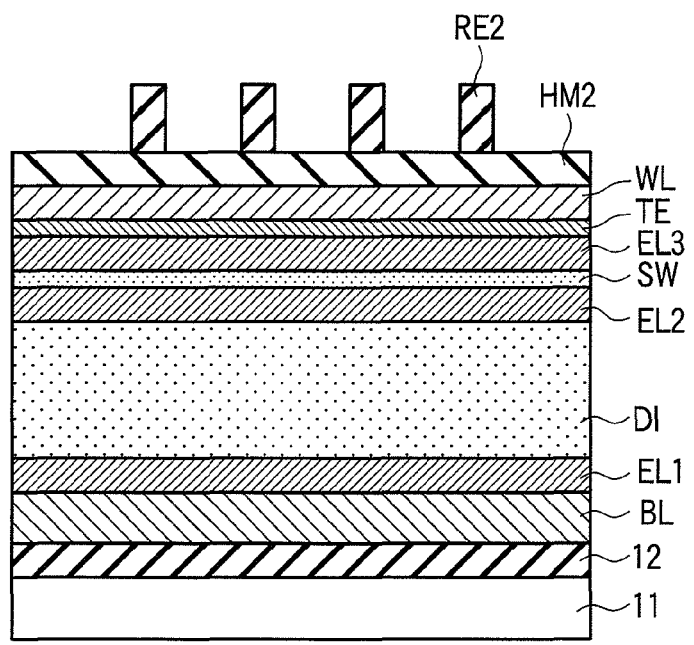
F I G. 20C

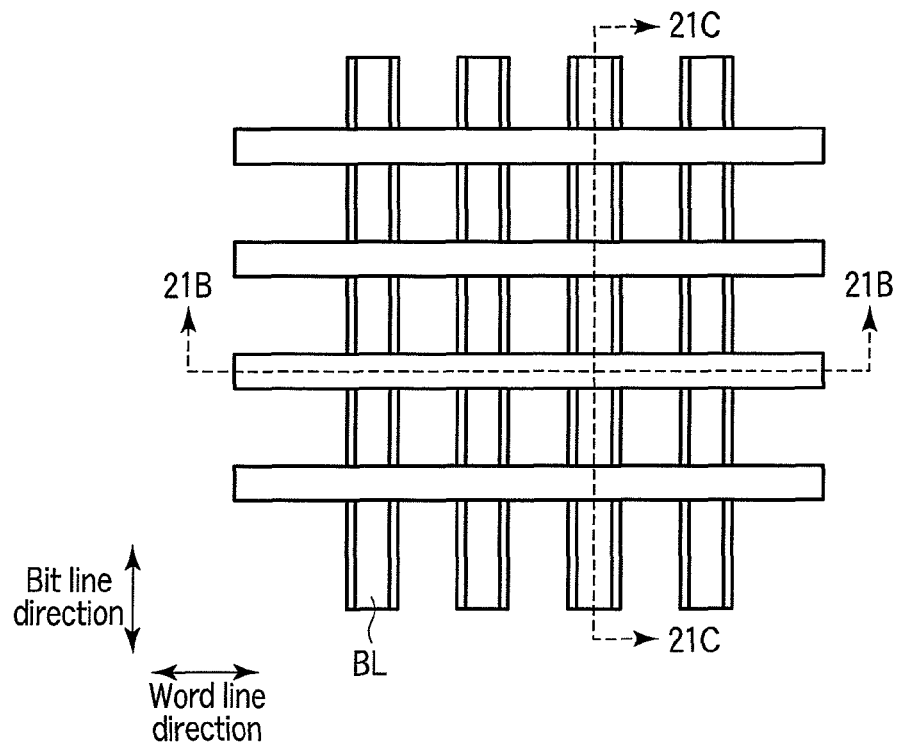
F I G. 21A
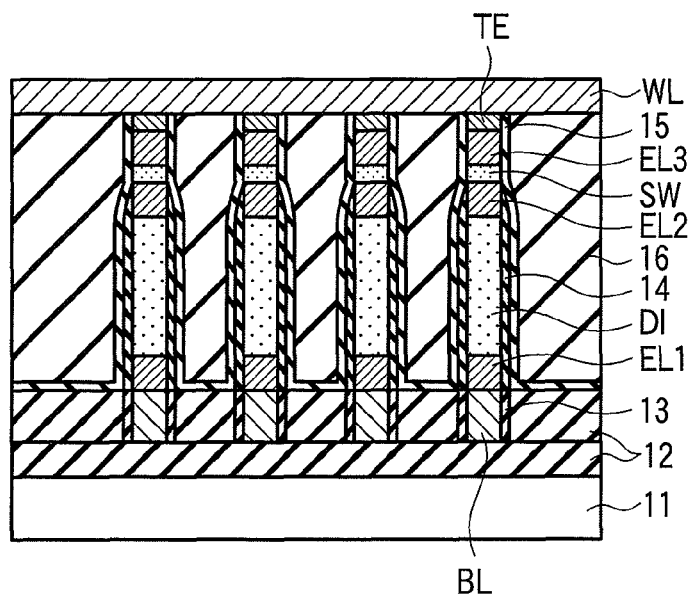
F I G. 21B

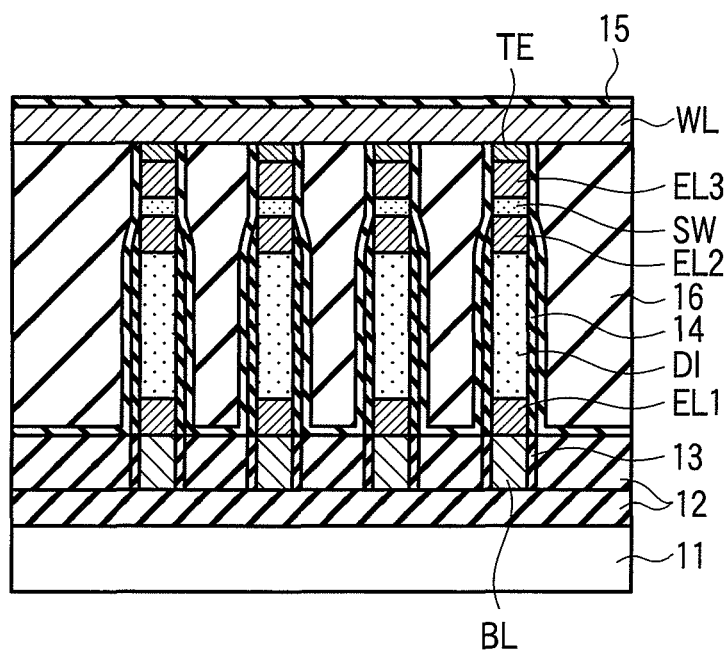
F I G. 22B
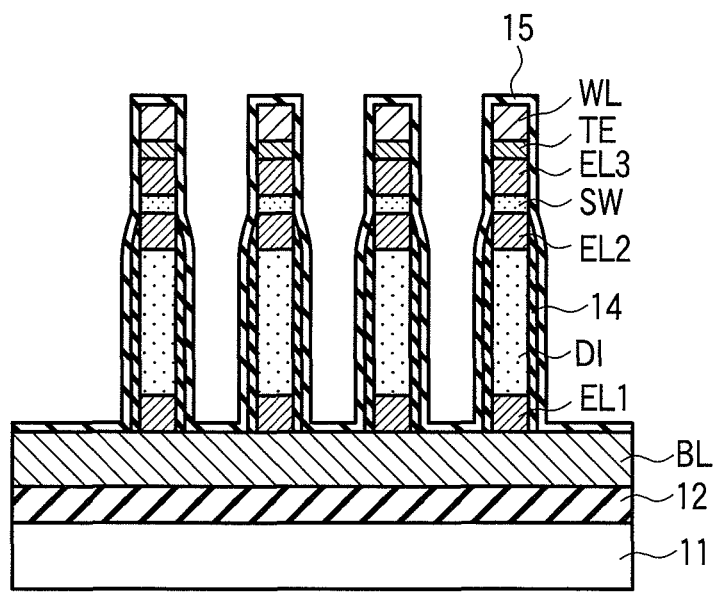
F I G. 22C

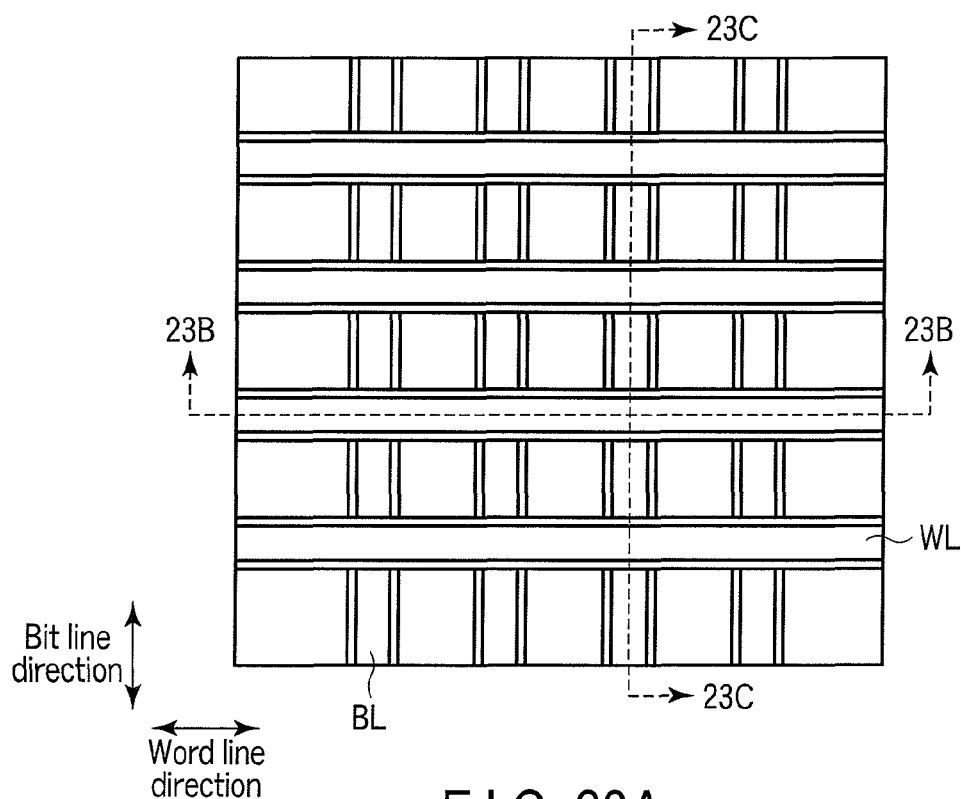
F I G. 23A
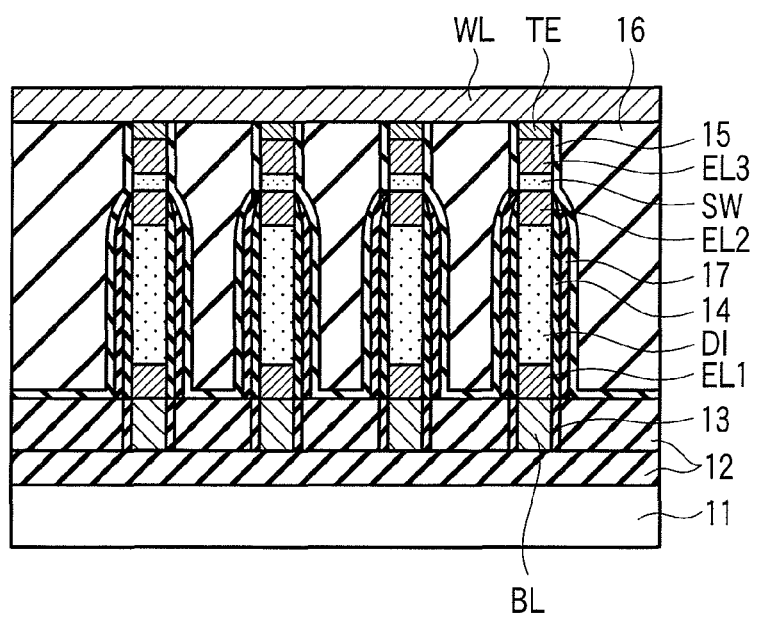
F I G. 23B

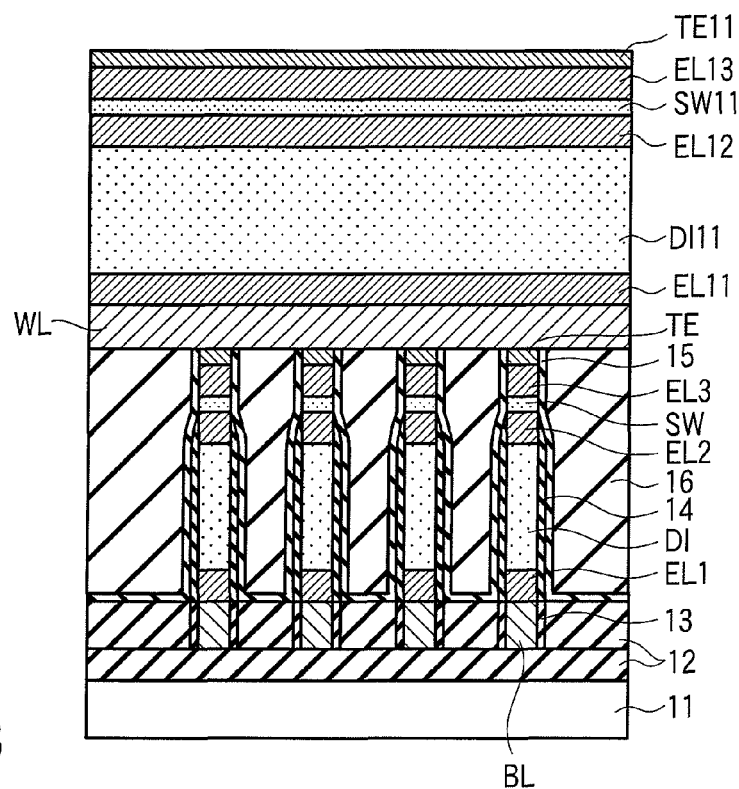
F I G. 24B
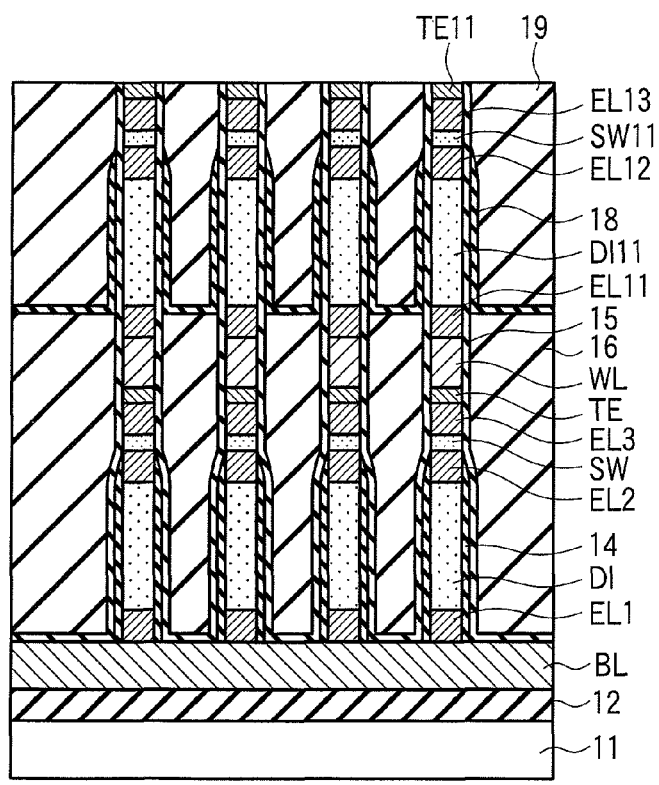
F I G. 24C

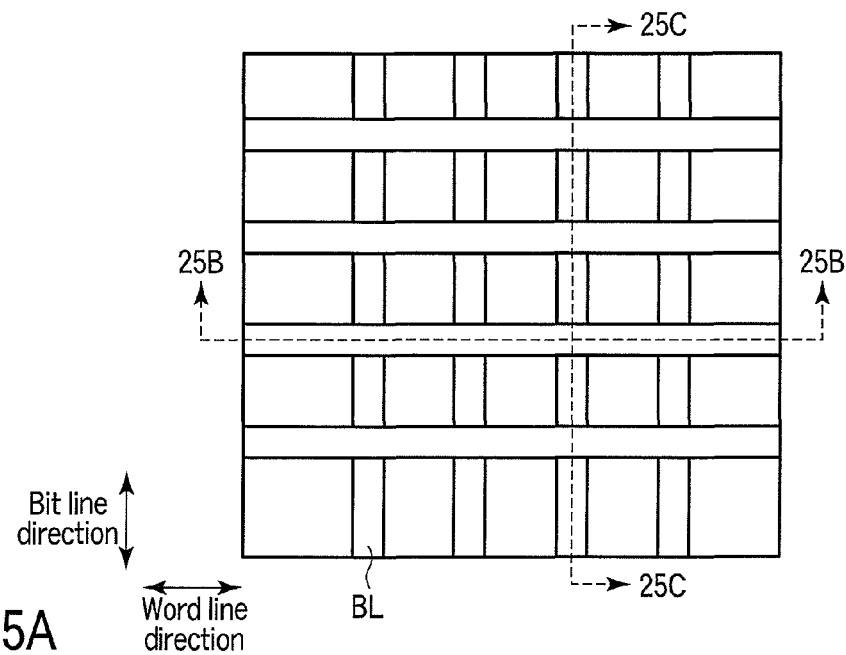
F I G. 25A
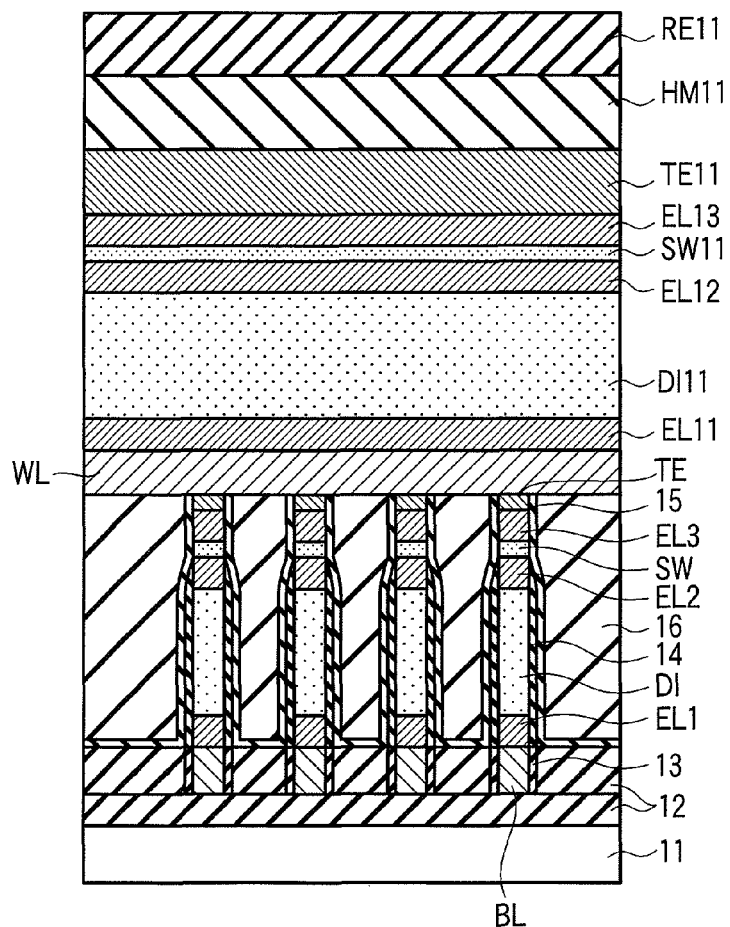
F I G. 25B

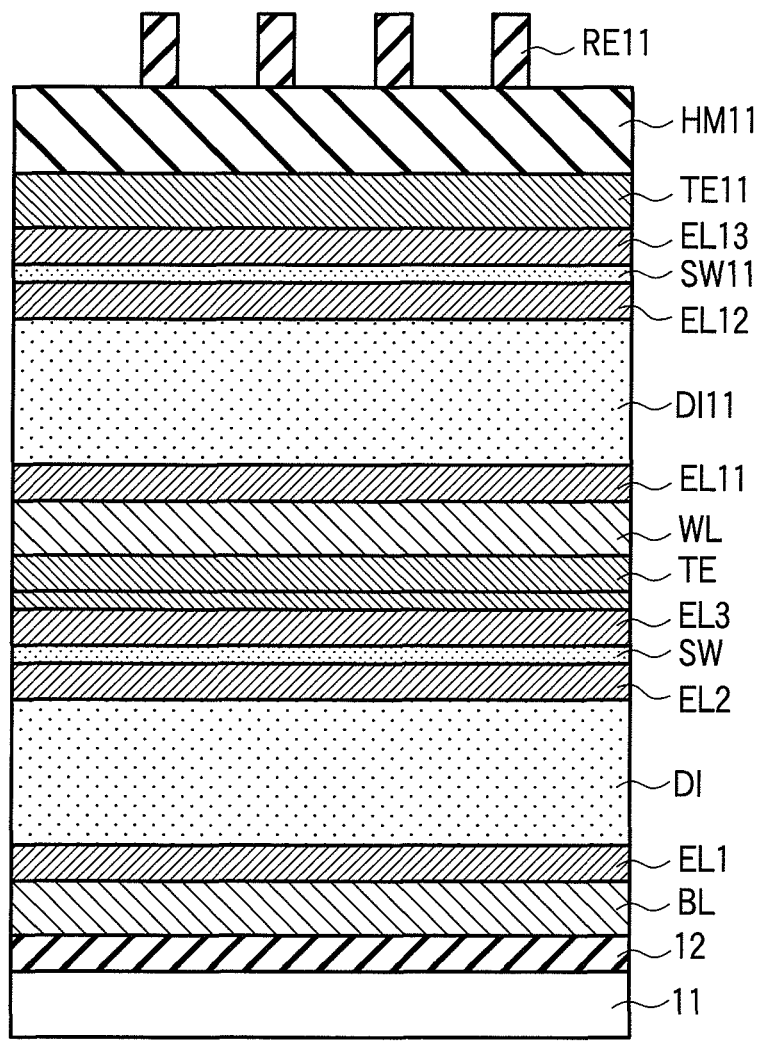
F I G. 25C

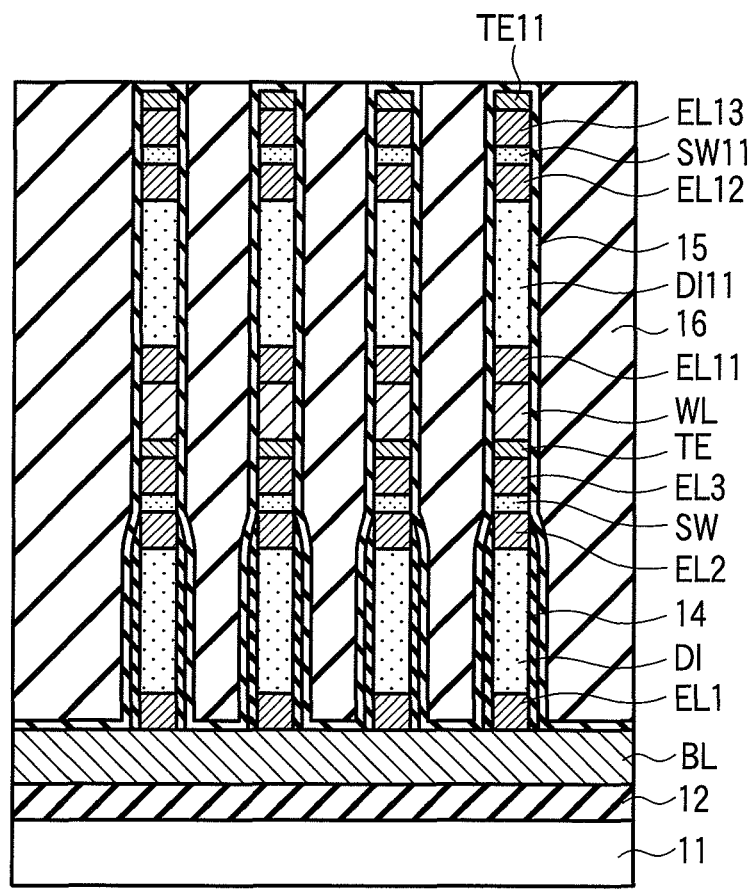
F I G. 27C

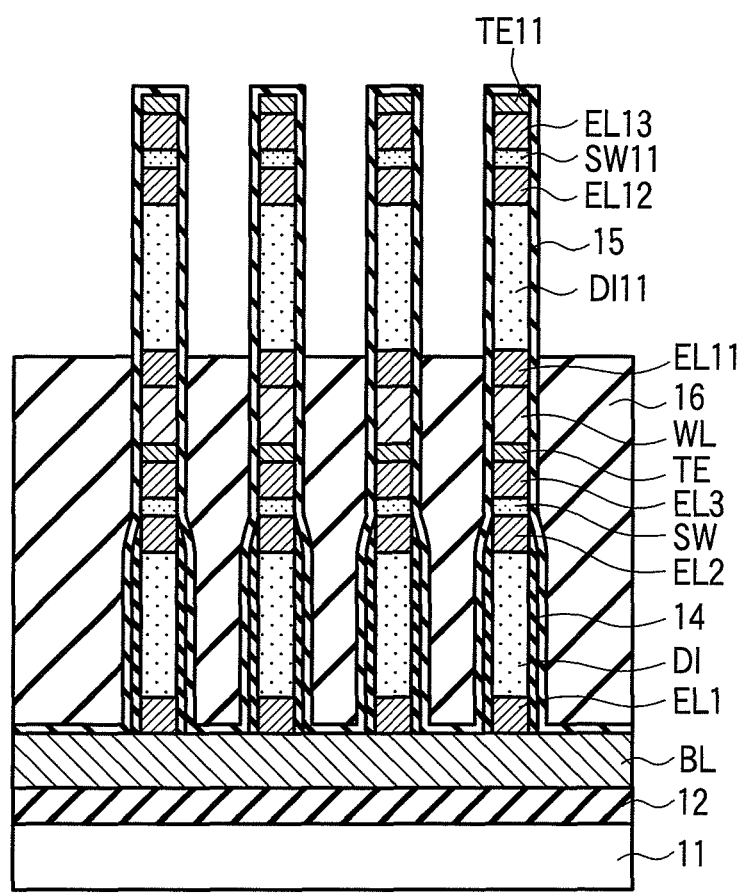
F I G. 28C

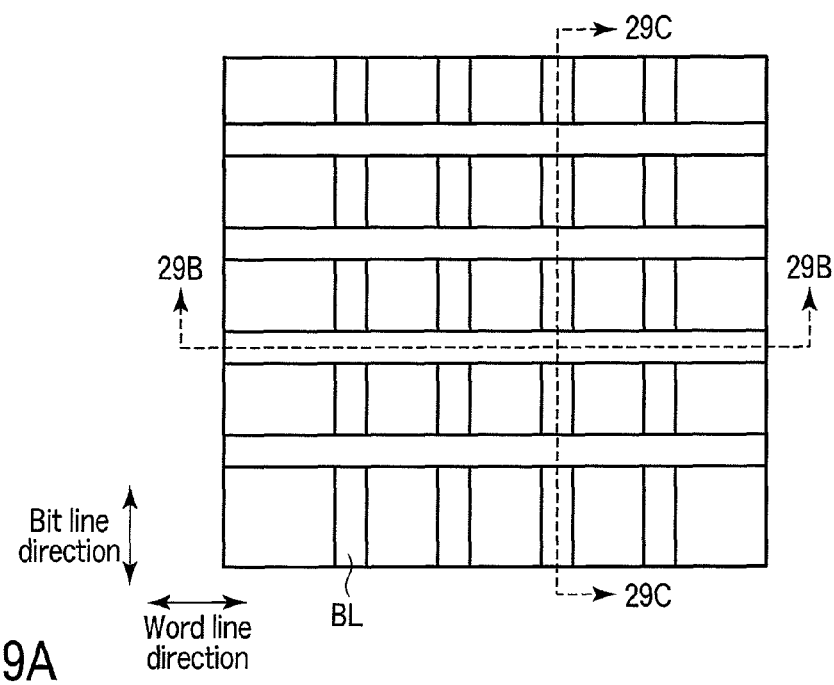
F I G. 29A
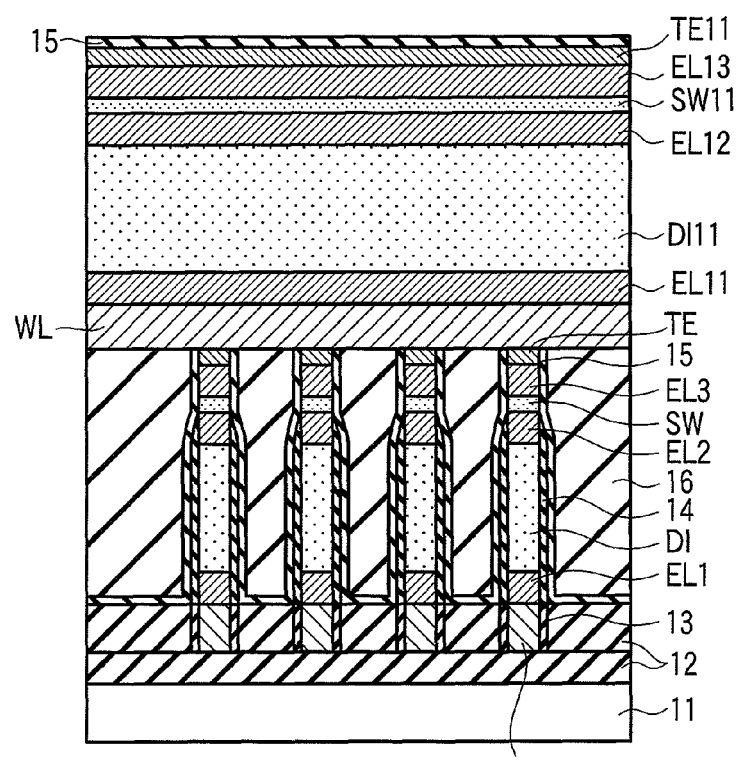
F I G. 29B

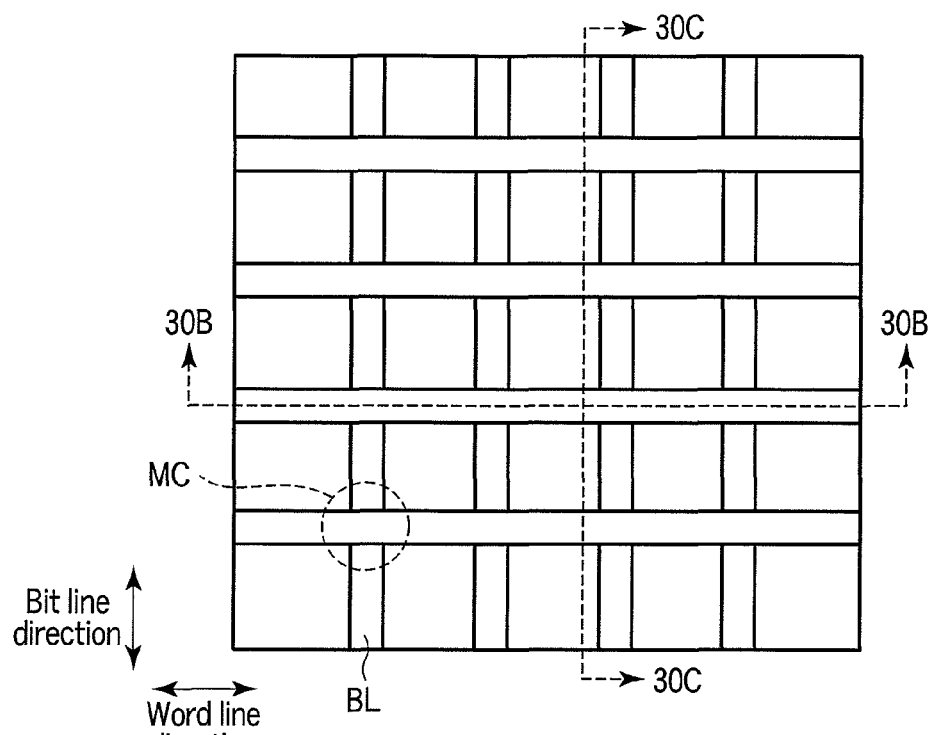
F I G. 30A
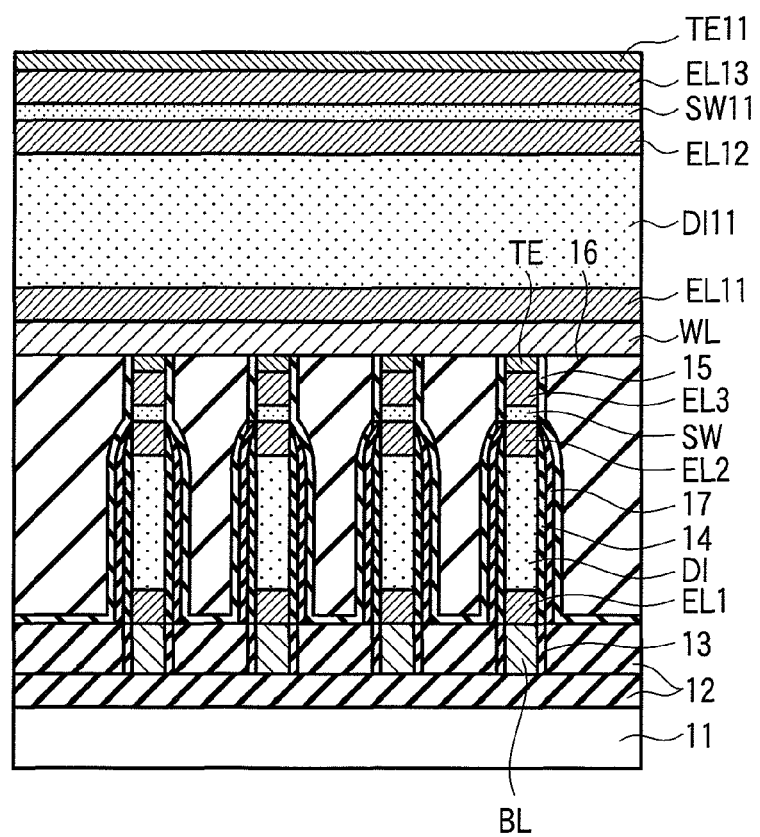
F I G. 30B

US 8,502,183 B2

SEMICONDUCTOR MEMORY DEVICE INCLUDING MEMORY CELL HAVING RECTIFYING ELEMENT AND SWITCHING ELEMENT

CROSS-REFERENCE TO RELATED APPLICATIONS

This application is based upon and claims the benefit of priority from Japanese Patent Application No. 2010-066945, filed Mar. 23, 2010; the entire contents of which are incorporated herein by reference.

FIELD

Embodiments described herein relate generally to a semiconductor memory device, for example, a semiconductor memory device using a cross-point nonvolatile memory cell.

BACKGROUND

A semiconductor memory device (to be referred to as a cross-point memory) using a cross-point nonvolatile memory cell uses a structure in which a rectifying element (for example, diode) and a switching material are arranged in series with each other on one memory cell (for example, see Jpn. Pat. Appln. KOKAI Publication No. 2009-123900). In the cross-point type, memory cells are arranged at cross-points between bit lines and word lines. As the cross-point memory, for example, a resistive random access memory such as an ReRAM (Resistive RAM) or a PCRAM (Phase change RAM) is known.

In the cross-point memory, when a memory cell is gradually shrunk to achieve a large capacity, an aspect obtained after the memory cell is processed becomes as large as about 10, and an insulating film (to be referred to as an interlayer insulating film) to be buried between the memory cells cannot be easily buried. Therefore, an applied film formed by an applying method is used as an interlayer insulating film to try to correct a burying defect.

However, when the applied film is used as the interlayer insulating film, problems such as (1) oxidation of an interconnection and (2) deterioration of a diode are posed. The cause of the oxidation of the interconnection is considered to be a thermal oxidation step performed when N of an organic film serving as an applied film and containing N, C, and Si is replaced with O to form an $SiO_2$ interlayer film.

As regards the deterioration of a diode, impurities of N and C contained in an applied film are present as positive fixed charges, and a band is bent due to an indirect potential effect on the diode caused by the fixed charges. For this reason, a junction leakage defect occurs. In order to prevent an influence caused by the fixed charges, a side wall film having a constant film thickness or more needs to be formed on a side surface of the diode. However, with an increase in capacity, even an applied film is difficult to be buried between memory cells. For this reason, a film which can reduce an influence of fixed charges even though the side wall film is thinned needs to be formed.

BRIEF DESCRIPTION OF THE DRAWINGS

FIG. 2A is a plan view of a memory cell array of the semiconductor memory device according to the first embodiment;

FIG. 2B is a sectional view along a 2B-2B line in FIG. 2A;
FIG. 5A is a plan view showing the method of manufacturing the semiconductor memory device according to the first embodiment;
FIGS. 5B and 5C are sectional views showing the method of manufacturing the semiconductor memory device according to the first embodiment;
FIG. 6A is a plan view showing the method of manufacturing the semiconductor memory device according to the first embodiment;
FIG. 7A is a plan view showing the method of manufacturing the semiconductor memory device according to the first embodiment;
FIGS. 7B and 7C are sectional views showing the method of manufacturing the semiconductor memory device according to the first embodiment;
FIG. 8A is a plan view showing the method of manufacturing the semiconductor memory device according to the first embodiment;
FIGS. 8B and 8C are sectional views showing the method of manufacturing the semiconductor memory device according to the first embodiment;
FIGS. 11B and 11C are sectional views showing the method of manufacturing the semiconductor memory device according to the first embodiment;
FIG. 12A is a plan view of a memory cell array of a semiconductor memory device according to a second embodiment;
FIG. 12B is a sectional view along a 12B-12B line in FIG. 12A;
FIG. 12C is a sectional view along a 12C-12C line in FIG. 12A;
FIG. 13B is a sectional view along a 13B-13B line in

FIG. 13A;

FIGS. 14B and 14C are sectional views showing the method of manufacturing the semiconductor memory device according to the third embodiment;

FIG. 15A is a plan view showing the method of manufacturing the semiconductor memory device according to the third embodiment;

FIGS. 15B and 15C are sectional views showing the method of manufacturing the semiconductor memory device according to the third embodiment;

FIGS. 17B and 17C are sectional views showing the method of manufacturing the semiconductor memory device according to the third embodiment;

FIG. 18A is a plan view showing the method of manufacturing the semiconductor memory device according to the third embodiment;

FIGS. 18B and 18C are sectional views showing the method of manufacturing the semiconductor memory device according to the third embodiment;

FIG. 19A is a plan view showing the method of manufacturing the semiconductor memory device according to the third embodiment;

FIGS. 19B and 19C are sectional views showing the method of manufacturing the semiconductor memory device according to the third embodiment;

FIGS. 20B and 20C are sectional views showing the method of manufacturing the semiconductor memory device according to the third embodiment;

FIG. 21A is a plan view showing the method of manufacturing the semiconductor memory device according to the third embodiment;

FIGS. 21B and 21C are sectional views showing the method of manufacturing the semiconductor memory device according to the third embodiment;

FIGS. 22B and 22C are sectional views showing the method of manufacturing the semiconductor memory device according to the third embodiment;

FIG. 23A is a plan view of a memory cell array of a semiconductor memory device according to a fourth embodiment;

FIG. 23B is a sectional view along a 23B-23B line in FIG. 23A;

FIG. 24B is a sectional view along a 24B-24B line in FIG. 24A;

FIG. 24C is a sectional view along a 24C-24C line in FIG. 24A;

FIG. 25A is a plan view showing a method of manufacturing the semiconductor memory device according to the fifth embodiment;

FIGS. 25B and 25C are sectional views showing the method of manufacturing the semiconductor memory device according to the fifth embodiment;

FIGS. 27B and 27C are sectional views showing the method of manufacturing the semiconductor memory device according to the fifth embodiment;

FIGS. 28B and 28C are sectional views showing the method of manufacturing the semiconductor memory device according to the fifth embodiment;

FIG. 29A is a plan view showing the method of manufacturing the semiconductor memory device according to the fifth embodiment;

FIGS. 29B and 29C are sectional views showing the method of manufacturing the semiconductor memory device according to the fifth embodiment;

FIG. 30A is a plan view of a memory cell array of a semiconductor memory device according to a sixth embodiment;

FIG. 30B is a sectional view along a 30B-30B line in FIG. 30A; and

DETAILED DESCRIPTION

Figure 1:
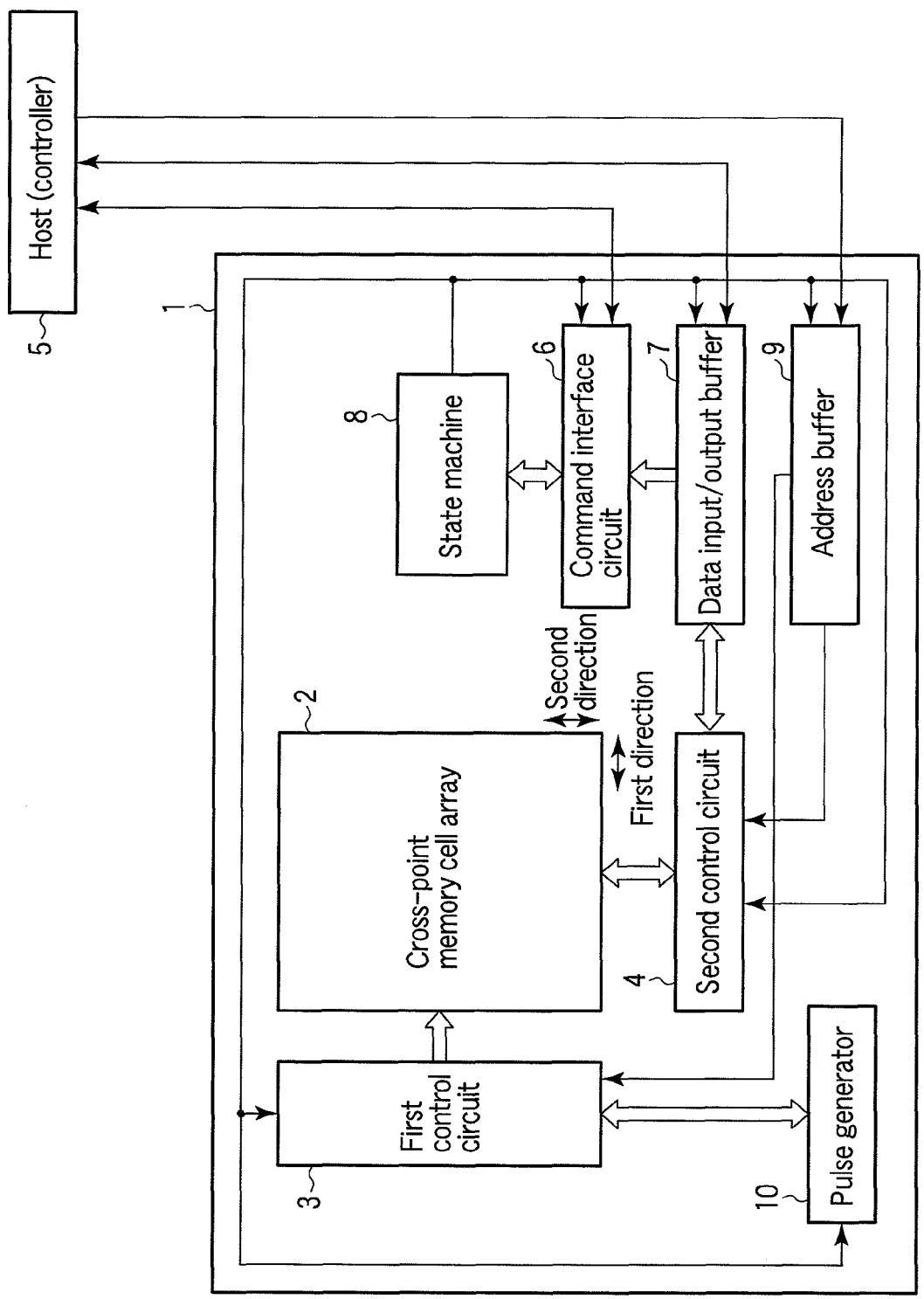
FIG. 1 is a block diagram showing a main part of a semiconductor memory device according to a first embodiment.

A semiconductor memory device according to embodiments and a method of manufacturing the same will be described below with reference to the accompanying drawings. As the semiconductor memory device, a resistive random access memory which is a cross-point memory is exemplified here. In the explanation, common reference numerals denote common parts, respectively, throughout the drawings.

In general, according to one embodiment, a semiconductor memory device includes a first conductive line, a second conductive line, a rectifying element, a switching element, a first side wall film and a second side wall film. The first conductive line extends in a first direction. The second conductive line extends in a second direction crossing the first direction. The rectifying element is connected between the first conductive line and the second conductive line. The switching element is connected in series with the rectifying element between the first conductive line and the second conductive line. The first side wall film is formed on a side surface of the rectifying element. The second side wall film is formed on a side surface of at least one of the first conductive line and the second conductive line. At least one of a film type and a film thickness of the second side wall film is different from that of the first side wall film.

[1] First Embodiment

[1-1] Overall Configuration

An overall configuration of a semiconductor memory device according to a first embodiment will be described.

FIG. 1 is a block diagram showing a main part of the semiconductor memory device according to the first embodiment.

A semiconductor memory device (for example, chip) 1 comprises a cross-point memory cell array 2, a first control circuit 3, a second control circuit 4, a controller (host) 5, a command interface circuit 6, a data input/output buffer 7, a state machine 8, an address buffer 9, and a pulse generator 10.

The cross-point memory cell array 2 includes a stacked structure constituted by a plurality of memory cell arrays. The first control circuit 3 is arranged at one end of the cross-point memory cell array 2 in a first direction, and the second control circuit 4 is arranged at one end in a second direction crossing the first direction.

The first and second control circuits 3 and 4 select one of the plurality of stacked memory cell arrays based on, for example, a memory cell array selection signal.

The first control circuit 3 selects a row of the cross-point memory cell array 2 based on, for example, a row address signal. The second control circuit 4 selects a column of the cross-point memory cell array 2 based on, for example, a column address signal.

The first and second control circuits 3 and 4 control writing/erasing/reading of data in a memory cell in the cross-point memory cell array 2.

The first and second circuits 3 and 4 can write/erase/read data with respect to one of the plurality of stacked memory cell arrays, and also can simultaneously write/erase/read data with respect to two or more of the plurality of stacked memory cell arrays.

In this case, when the semiconductor memory device 1 is a resistive random access memory, for example, writing is called a set state, and erasing is called a reset state. A resistance in the set state only needs to be different from a resistance in the reset state. It is not important whether the resistance in the set state is higher or lower than the resistance in the reset state.

In the set operation, when one of the plurality of resistances is designed to be selectively written, one memory cell can also realize a multi-level resistive random access memory which stores multi-level data.

The controller 5 supplies a control signal and data to the chip 1. The control signal is input to the command interface circuit 6, and the data is input to the data input/output buffer 7. The controller 5 may be arranged in the chip 1 or may be arranged in a host (computer) different from the chip 1.

The command interface circuit 6 determines, based on the control signal, whether the data from the controller 5 is command data. When the data is the command data, the command interface circuit 6 transfers the command data from the data input/output buffer 7 to the state machine 8.

The state machine 8, based on the command data, manages an operation of the chip 1. For example, the state machine 8, based on the command data from the controller 5, manages a set/reset operation and a read operation.

The controller 5 can also receive status information managed by the state machine 8 and determine an operation result in the chip 1.

In the set/reset operation and the read operation, the controller 5 supplies an address signal to the chip 1. The address signal includes, for example, a memory cell array selecting signal, a row address signal, and a column address signal.

The address signal is input to the first and second control circuits 3 and 4 through the address buffer 9.

The pulse generator 10, based on an instruction from the state machine 8, outputs, for example, a voltage pulse or a current pulse required for the set/reset operation and the read operation at a predetermined timing.

Since the overall configuration described above is common in the following first to sixth embodiments, the description thereof will be omitted.

[1-2] Memory Cell Array

A configuration of the cross-point memory cell array 2 according to the first embodiment will be described below.

FIG. 2A is a plan view of the memory cell array 2 in the first embodiment. As shown in FIG. 2A, a plurality of first conductive lines extending in a bit line direction (first direction), for example, bit lines BL are arranged at predetermined intervals in a word line direction (second direction). A plurality of second conductive lines extending in the word line direction, for example, word lines WL are arranged at predetermined intervals in the bit line direction perpendicular to the bit line BL.

At crossing positions of the bit lines BL and the word lines WL, memory cells MC are arranged, respectively. Side wall films are formed on side surfaces of the memory cells MC in the bit line direction. The side wall film will be described below in detail.

[1-3] Memory Cell

Figure 2C:
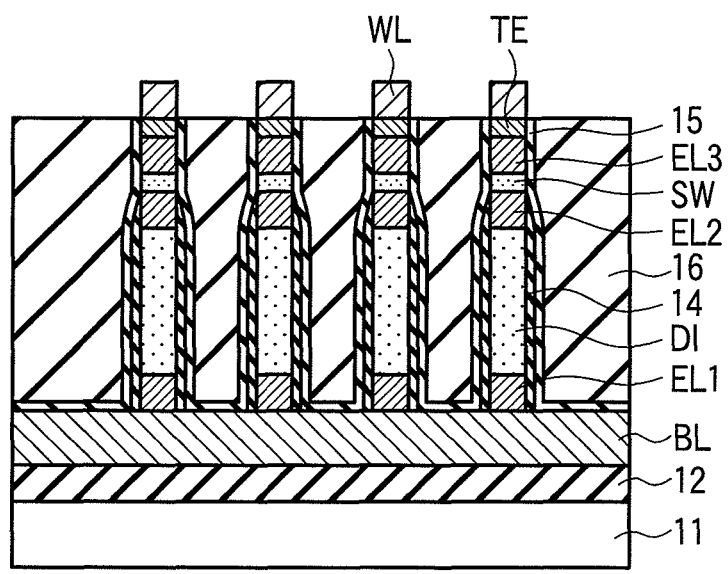
FIG. 2C is a sectional view along a 2C-2C line in FIG. 2A.

A sectional structure of the memory cell MC will be described below with reference to FIGS. 2B and 2C. FIG. 2B is a sectional view along a 2B-2B line (word line direction) in FIG. 2A. FIG. 2C is a sectional view along a 2C-2C line (bit line direction) in FIG. 2A.

The sectional structure along the 2B-2B line of the memory cell MC is as follows.

As shown in FIG. 2B, the memory cells MC comprise rectifying elements, for example, diodes DI connected in series between the bit line BL and the word line WL, and switching elements SW. The bit line BL and the word line WL are constituted by, for example, a metal film (for example, tungsten (W)), WSi, NiSi, CoSi, or the like.

On a semiconductor substrate (for example, p-type silicon semiconductor substrate) 11, an interlayer insulating film 12 is formed. The bit line BL is formed on the interlayer insulating film 12, and the interlayer insulating film 12 is arranged between the bit lines BL. The interlayer insulating film 12 is constituted by, for example, a silicon oxide film.

Furthermore, on a side surface of the bit line BL, a barrier film 13 is formed, and the barrier film 13 is arranged between the bit line BL and the interlayer insulating film 12. The barrier film 13 is constituted by, for example, a silicon nitride film.

On the bit line BL, a first electrode layer EL1, the diode DI, a second electrode layer EL2, the switching element SW, a third electrode layer EL3, and an upper electrode layer TE are sequentially formed. On the upper electrode layer TE, the word line WL is formed. More specifically, the memory cell MC is arranged between the bit line BL and the word line WL, and includes the first electrode layer EL1, the diode DI, the second electrode layer EL2, the switching element SW, the third electrode layer EL3, and the upper electrode layer TE. The first electrode layer EL1, the second electrode layer EL2, and the third electrode layer EL3 are formed of, for example, TiN, TaN, Ti, Pt, Au, Ag, Ru, Ir, Co, Al, and the like. The upper electrode layer TE is constituted by, for example, a metal film (for example, tungsten (W)), WSi, NiSi, CoSi, and the like.

On a side surface of the first electrode layer EL1, a side surface of the diode DI, and a side surface of the second electrode layer EL2, a first side wall film is formed. The first side wall film includes, for example, silicon nitride films 14 and 15. More specifically, on the side surface of the first electrode layer EL1, the side surface of the diode DI, and the side surface of the second electrode layer EL2, the silicon nitride film 14 and the silicon nitride film 15 are sequentially formed from the side surface side. For example, a film thickness of the silicon nitride film 14 is about 5 to 15 nm, and a film thickness of the silicon nitride film 15 is 5 nm or less.

On a side surface of the switching element SW, a side surface of the third electrode layer EL3, and a side surface of the upper electrode layer TE, a second side wall film, for example, the silicon nitride film 15 is formed.

An interlayer insulating film 16 is formed between the plurality of memory cells MC. More specifically, on the side surfaces of the memory cells MC, the interlayer insulating film 16 is formed with the silicon nitride films 14 and 15 or the silicon nitride film 15 interposed therebetween. The interlayer insulating film 16 is constituted by an applied oxide film, for example, a polysilazane film, formed by an applying method.

Furthermore, the word line WL is arranged on the upper electrode layer TE and the interlayer insulating film 16.

A sectional structure along the 2C-2C line of the memory cell MC is as follows.

As shown in FIG. 2C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed.

On the side surface of the first electrode layer EL1, the side surface of the diode DI, and the side surface of the second electrode layer EL2, the first side wall films, for example, the silicon nitride film 14 and the silicon nitride film 15 are sequentially formed from the side surface side.

On the side surface of the switching element SW, the side surface of the third electrode layer EL3, and the side surface of the upper electrode layer TE, a second side wall film, for example, the silicon nitride film 15 is formed.

The interlayer insulating film 16 is formed between the plurality of memory cells MC.

[1-4] Diode and Switching Element Constituting Memory Cell

The memory cells MC according to the first embodiment have rectifying elements (for example, diodes D1) connected in series between the bit line BL and the word line WL and switching elements SW.

Examples of the diode DI include a diode such as a PN diode, a PIN diode, an MIS (Metal-Insulator-Semiconductor) diode, an SIS (Semiconductor-Insulator-Semiconductor) diode, an MIM (Metal-Insulator-Metal) diode, and an MIIM (Metal-Insulator-Insulator-Metal) diode.

The switching element SW includes a variable resistance element or a phase change element. In this case, the variable resistance element means an element made of a material whose resistance changes depending on voltage, current, or heat. The phase change element means an element made of a material whose physicality such as a resistance or a capacitance changes depending on a phase change. The switching element SW is formed of, for example, a material such as $TiO_2$, NiO, MeOx, HfO, or C.

[1-5] Manufacturing Method

Figure 3A:
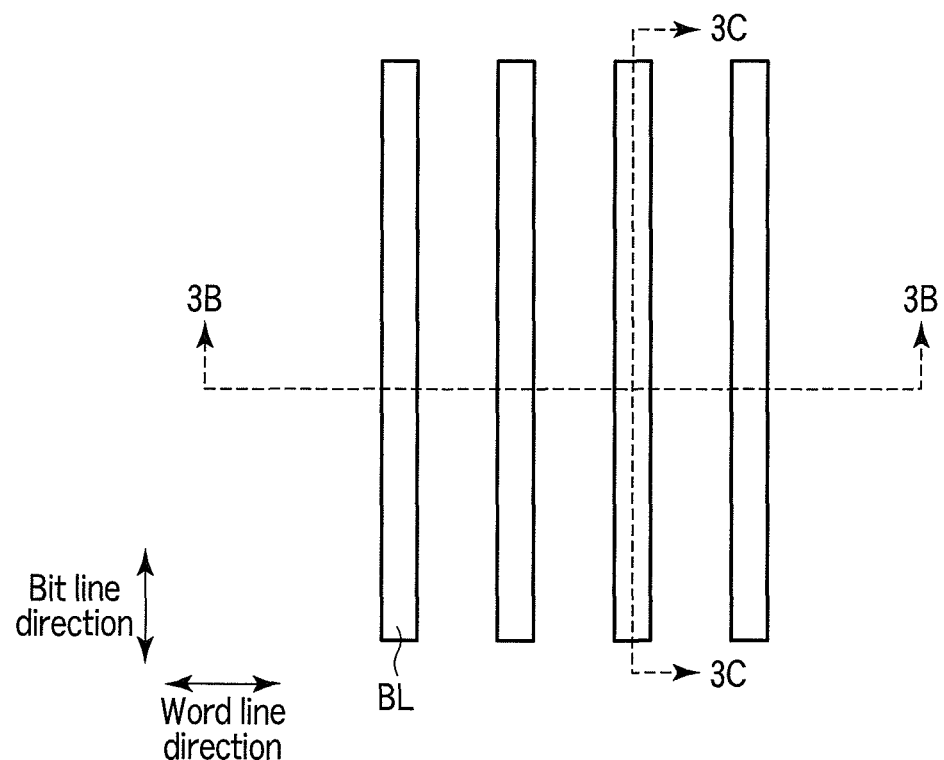
FIG. 3A is a plan view showing a method of manufacturing the semiconductor memory device according to the first embodiment.
Figure 3B:
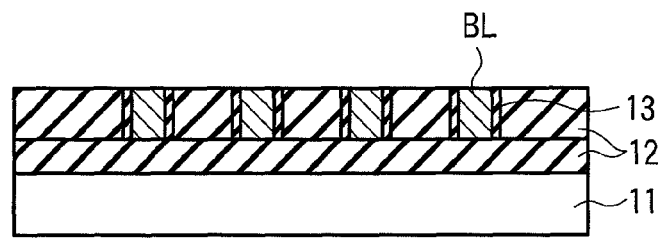
FIGS. 3B and 3C are sectional views showing the method of manufacturing the semiconductor memory device according to the first embodiment.

A method of manufacturing the semiconductor memory device according to the first embodiment will be described below. FIGS. 3A, 4A, ..., 11A are plan views showing the manufacturing method. FIGS. 3B, 4B, ..., 11B are sectional views along 3B, 4B, ..., 11B lines in FIGS. 3A, 4A, ..., 11A, respectively, and FIGS. 3C, 4C, ..., 11C are sectional views along 3C, 4C, ..., 11C lines in FIGS. 3A, 4A, ..., 11A, respectively.

As shown in FIG. 3B, the bit line BL is formed on the semiconductor substrate 11. On the semiconductor substrate 11 before the bit line BL is formed, circuits such as transistors may be formed in a pre-process. The bit line BL is formed by the following steps.

The interlayer insulating film 12 is formed on the semiconductor substrate 11, and a metal film serving as a bit line is formed on the interlayer insulating film 12. The metal film is etched by RIE to form the bit line BL. The barrier film 13 is formed on the bit line BL. Subsequently, the barrier film 13 on the bit line BL is etched by RIE to leave the barrier film 13 on a side surface of the bit line BL.

Thereafter, the interlayer insulating film 12 is formed on the semiconductor substrate 11 on which the bit line BL is formed. The interlayer insulating film 12 is then polished by CMP to expose a surface of the bit line BL. For example, the interlayer insulating film 12 is constituted by a silicon oxide film, and the barrier film is constituted by a silicon nitride film.

The bit line BL may also be formed by the following burying method. The interlayer insulating film 12 is formed on the semiconductor substrate 11. An interconnection trench is formed in the interlayer insulating film 12. Thereafter, the barrier film 13 is formed in the interconnection trench. Furthermore, a metal film serving as the bit line BL is buried in the barrier film 13 in the interconnection trench. Thereafter, excessive metal films on the interlayer insulating film 12 and in the interconnection trench are polished by CMP.

Figure 4A:
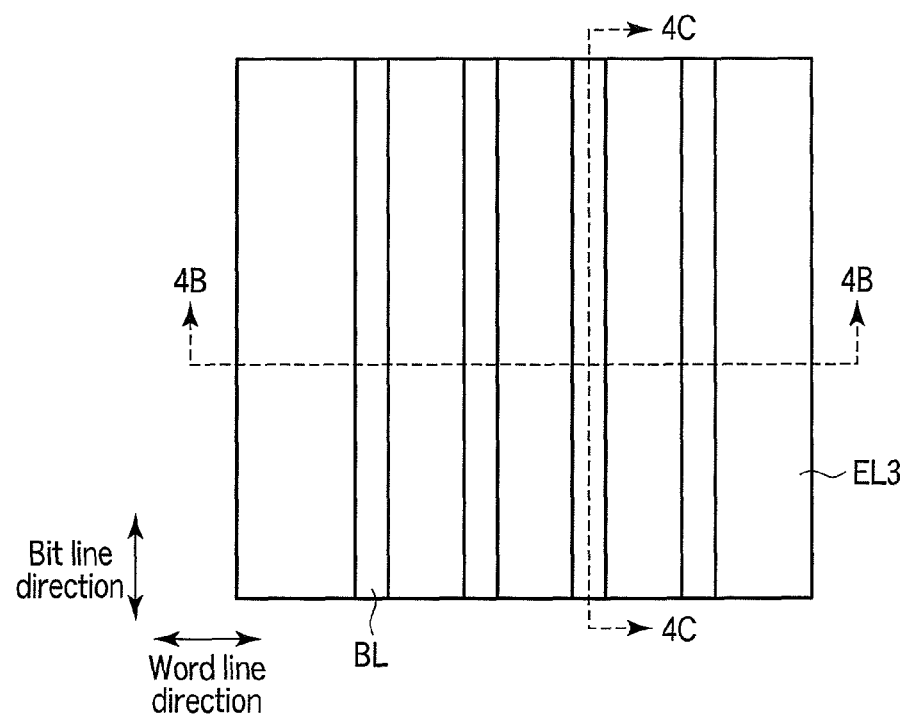
FIG. 4A is a plan view showing the method of manufacturing the semiconductor memory device according to the first embodiment.
Figure 4B:
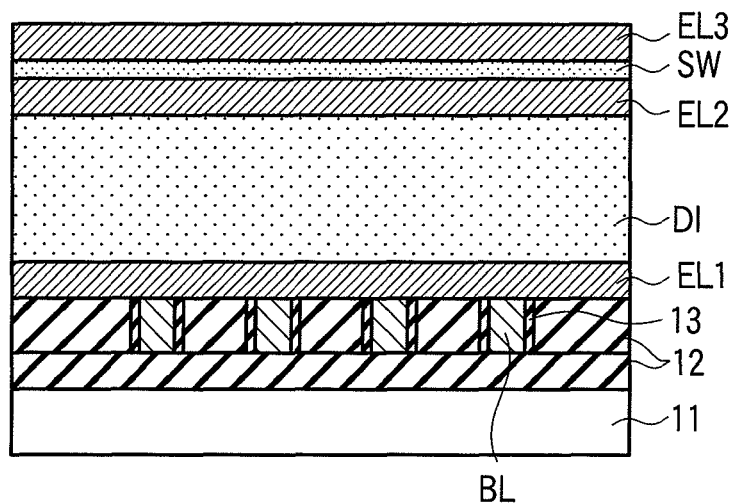
FIGS. 4B and 4C are sectional views showing the method of manufacturing the semiconductor memory device according to the first embodiment.
Figure 4C:
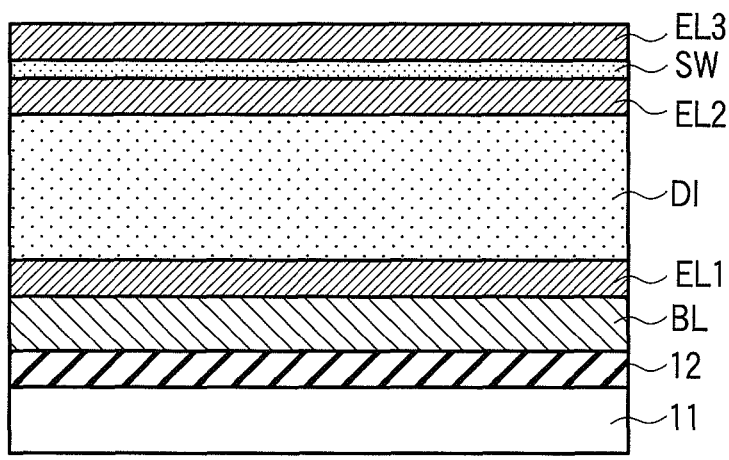

As shown in FIGS. 4B and 4C, on the bit line BL and the interlayer insulating film 12, the first electrode layer EL1, the diode DI, the second electrode layer EL2, the switching element SW, and the third electrode layer EL3 are formed.

Thereafter, as shown in FIGS. 5A, 5B, and 5C, in order to process the films formed in the steps in FIGS. 4B and 4C, the upper electrode layer TE and a hard mask HM are formed on the third electrode layer EL3. The hard mask HM is formed of, for example, $SiO_2$, SiN, Carbon or the like.

Furthermore, a resist film is applied to an upper surface of the hard mask HM, and the resist film is patterned to form a resist pattern RE. The resist pattern RE has a pattern depending on planar shapes of the memory cells MC to process the memory cells MC. The patterning of the resist film is performed by using, for example, a side wall transfer method, an ArF lithography or an immersion ArF lithography technique.

Figure 6B:
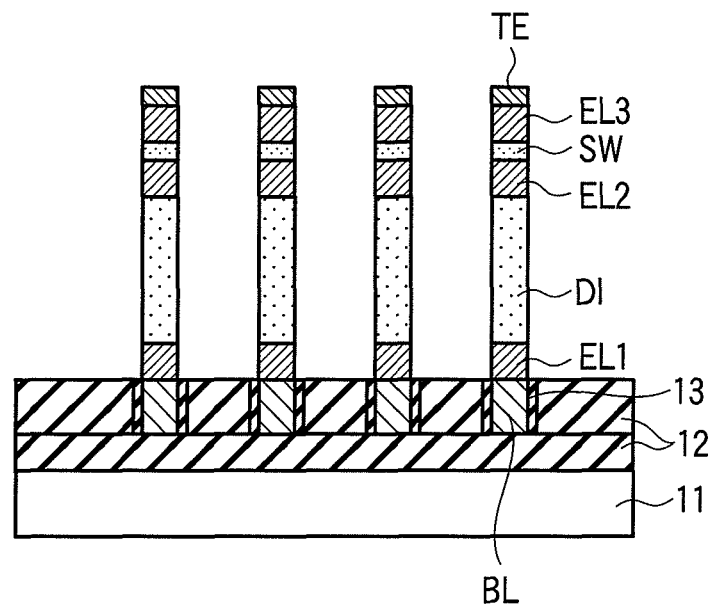
FIGS. 6B and 6C are sectional views showing the method of manufacturing the semiconductor memory device according to the first embodiment.
Figure 6C:
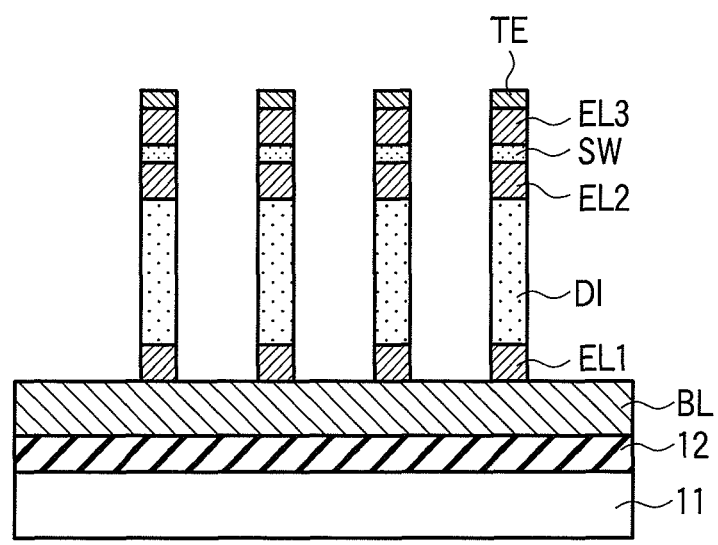

As shown in FIGS. 6A, 6B, and 6C, the hard mask HM and the upper electrode layer TE are etched by using the resist pattern RE. Furthermore, the third electrode layer EL3, the switching element SW, the second electrode layer EL2, the diode DI, and the first electrode layer EL1 are etched with the hard mask HM to form the memory cells MC.

Thereafter, on the structure shown in FIGS. 6B and 6C, i.e., on the memory cells MC and the interlayer insulating film 12, as shown in FIGS. 7B and 7C, the silicon nitride film 14 is formed by, for example, CVD (Chemical Vapor Deposition), low-temperature CVD, or ALD (Atomic Layer Deposition).

Subsequently, as shown in FIGS. 8B and 8C, the silicon nitride film 14 serving as a side wall film is formed on a side surface of the diode DI. More specifically, by using RIE, the silicon nitride film 14 above the side surface of the diode DI is etched, i.e., the silicon nitride film 14 on the upper electrode layer TE, a side surface of the third electrode layer EL3, and a side surface of the switching element SW is etched to leave the silicon nitride film 14 on the side surface of the diode DI.

Figure 9A:
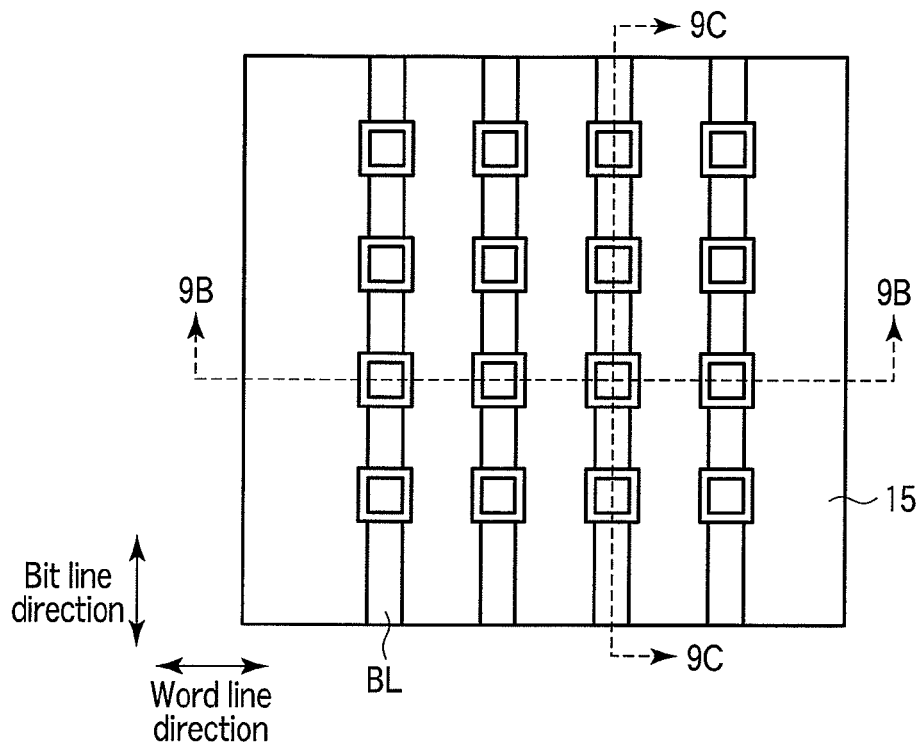
FIG. 9A is a plan view showing the method of manufacturing the semiconductor memory device according to the first embodiment.
Figure 9B:
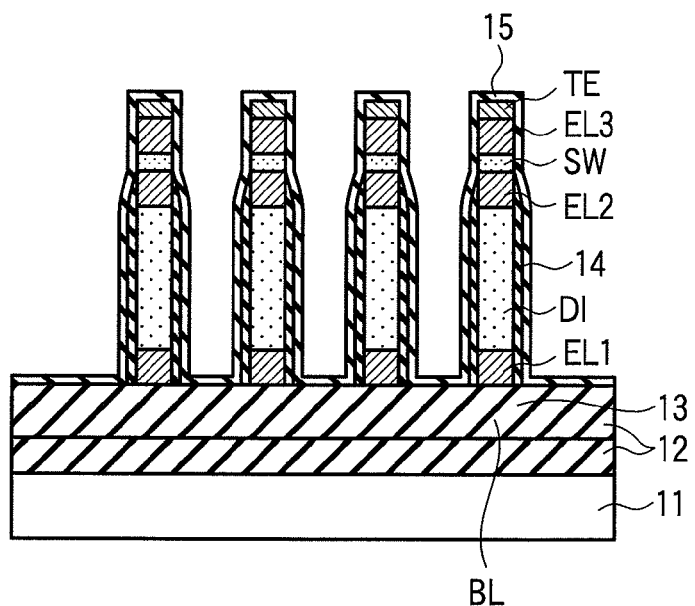
FIGS. 9B and 9C are sectional views showing the method of manufacturing the semiconductor memory device according to the first embodiment.
Figure 9C:
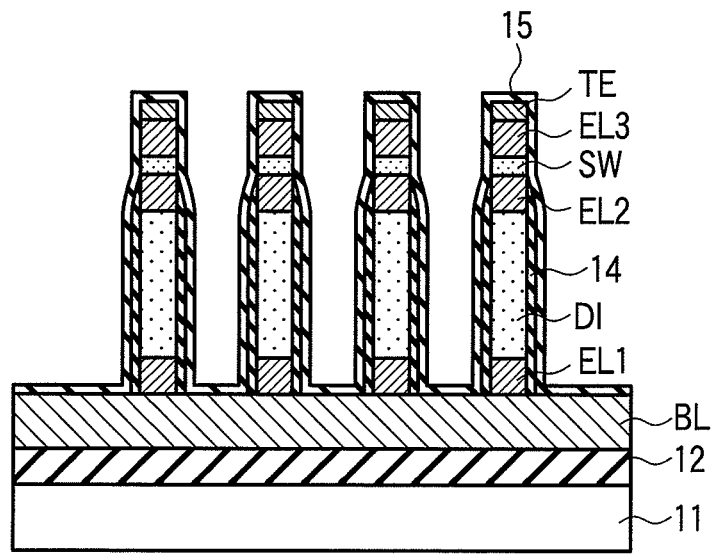

On the structure shown in FIGS. 8B and 8C, i.e., on the memory cell MC, the silicon nitride film 14, and the interlayer insulating film 12, as shown in FIGS. 9B and 9C, for example, the silicon nitride film 15 is formed by CVD, low-temperature CVD, or ALD.

Figure 10A:
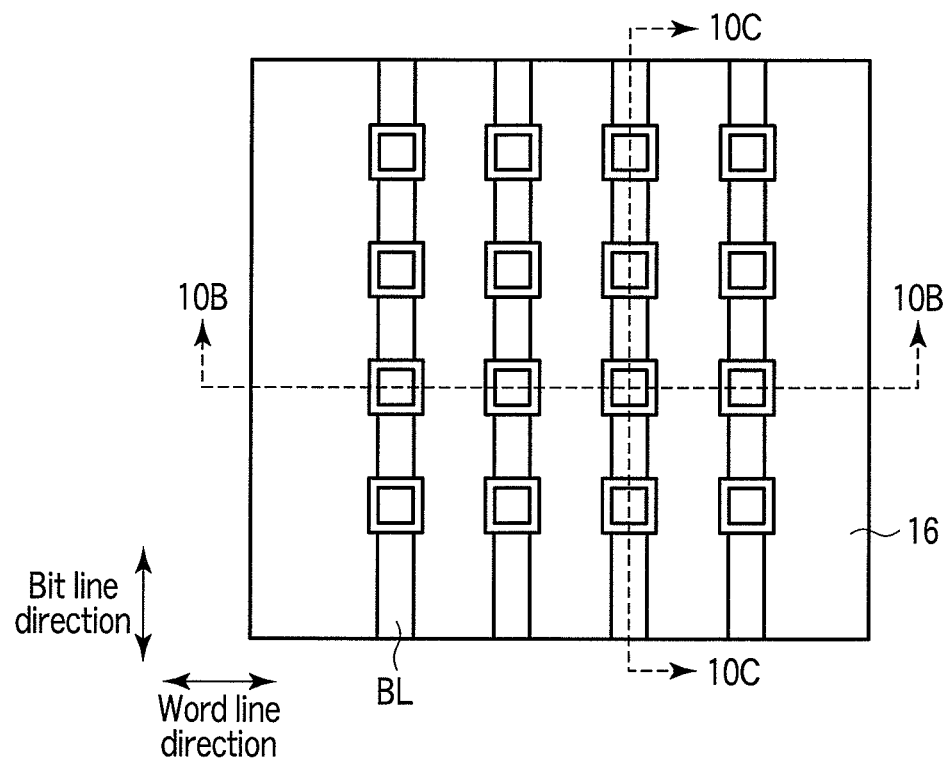
FIG. 10A is a plan view showing the method of manufacturing the semiconductor memory device according to the first embodiment.
Figure 10B:
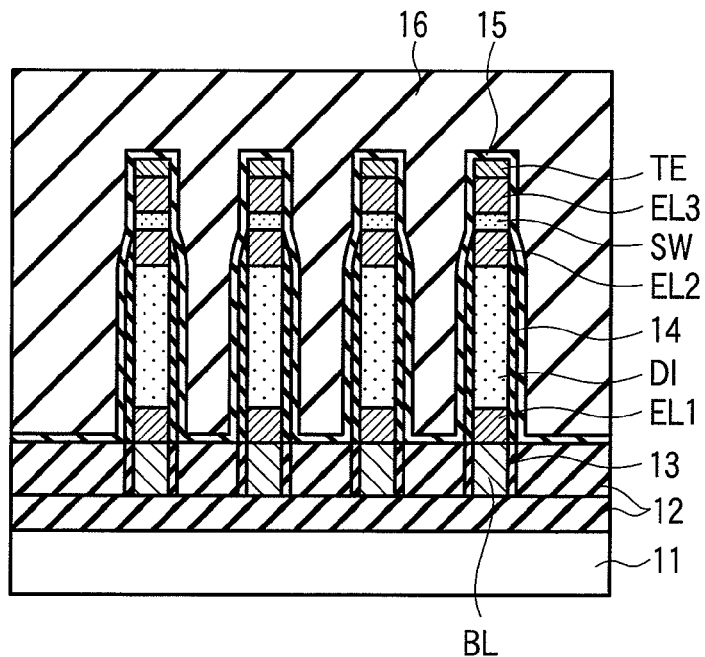
FIGS. 10B and 10C are sectional views showing the method of manufacturing the semiconductor memory device according to the first embodiment.
Figure 10C:
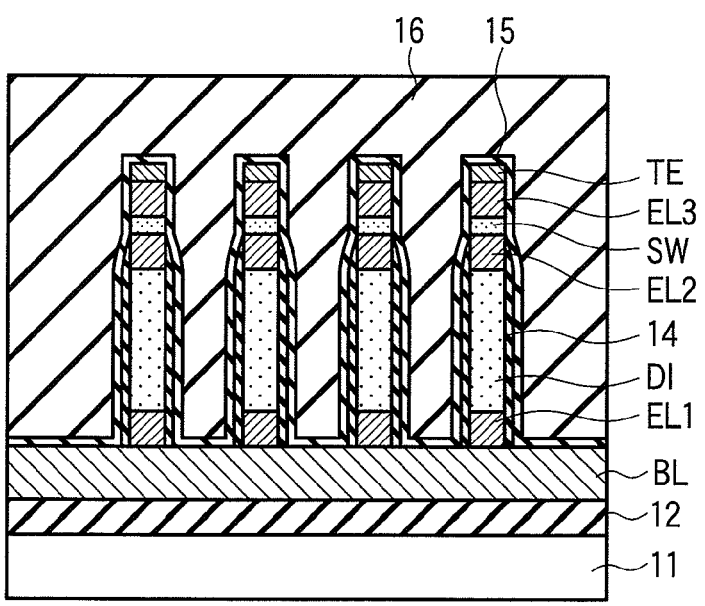

Thereafter, on the structure shown in FIGS. 9B and 9C, i.e., on the memory cells MC and the silicon nitride film 15, as shown in FIGS. 10B and 10C, the interlayer insulating film 16 is formed by, for example, an applying method. Furthermore, steam oxidation (WVG oxidation) is performed on the interlayer insulating film 16 at about 400 to 600° C. to replace C in the interlayer insulating film 16 with $O_2$.

Figure 11A:
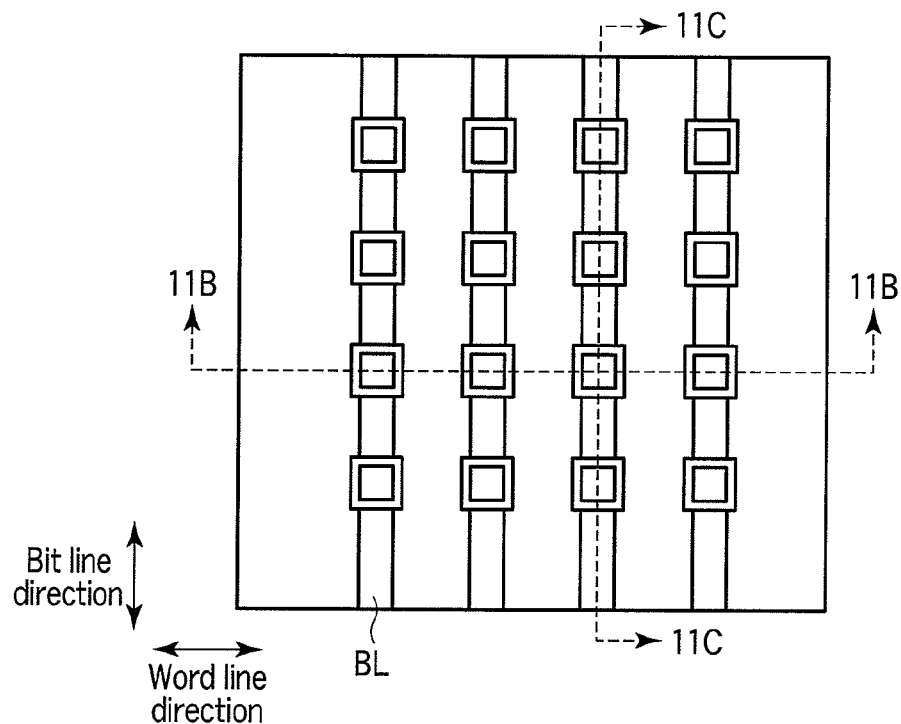
FIG. 11A is a plan view showing the method of manufacturing the semiconductor memory device according to the first embodiment.
Figure 11B:
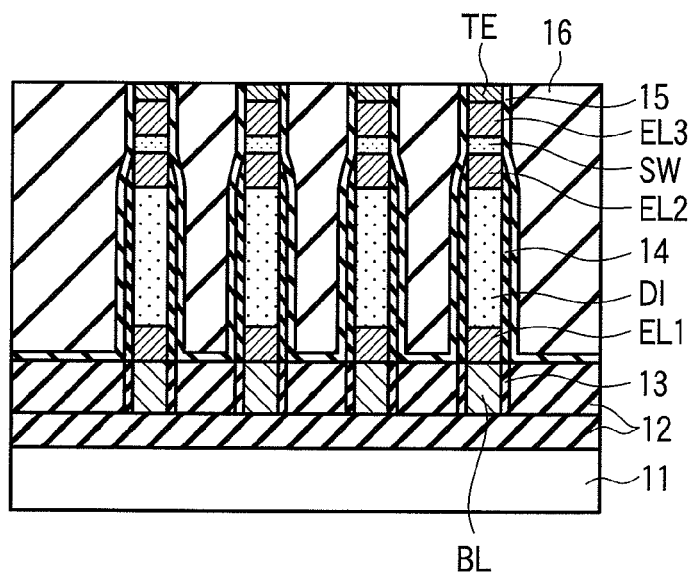

Subsequently, as shown in FIGS. 11B and 11C, the interlayer insulating film 16 is polished by CMP to expose a surface of the upper electrode layer TE. Furthermore, as shown in FIGS. 2B and 2C, the word line WL is formed on the upper electrode layer TE.

Thereafter, when the memory cells MC are to be formed on the word line WL, a side wall film (for example, silicon nitride film) is formed on a side surface of the word line WL. When a memory cell is not formed, the side wall film need not be formed. As a method of further manufacturing memory cells on the word line WL, the steps subsequent to the steps in FIGS. 4A, 4B, and 4C are performed again, and an interconnection rotated by 90°, and which includes the word line or the bit line, is formed.

[1-6] Modification of First Embodiment

The first embodiment is an example in which the silicon nitride films 14 and 15 are formed on a side surface of the diode as first side wall films and the silicon nitride film 15 is formed on a side surface of the upper electrode layer TE as a second side wall film. However, the embodiment is not limited to this configuration. A silicon oxide film and a silicon nitride film may be formed from a side surface side of the diode as the first side wall films, and a silicon nitride film may be formed on a side surface of the upper electrode layer TE as the second side wall film. When a silicon oxide film is to be directly formed on the side surface of the diode, the silicon oxide film may be formed on only the side surface of the diode by a selective oxidation method.

[1-7] Effect of First Embodiment

The first embodiment has the three effects described below.

First, an influence on a diode by fixed charges in an interlayer insulating film between memory cells can be suppressed. For example, when an $SiO_2$ film such as a polysilazane (PSZ) film containing large quantities of nitrogen and carbon is used as the interlayer insulating film, a backward current of the diode generated by bandbending is deteriorated due to an influence of fixed charges in the $SiO_2$ film. When the backward current is deteriorated, a load on a non-selected cell increases, which accelerates performance deterioration and increases power consumption.

In order to prevent an influence caused by the fixed charges, a silicon nitride film or a silicon oxide film including few fixed charges is used as a side wall film of a diode. When the fixed charges are distanced from the diode by the side wall film, the backward current can be suppressed. Based on studies, a thickness of the side wall film is required to be about 10 to 20 nm.

More specifically, in the first embodiment, since the silicon nitride films 14 and 15 (film thickness of 10 to 20 nm) are formed on the side surface of the diode DI, an influence on the diode due to the fixed charges in the interlayer insulating film 16 can be prevented. In this manner, performance deterioration of the memory cell and an increase in power consumption can be prevented. Even though a silicon oxide film and a silicon nitride film are used as the side wall films of the diode in place of the silicon nitride films 14 and 15, the same effect as described above can be obtained.

Second, when an interlayer insulating film is formed between memory cells, an electrode can be advantageously prevented from being oxidized. For example, when polysilazane is to be formed, an organic film containing large quantities of Si and N is applied to a cross-point memory cell. Thereafter, a thermal oxidation step is performed to replace N and C in the applied film with O. In this case, it is understood that a metal film (for example, W) constituting the electrode is oxidized by the thermal oxidation step.

However, when a silicon nitride film is formed with a predetermined film thickness between the applied film and the electrode, the problem can be solved. This method has a drawback, however. When the silicon nitride film is thickened, a capacity of the electrode increases accordingly, which accelerates performance deterioration. For this reason, a film thickness of the silicon nitride film between the applied film and the electrode must be suppressed to about 5 nm.

More specifically, when the silicon nitride film 15 is formed on a side surface of the upper electrode layer TE, oxidation of the upper electrode layer TE caused by a process in formation of the interlayer insulating film 16 can be prevented. In this manner, an electrode capacity is suppressed from increasing, and the performance deterioration of the memory cell can be prevented.

Third, an influence caused by an adjacent memory cell can be advantageously suppressed. In the cross-point memory cell array, when miniaturization is advanced to shorten a distance between adjacent memory cells, a problem appears. That problem is the occurrence of GIDL (Gate Induced Drain Leakage), in which a leakage current flows from a diode of a non-selected memory cell to an interconnection through a thin interlayer insulating film. In particular, near a corner or a junction of the memory cells, a backward current of the diode increases due to the occurrence of electric field concentration. In this manner, performance deterioration of the memory cells or an increase in power consumption occurs.

In order to prevent this problem, the electric field concentration must be moderated. When the side wall film near the diode is constituted by a silicon nitride film having a high dielectric constant, an electric field near a junction which causes leakage from the diode can be reduced. In this manner, an influence from an adjacent memory cell can be reduced.

As described above, according to the first embodiment, a silicon nitride film having a minimum film thickness required to prevent oxidation is formed on a side wall of an electrode, and a silicon nitride film having a film thickness larger than that of the silicon nitride film on the side wall of the electrode is formed on a side wall of a rectifying element (for example, diode). In this manner, an influence on a rectifying element caused by fixed charges in an interlayer insulating film can be suppressed, and an interconnection and the electrode can be further prevented from being oxidized.

[2] Second Embodiment

[2-1] Overall Configuration

Since an overall configuration of a semiconductor memory device according to a second embodiment is the same as that of the first embodiment, the overall configuration will not be described.

[2-2] Memory Cell Array

A configuration of the cross-point memory cell array 2 according to the second embodiment will be described.

FIG. 12A is a plan view of the memory cell array 2 according to the second embodiment. As shown in FIG. 12A, a plurality of first conductive lines extending in a bit line direction (first direction), for example, the bit lines BL are arranged at predetermined intervals in a word line direction (second direction). A plurality of second conductive lines extending in the word line direction, for example, the word lines WL are arranged at predetermined intervals in the bit line direction perpendicular to the bit line BL.

At crossing positions of the bit lines BL and the word lines WL, memory cells MC are arranged, respectively. Side wall films are formed on side surfaces of the memory cells MC in the bit line direction. The side wall film will be described below in detail.

[2-3] Memory Cell

A sectional structure of the memory cell MC will be described below with reference to FIGS. 12B and 12C. FIG. 12B is a sectional view along a 12B-12B line (word line direction) in FIG. 12A. FIG. 12C is a sectional view along a 12C-12C line (bit line direction) in FIG. 12A.

The sectional structure along the 12B-12B line of the memory cell MC is as follows.

As shown in FIG. 12B, the memory cells MC comprise rectifying elements, for example, diodes DI connected in series between the bit line BL and the word line WL, and switching elements SW.

On the semiconductor substrate 11, the interlayer insulating film 12 is formed. The bit line BL is formed on the interlayer insulating film 12, and the interlayer insulating film 12 is arranged between the bit lines BL.

Furthermore, on a side surface of the bit line BL, a barrier film 13 is formed, and the barrier film 13 is arranged between the bit line BL and the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cell MC is formed between the bit line BL and the word line WL, and the memory cell MC includes the first electrode layer EL1, the diode DI, the second electrode layer EL2, the switching element SW, the third electrode layer EL3, and the upper electrode layer TE.

On a side surface of the first electrode layer EL1, a side surface of the diode DI, and a side surface of the second electrode layer EL2, a first side wall film is formed. The first side wall film includes, for example, the silicon nitride film 14, a silicon oxide film 17, and the silicon nitride film 15. More specifically, on the side surface of the first electrode layer EL1, the side surface of the diode DI, and the side surface of the second electrode layer EL2, the silicon nitride film 14, the silicon oxide film 17, and the silicon nitride film 15 are sequentially formed from the side surface side. For example, a film thickness of the silicon nitride film 14 is about 1 nm, a film thickness of the silicon oxide film 17 is about 5 nm, and a film thickness of the silicon nitride film is 5 nm or less.

On a side surface of the switching element SW, a side surface of the third electrode layer EL3, and a side surface of the upper electrode layer TE, a second side wall film, for example, the silicon nitride film 15 is formed.

The interlayer insulating film 16 is formed between the plurality of memory cells MC. More specifically, on the side surfaces of the memory cells MC, the interlayer insulating film 16 is formed with the silicon nitride film 14, the silicon oxide film 17, and the silicon nitride film 15, or the silicon nitride film 15 interposed therebetween. The interlayer insulating film 16 is constituted by an applied oxide film, for example, a polysilazane film, formed by an applying method.

Furthermore, the word line WL is arranged on the upper electrode layer TE and the interlayer insulating film 16.

A sectional structure along the 12C-12C line of the memory cell MC is as follows.

As shown in FIG. 12C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed.

On the side surface of the first electrode layer EL1, the side surface of the diode DI, and the side surface of the second electrode layer EL2, the first side wall films, for example, the silicon nitride film 14, the silicon oxide film 17, and the silicon nitride film 15 are sequentially formed from the side surface side.

On the side surface of the switching element SW, the side surface of the third electrode layer EL3, and the side surface of the upper electrode layer TE, a second side wall film, for example, the silicon nitride film 15 is formed.

The interlayer insulating film 16 is formed between the plurality of memory cells MC.

[2-4] Diode ad Switching Element Constituting Memory Cell

Since the diode DI and the switching element SW of the memory cell MC according to the second embodiment are the same as those in the first embodiment, the diode DI and the switching element SW will not be described.

[2-5] Manufacturing Method

A method of manufacturing the semiconductor memory device according to the second embodiment is performed as follows.

In FIGS. 7B and 7C illustrating the manufacturing method of the first embodiment described above, on the memory cells MC and the interlayer insulating film 12, the silicon nitride film 14 is formed by, for example, CVD, low-temperature CVD, or ALD. Furthermore, on the silicon nitride film 14, the silicon oxide film 17 is formed by, for example, CVD, low-temperature CVD, or ALD.

Subsequently, on a side surface of the diode DI, the silicon nitride film 14 and the silicon oxide film 17 serving as side wall films are formed. More specifically, the silicon nitride film 14 and the silicon oxide film 17 above the side surface of the diode DI are etched to leave the silicon nitride film 14 and the silicon oxide film 17 on the side surface of the diode DI.

On the memory cells MC, the silicon oxide film 17, and the interlayer insulating film 12, the silicon nitride film 15 is formed by, for example, CVD, low-temperature CVD, or ALD.

Since the other steps are the same as those in the first embodiment, the steps will not be described.

[2-6] Modification of Second Embodiment

The second embodiment is an example in which the silicon nitride film 14, the silicon oxide film 17, and the silicon nitride film 15 are formed on a side surface of the diode as first side wall films, and the silicon nitride film 15 is formed on a side surface of the upper electrode layer TE as a second side wall film. However, the embodiment is not limited to this configuration. A silicon oxide film, a silicon nitride film, and a silicon nitride film may be formed from a side surface side of the diode as the first side wall films, and a silicon nitride film may be formed on a side surface of the upper electrode layer TE as the second side wall film.

[2-7] Effect of Second Embodiment

In the second embodiment, since the silicon nitride film 14, the silicon oxide film 17, and the silicon nitride film 15 are formed on the side surface of the diode DI, an influence on the diode by fixed charges in the interlayer insulating film 16 can be prevented. In this manner, performance deterioration of a memory cell or an increase in power consumption can be prevented. A total film thickness of the silicon nitride film 14, the silicon oxide film 17, and the silicon nitride film 15 is about 10 to 20 nm. In this case, the silicon nitride film 14 is a film used to prevent electric field concentration and to prevent a backward current from increasing. The silicon oxide film 17 is a film used to secure a distance from the fixed charges, and is a low-k film. The silicon nitride film 15 prevents N and C serving as sources of fixed charges from being diffused from the interlayer insulating film 16.

Even though a silicon oxide film, a silicon nitride film, and a silicon nitride film are used in place of the silicon nitride film 14, the silicon oxide film 17, and the silicon nitride film 15 as the side wall films of the diode, the same effect as described above can be obtained. The other effects are the same as those in the first embodiment.

As described above, according to the second embodiment, a silicon nitride film having a minimum film thickness required to prevent oxidation is formed on a side wall of an electrode, and a silicon nitride film having a film thickness larger than that of the silicon nitride film on the side wall of the electrode is formed on a side wall of a rectifying element (for example, diode). In this manner, an influence on a rectifying element by fixed charges in an interlayer insulating film can be suppressed, and further an interconnection and the electrode can be prevented from being oxidized.

[3] Third Embodiment

[3-1] Overall Configuration

Since an overall configuration of a semiconductor memory device according to a third embodiment is the same as that of the first embodiment, the overall configuration will not be described.

[3-2] Memory Cell Array

A configuration of the cross-point memory cell array 2 according to the third embodiment will be described.

Figure 13A:
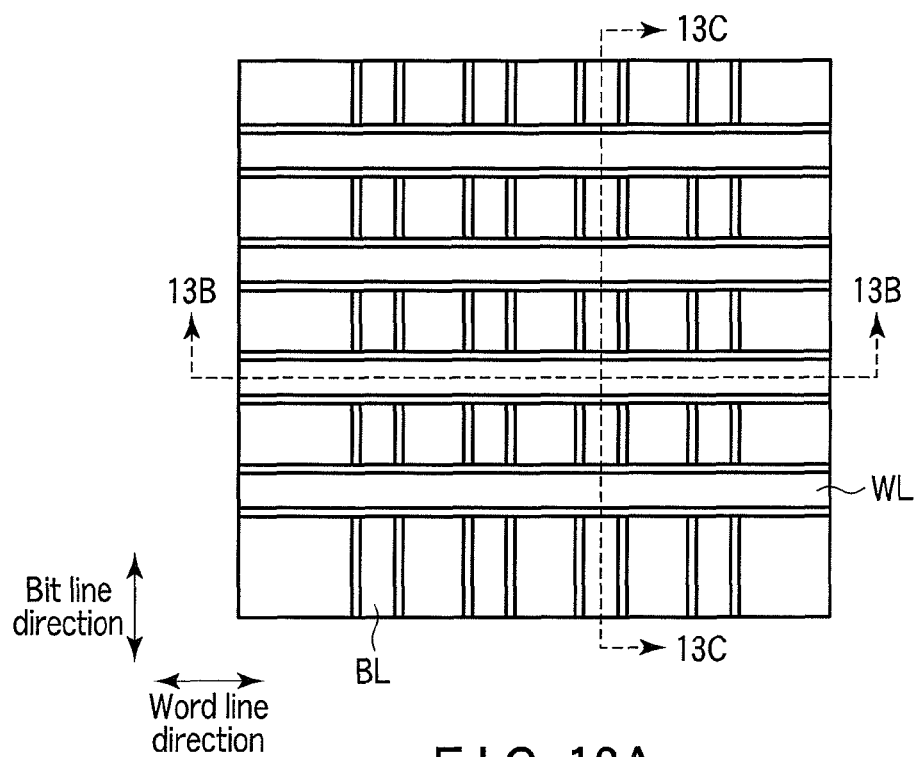
FIG. 13A is a plan view of a memory cell array of a semiconductor memory device according to a third embodiment.

FIG. 13A is a plan view of the memory cell array 2 according to the third embodiment. As shown in FIG. 13A, a plurality of first conductive lines extending in a bit line direction (first direction), for example, the bit lines BL are arranged at predetermined intervals in a word line direction (second direction). A plurality of second conductive lines extending in the word line direction, for example, the word lines WL are arranged at predetermined intervals in the bit line direction perpendicular to the bit line BL.

At crossing positions of the bit lines BL and the word lines WL, memory cells MC are arranged, respectively. Side wall films are formed on side surfaces of the memory cells MC in the bit line direction and the side surfaces of the memory cells MC in the word line direction. The side wall films are also formed on a side surface of the word line WL and a side surface of the bit line BL. The side wall film will be described below in detail.

[3-3] Memory Cell

Figure 13B:
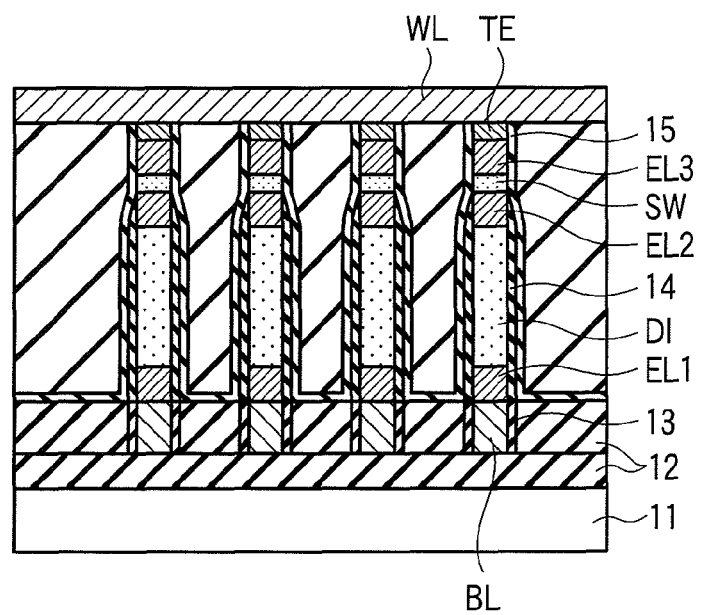
Figure 13C:
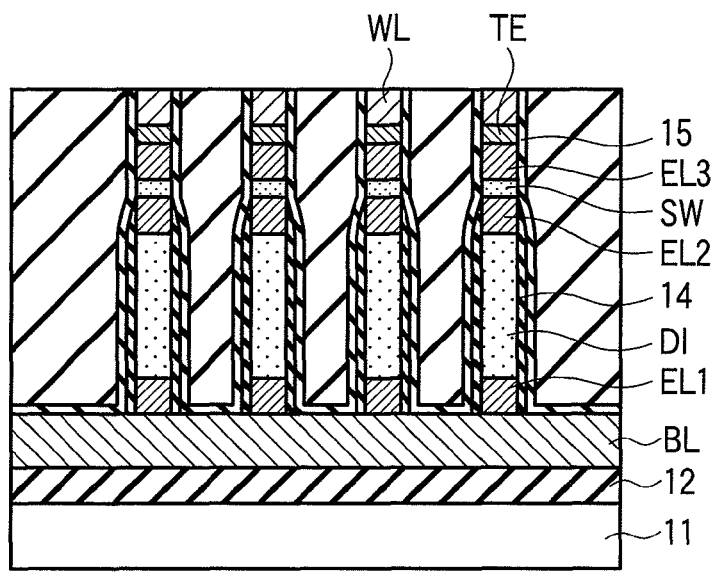
FIG. 13C is a sectional view along a 13C-13C line in FIG. 13A.

A sectional structure of the memory cell MC will be described below with reference to FIGS. 13B and 13C. FIG. 13B is a sectional view along a 13B-13B line (word line direction) in FIG. 13A. FIG. 13C is a sectional view along a 13C-13C line (bit line direction) in FIG. 13A.

The sectional structure along the 13B-13B line of the memory cell MC is as follows.

As shown in FIG. 13B, the memory cells MC comprise rectifying elements, for example, diodes DI connected in series between the bit line BL and the word line WL, and switching elements SW.

On the semiconductor substrate 11, the interlayer insulating film 12 is formed. The bit line BL is formed on the interlayer insulating film 12, and the interlayer insulating film 12 is arranged between the bit lines BL.

Furthermore, on a side surface of the bit line BL, the barrier film 13 is formed, and the barrier film 13 is arranged between the bit line BL and the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cell MC is formed between the bit line BL and the word line WL, and includes the first electrode layer EL1, the diode DI, the second electrode layer EL2, the switching element SW, the third electrode layer EL3, and the upper electrode layer TE.

On a side surface of the first electrode layer EL1, a side surface of the diode DI, and a side surface of the second electrode layer EL2, a first side wall film is formed. The first side wall film includes, for example, the silicon nitride films 14 and 15. More specifically, on the side surface of the first electrode layer EL1, the side surface of the diode DI, and the side surface of the second electrode layer EL2, the silicon nitride film 14 and the silicon nitride film 15 are sequentially formed from the side surface side. For example, a film thickness of the silicon nitride film 14 is about 5 to 15 nm and a film thickness of the silicon nitride film 15 is 5 nm or less.

On a side surface of the switching element SW, a side surface of the third electrode layer EL3, and a side surface of the upper electrode layer TE, a second side wall film, for example, the silicon nitride film 15 is formed.

The interlayer insulating film 16 is formed between the plurality of memory cells MC. The interlayer insulating film 16 is constituted by an applied oxide film, for example, a polysilazane film, formed by an applying method.

Furthermore, the word line WL is arranged on the upper electrode layer TE and the interlayer insulating film 16.

A sectional structure along the 13C-13C line of the memory cell MC is as follows.

As shown in FIG. 13C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed.

On the side surface of the first electrode layer EL1, the side surface of the diode DI, and the side surface of the second electrode layer EL2, the first side wall films, for example, the silicon nitride film 14 and the silicon nitride film 15 are sequentially formed from the side surface side.

On the side surface of the switching element SW, the side surface of the third electrode layer EL3, the side surface of the upper electrode layer TE, and a side surface of the word line WL, a second side wall film, for example, the silicon nitride film 15 is formed.

The interlayer insulating film 16 is formed between the plurality of memory cells MC.

[3-4] Diode and Switching Element Constituting Memory Cell

Since the diode DI and the switching element SW of the memory cell MC according to the third embodiment are the same as those in the first embodiment, the diode DI and the switching element SW will not be described.

[3-5] Manufacturing Method

Figure 14A:
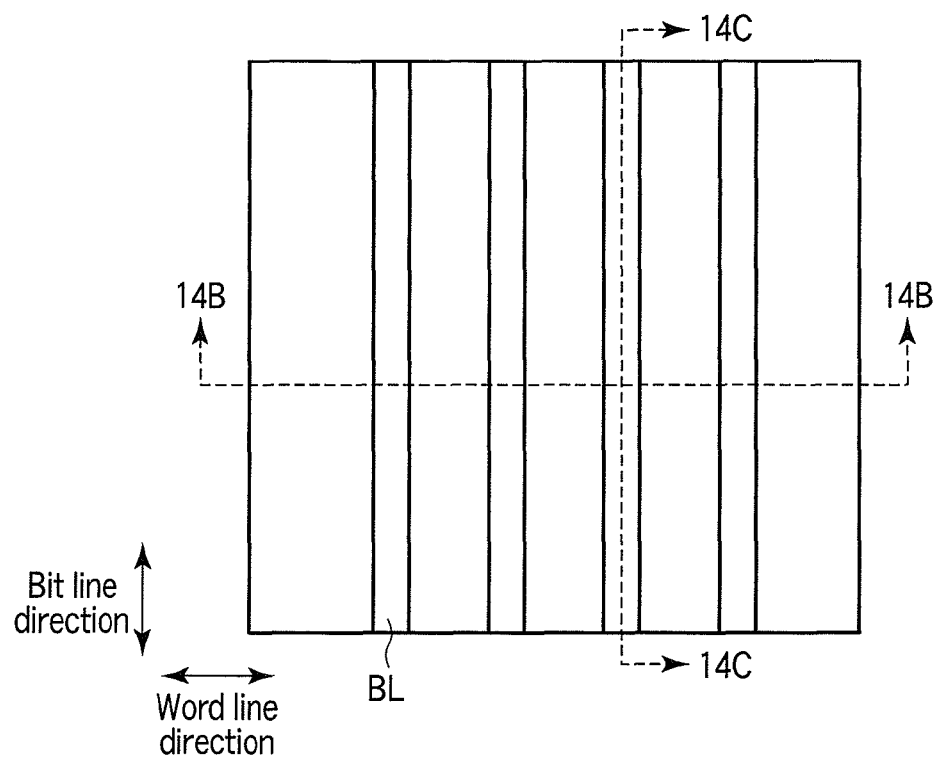
FIG. 14A is a plan view showing a method of manufacturing the semiconductor memory device according to the third embodiment.
Figure 15C:
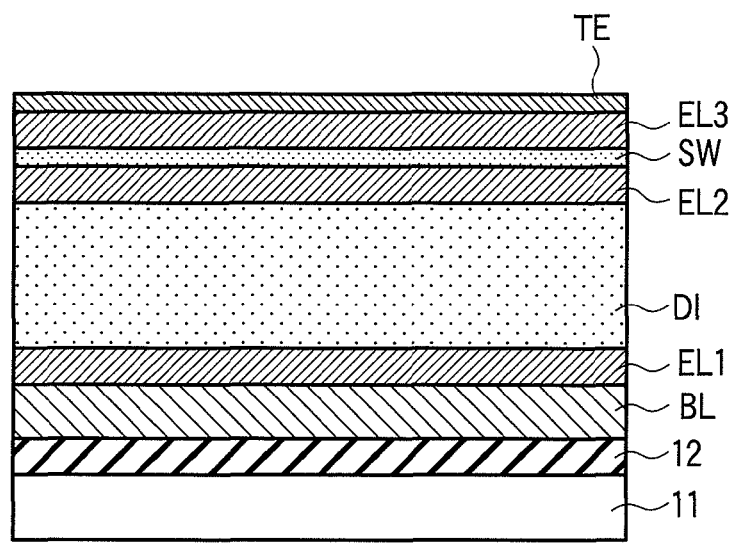

A method of manufacturing the semiconductor memory device according to the third embodiment will be described below. FIG. 14A, 15A, . . . , 22A are plan views showing the manufacturing method. FIGS. 14B, 15B, . . . , 22B are sectional views along 14B, 15B, . . . , 22B lines in FIGS. 14A, 15A, . . . , 22A, respectively, and FIGS. 14C, 15C, . . . , 22C are sectional views along 14C, 15C, . . . , 22C lines in FIGS. 14A, 15A, . . . , 22A, respectively.

Figure 3C:
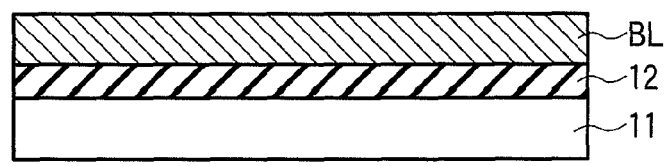

As shown in FIGS. 3B and 3C, the bit line BL, the barrier film 13, and the interlayer insulating film 12 are formed on the semiconductor substrate 11.

As shown in FIGS. 14B and 14C, on the bit line BL and the interlayer insulating film 12, the first electrode layer EL1, the diode DI, the second electrode layer EL2, the switching element SW, and the third electrode layer EL3 are formed. The upper electrode layer TE and the hard mask HM are formed on the third electrode layer EL3 to process these films. Furthermore, a resist film is applied to an upper surface of the hard mask HM, and the resist film is patterned to form the resist pattern RE. The resist pattern RE has a line-like pattern to form the first electrode layer EL1, the diode DI, the second electrode layer EL2, the switching element SW, and the third electrode layer EL3 in the form of a line along the bit line BL direction. The patterning of the resist film is performed by using, for example, a side wall transfer method or an ArF lithography technique.

Thereafter, as shown in FIG. 15B, the hard mask HM and the upper electrode layer TE are etched by using the resist pattern RE. Furthermore, the third electrode layer EL3, the switching element SW, the second electrode layer EL2, the diode DI, and the first electrode layer EL1 are etched with the hard mask HM to form the memory cells MC.

On the other hand, on the cross section along the 15C-15C line, as shown in FIG. 15C, the first electrode layer EL1, the diode DI, the second electrode layer EL2, the switching element SW, the third electrode layer EL3, and the upper electrode layer TE are still formed on the bit line BL.

Figure 16A:
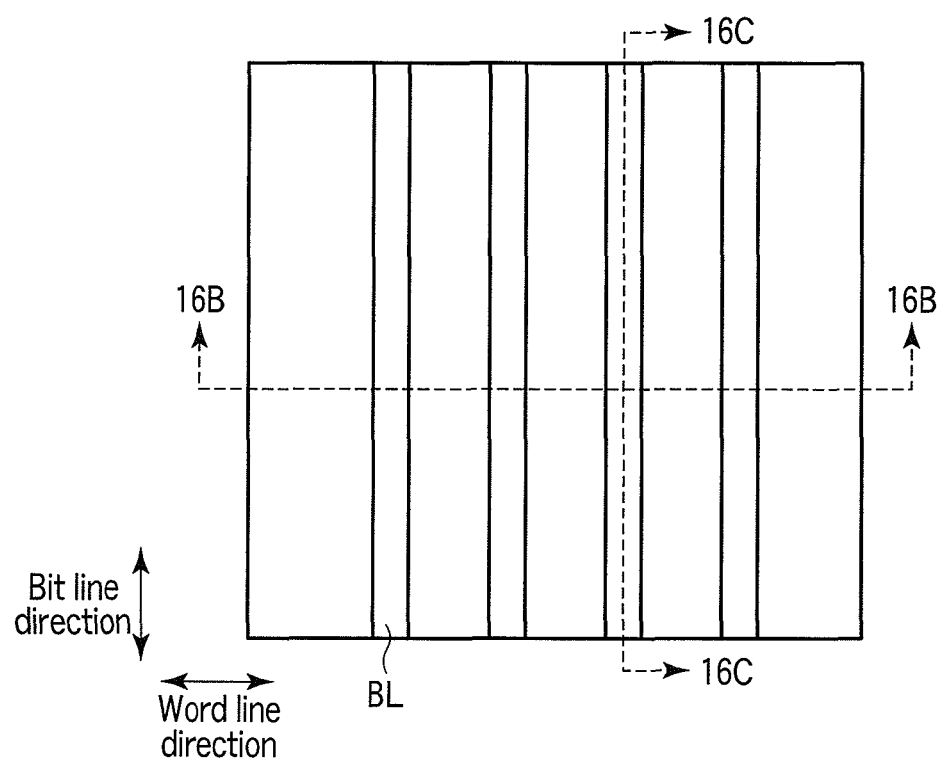
FIG. 16A is a plan view showing the method of manufacturing the semiconductor memory device according to the third embodiment.
Figure 16B:
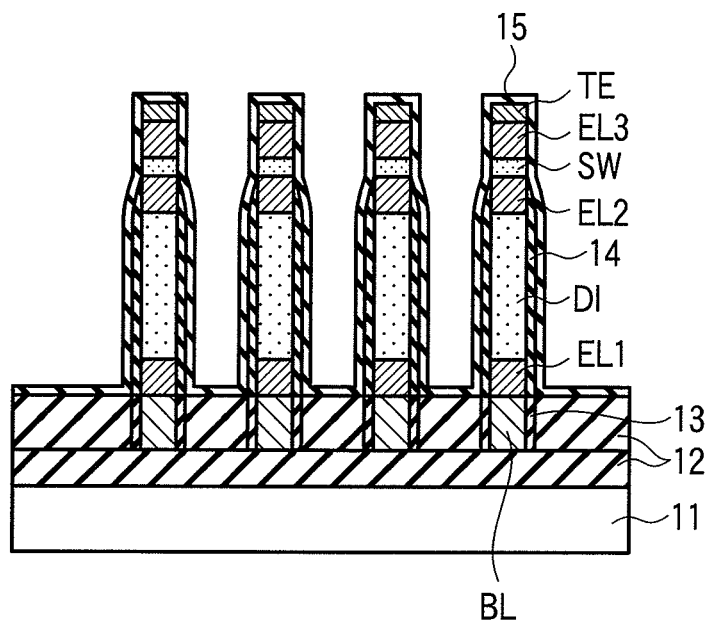
FIGS. 16B and 16C are sectional views showing the method of manufacturing the semiconductor memory device according to the third embodiment.
Figure 16C:
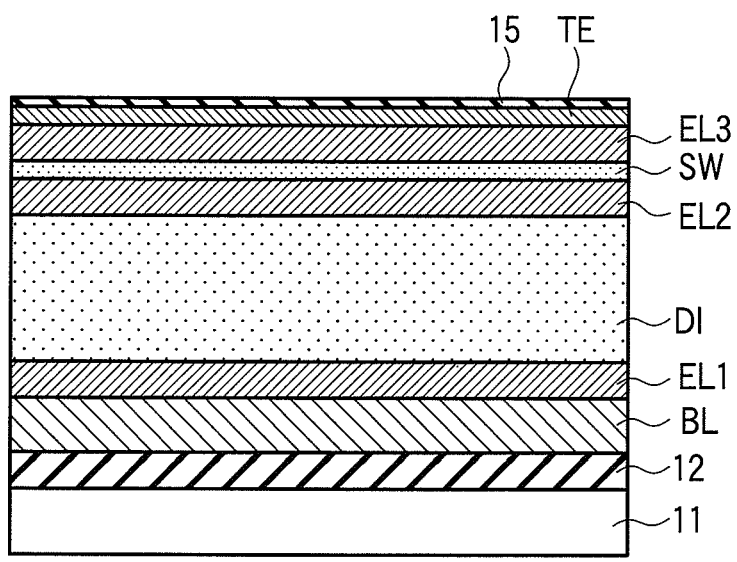

On the structure shown in FIGS. 15B and 15C, i.e., on the memory cells MC and the interlayer insulating film 12, as shown in FIGS. 16B and 16C, the silicon nitride film 14 is formed by, for example, CVD, low-temperature CVD, or ALD. Subsequently, the silicon nitride film 14 serving as a side wall film is formed on a side surface of the diode DI. More specifically, the silicon nitride film 14 above the side surface of the diode DI is etched by using RIE, i.e., the silicon nitride film 14 on the upper electrode layer TE, the side surface of the third electrode layer EL3, and the side surface of the switching element SW is etched to leave the silicon nitride film 14 on the side surface of the diode DI.

Furthermore, on the memory cell MC, the silicon nitride film 14, and the interlayer insulating film 12, the silicon nitride film 15 is formed by, for example, CVD, low-temperature CVD, or ALD.

Figure 17A:
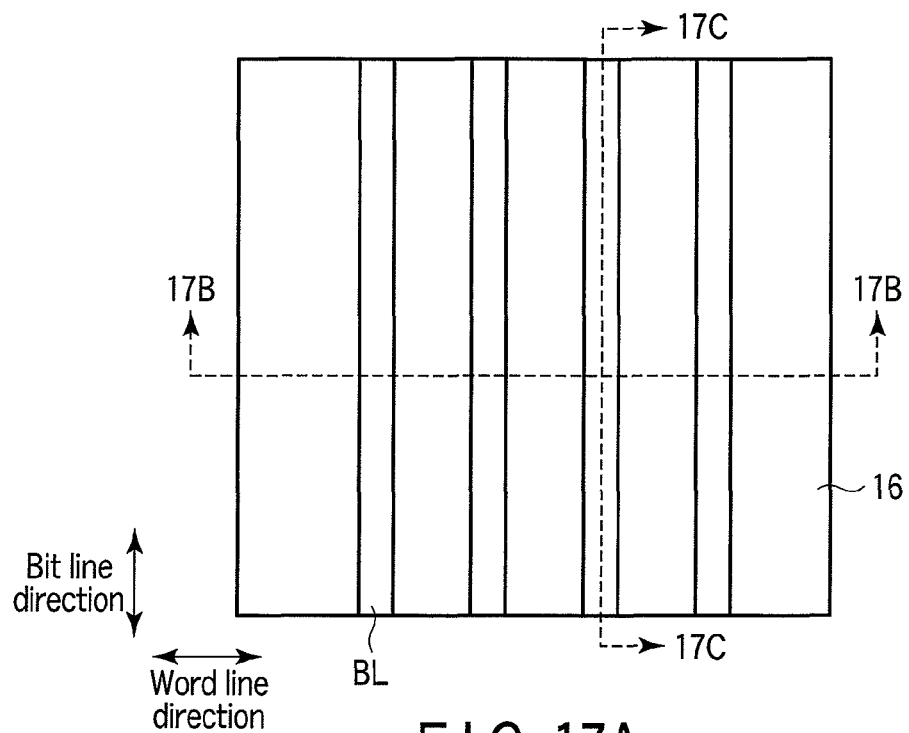
FIG. 17A is a plan view showing the method of manufacturing the semiconductor memory device according to the third embodiment.
Figure 17B:
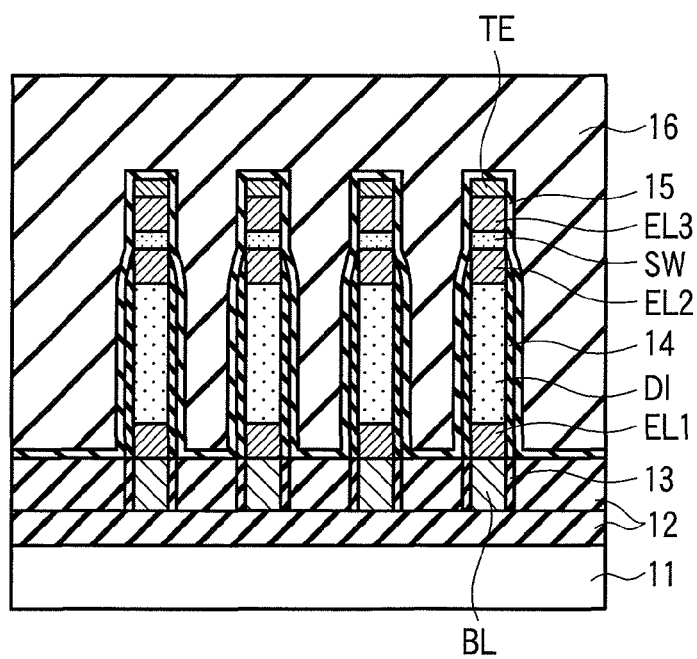

On the structure shown in FIGS. 16B and 16C, i.e., on the memory cells MC, the silicon nitride film 15, and the interlayer insulating film 12, as shown in FIGS. 17B and 17C, the interlayer insulating film 16 is formed by, for example, an applying method. Furthermore, steam oxidation (WVG oxidation) is performed on the interlayer insulating film 16 at about 400 to 600° C. to replace C in the interlayer insulating film 16 with $O_2$.

Furthermore, as shown in FIGS. 18B and 18C, the interlayer insulating film 16 is polished by CMP to expose a surface of the upper electrode layer TE.

Figure 19C:
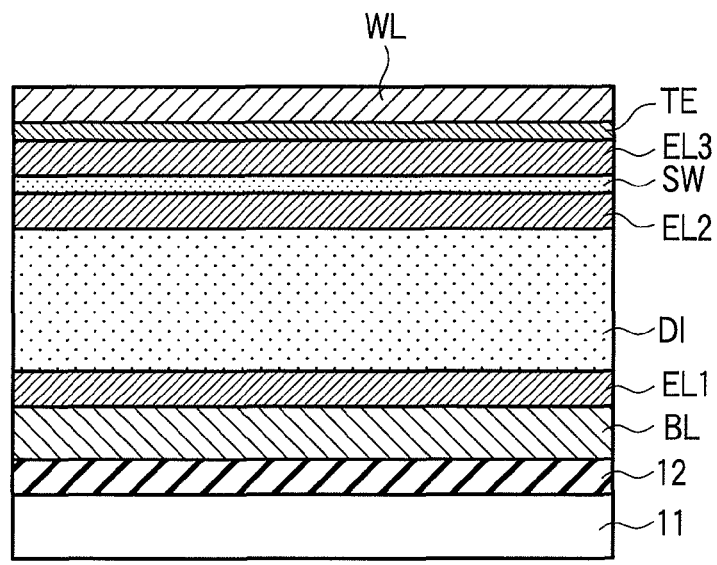

As shown in FIGS. 19B and 19C, the word line WL is formed on the upper electrode layer TE.

Figure 20A:
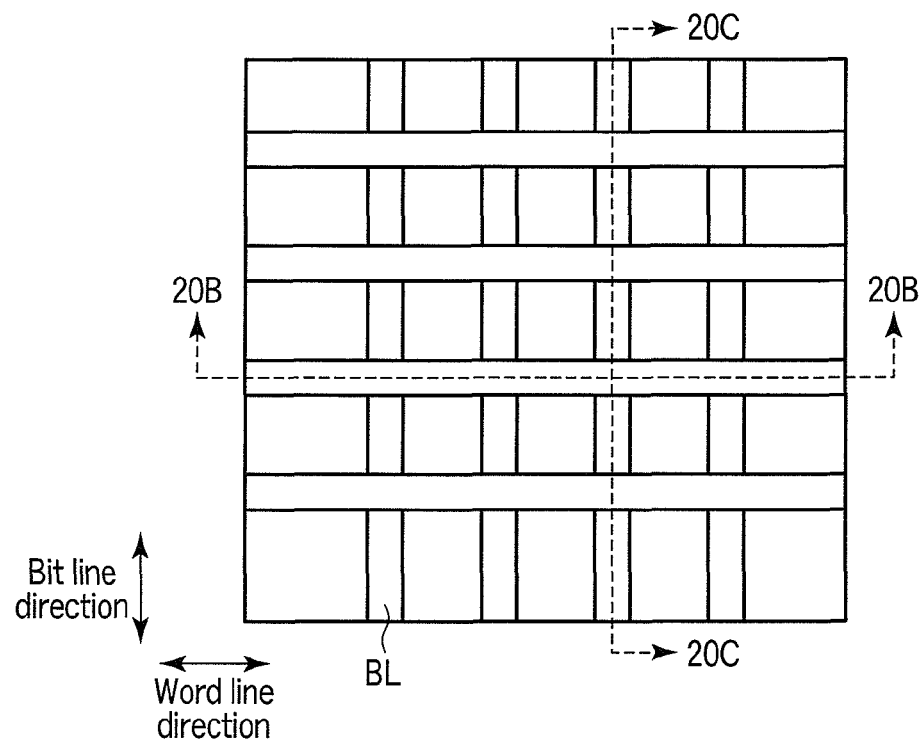
FIG. 20A is a plan view showing the method of manufacturing the semiconductor memory device according to the third embodiment.

Subsequently, as shown in FIGS. 20B and 20C, a hard mask HM2 is formed on the word line WL. Furthermore, a resist film is applied to an upper surface of the hard mask HM2, and the resist film is patterned to form a resist pattern RE2. The resist pattern RE2 has a line-like pattern to process the first electrode layer EL1, the diode DI, the second electrode layer EL2, the switching element SW, and the third electrode layer EL3 in the form of a line along the word line direction. The patterning of the resist film is performed by using, for example, a side wall transfer method or an ArF lithography technique.

Figure 21C:
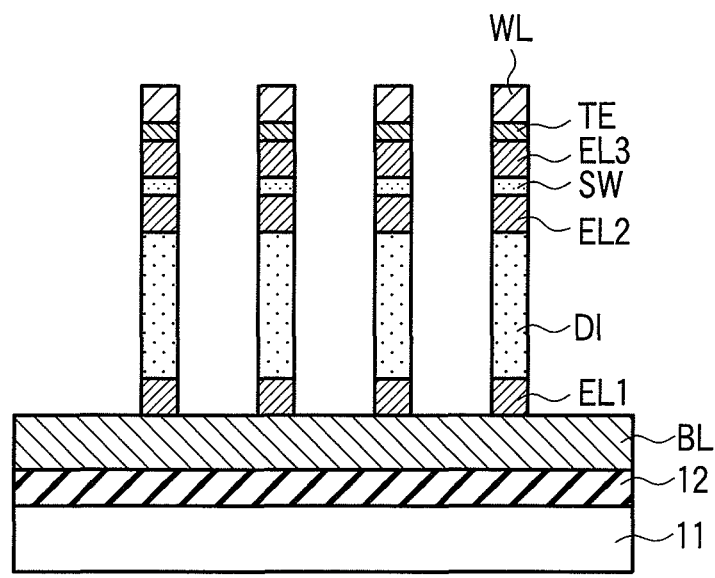

Thereafter, as shown in FIG. 21C, the hard mask HM2, the word line WL, and the upper electrode layer TE are etched by using the resist pattern RE2. Furthermore, the third electrode layer EL3, the switching element SW, the second electrode layer EL2, the diode DI, and the first electrode layer EL1 are etched with the hard mask HM2 to form the memory cells MC.

Figure 22A:
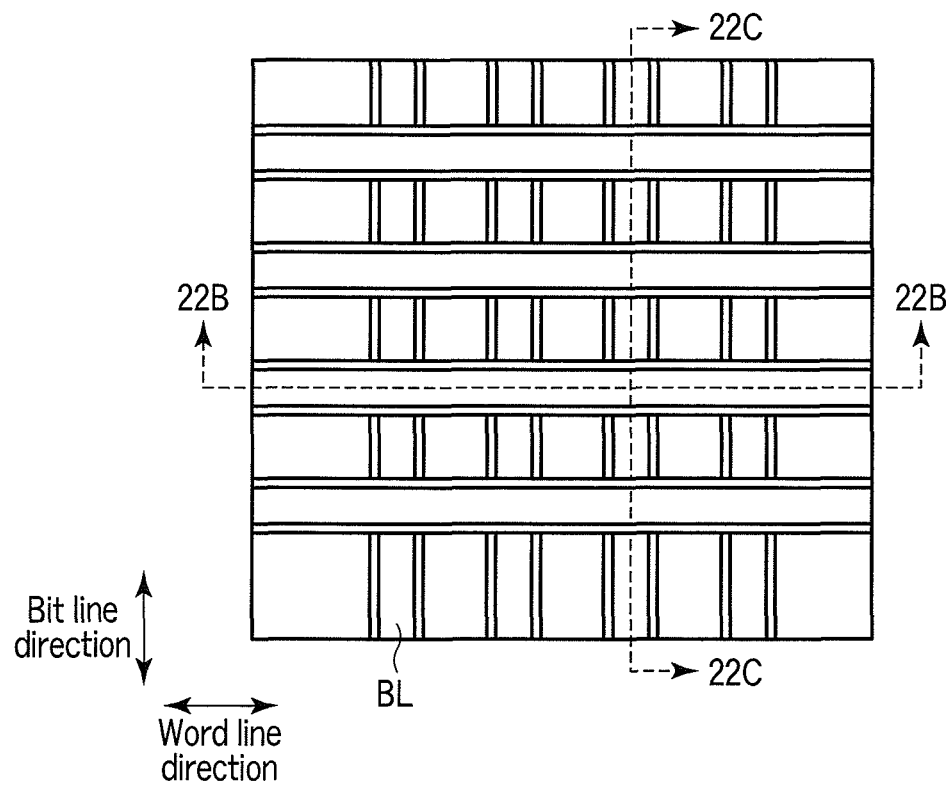
FIG. 22A is a plan view showing the method of manufacturing the semiconductor memory device according to the third embodiment.

On the structure shown in FIG. 21C, i.e., on the memory cells MC and the bit line BL, the silicon nitride film 14 is formed by, for example, CVD, low-temperature CVD, or ALD. Subsequently, as shown in FIG. 22C, the silicon nitride film 14 serving as a side wall film is formed on the side surface of the diode DI. More specifically, the silicon nitride film 14 above the side surface of the diode DI is etched by using RIE, i.e., the silicon nitride film 14 on the upper electrode layer TE, the side surface of the third electrode layer EL3, and the side surface of the switching element SW is etched to leave the silicon nitride film 14 on the side surface of the diode DI.

Furthermore, the silicon nitride film 15 is formed on the memory cells MC and the silicon nitride film 14 by, for example, CVD, low-temperature CVD, or ALD.

In this case, the silicon nitride film 15 formed on the side surface of the word line WL has a film thickness different from those of the silicon nitride films 14 and 15 formed on the side surface of the diode DI to reduce an interconnection capacity between the word lines WL.

On the structure shown in FIGS. 22B and 22C, i.e., on the memory cell MC, the silicon nitride film 15, and the interlayer insulating film 12, the interlayer insulating film 16 is formed by, for example, an applying method. Furthermore, steam oxidation (WVG oxidation) is performed on the interlayer insulating film 16 at about 400 to 600° C. to replace C in the interlayer insulating film 16 with $O_2$.

Furthermore, as shown in FIGS. 13B and 13C, the interlayer insulating film 16 is polished by CMP to expose a surface of the word line WL. In this manner, the structure shown in FIGS. 13B and 13C is formed.

Thereafter, when the memory cells MC are to be further formed on the word line WL, the steps are started from the steps shown in FIGS. 4A, 4B, and 4C, and an interconnection rotated by 90°, and which includes the word line and the bit line, is formed.

In this manufacturing method, as described above, without using a method of forming an island-like pattern in one photolithography step (Photo Engraving Process: PEP) as the step of forming the memory cell MC, the memory cells MC are formed by using the step of forming an interconnection such as a word line or a bit line.

[3-6] Modification of Third Embodiment

The third embodiment is an example in which the silicon nitride films 14 and 15 are formed on a side surface of the diode as first side wall films and the silicon nitride film 15 is formed on a side surface of the word line WL as a second side wall film. However, the embodiment is not limited to this configuration. A silicon oxide film and a silicon nitride film may be formed from a side surface side of the diode as the first side wall films, and a silicon nitride film may be formed on a side surface of the word line WL as the second side wall film.

[3-7] Effect of Third Embodiment

The third embodiment has the three effects described below.

First, an influence on a diode caused by fixed charges in an interlayer insulating film between memory cells can be suppressed. For example, when an $SiO_2$ film such as a polysilazane film containing large quantities of nitrogen and carbon is used as the interlayer insulating film, a backward current of the diode generated by bandbending is deteriorated due to an influence of fixed charges in the $SiO_2$ film. When the backward current is deteriorated, a load on a non-selected cell increases, which accelerates performance deterioration and increases power consumption.

In order to prevent an influence caused by the fixed charges, a silicon nitride film or a silicon oxide film including low fixed charges is used as a side wall film of a diode. When the fixed charges are distanced from the diode by the side wall film, the backward current can be suppressed. Based on studies, a thickness of the side wall film is required to be about 10 to 20 nm.

More specifically, in the third embodiment, since the silicon nitride films 14 and 15 (film thickness of 10 to 20 nm) are formed on the side surface of the diode DI, an influence on the diode caused by the fixed charges in the interlayer insulating film 16 can be prevented. In this manner, performance deterioration of the memory cell and an increase in power consumption can be prevented. Even though a silicon oxide film and a silicon nitride film are used as the side wall films of the diode in place of the silicon nitride films 14 and 15, the same effect as described above can be obtained.

Second, when an interlayer insulating film is formed between memory cells, an interconnection can be advantageously prevented from being oxidized. For example, when polysilazane is to be formed, an organic film containing large quantities of Si and N are applied to a cross-point memory cell. Thereafter, a thermal oxidation step is performed to replace N or C in the applied film with O. In this case, it is understood that a metal film (for example, W) constituting the interconnection is oxidized by the thermal oxidation step.

However, when a silicon nitride film is formed with a predetermined film thickness between the applied film and the interconnection, the problem can be solved. However, this method has a drawback. When the silicon nitride film is thickened, a capacity of the interconnection increases accordingly, which accelerates performance deterioration. For this reason, a film thickness of the silicon nitride film between the applied film and the interconnection needs to be suppressed to about 5 nm.

More specifically, when the silicon nitride film 15 is formed on a side surface of the word line WL, oxidation of the word line WL caused by a process in formation of the interlayer insulating film 16 can be prevented. In this manner, an interconnection capacity is suppressed from increasing, and the performance deterioration of the memory cell can be prevented.

Third, an influence from an adjacent memory cell can be advantageously suppressed. In the cross-point memory cell array, when miniaturization is advanced to shorten a distance between adjacent memory cells, a problem occurs. That problem is the occurrence of GIDL, in which a leakage current flows from a diode of a non-selected memory cell to an interconnection through a thin interlayer insulating film. In particular, near a corner or a junction of the memory cells, a backward current of the diode increases because electric field concentration occurs. In this manner, performance deterioration of the memory cells or an increase in power consumption occurs.

In order to prevent this problem, the electric field concentration needs to be moderated. When the side wall film near the diode is constituted by a silicon nitride film having a high dielectric constant, an electric field near a junction which causes leakage from the diode can be reduced. In this manner, an influence from an adjacent memory cell can be reduced.

As described above, according to the third embodiment, a silicon nitride film having a minimum film thickness required to prevent oxidation is formed on a side surface of an interconnection, and a silicon nitride film having a film thickness larger than that of the silicon nitride film on the side surface of the interconnection is formed on a side surface of a rectifying element (for example, diode). In this manner, an influence on a rectifying element caused by fixed charges in an interlayer insulating film can be suppressed, and the interconnection and an electrode can be further prevented from being oxidized.

[4] Fourth Embodiment

[4-1] Overall Configuration

Since an overall configuration of a semiconductor memory device according to a fourth embodiment is the same as that of the first embodiment, the overall configuration will not be described.

[4-2] Memory Cell Array

A configuration of the cross-point memory cell array 2 according to the fourth embodiment will be described.

FIG. 23A is a plan view of the memory cell array 2 according to the fourth embodiment. As shown in FIG. 23A, a plurality of first conductive lines extending in a bit line direction (first direction), for example, the bit lines BL are arranged at predetermined intervals in a word line direction (second direction). A plurality of second conductive lines extending in the word line direction, for example, the word lines WL are arranged at predetermined intervals in the bit line direction perpendicular to the bit line BL.

At crossing positions of the bit lines BL and the word lines WL, memory cells MC are arranged, respectively. Side wall films are formed on side surfaces of the memory cells MC in the bit line direction and the side surfaces of the memory cells MC in the word line direction. Furthermore, side wall films are also formed on the side surface of the word line WL and the side surface of the bit line BL. The side wall films will be described below in detail.

[4-3] Memory Cell

Figure 23C:
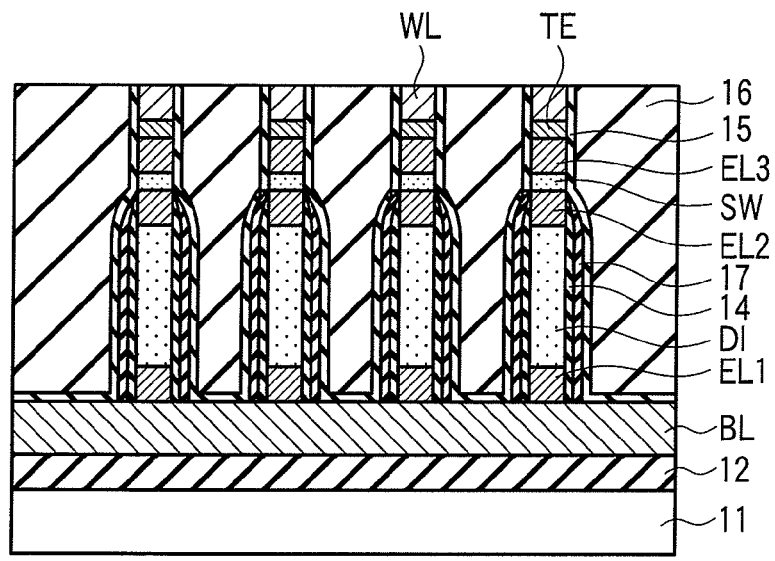
FIG. 23C is a sectional view along a 23C-23C line in FIG. 23A.

A sectional structure of the memory cell MC will be described below with reference to FIGS. 23B and 23C. FIG. 23B is a sectional view along a 23B-23B line (word line direction) in FIG. 23A. FIG. 23C is a sectional view along a 23C-23C line (bit line direction) in FIG. 23A.

The sectional structure along the 23B-23B line of the memory cell MC is as follows.

As shown in FIG. 23B, the memory cells MC comprise rectifying elements, for example, diodes DI connected in series between the bit line BL and the word line WL, and switching elements SW.

On the semiconductor substrate 11, the interlayer insulating film 12 is formed. The bit line BL is formed on the interlayer insulating film 12, and the interlayer insulating film 12 is arranged between the bit lines BL.

Furthermore, on a side surface of the bit line BL, the barrier film 13 is formed, and the barrier film 13 is arranged between the bit line BL and the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cell MC is formed between the bit line BL and the word line WL, and includes the first electrode layer EL1, the diode DI, the second electrode layer EL2, the switching element SW, the third electrode layer EL3, and the upper electrode layer TE.

On a side surface of the first electrode layer EL1, a side surface of the diode DI, and a side surface of the second electrode layer EL2, a first side wall film is formed. The first side wall film includes, for example, the silicon nitride film 14, the silicon oxide film 17, and the silicon nitride film 15. More specifically, on the side surface of the first electrode layer EL1, the side surface of the diode DI, and the side surface of the second electrode layer EL2, the silicon nitride film 14, the silicon oxide film 17, and the silicon nitride film 15 are sequentially formed from the side surface side. For example, a film thickness of the silicon nitride film 14 is about 1 nm, a film thickness of the silicon oxide film 17 is about 5 nm, and a film thickness of the silicon nitride film is 5 nm or less.

On a side surface of the switching element SW, a side surface of the third electrode layer EL3, and a side surface of the upper electrode layer TE, a second side wall film, for example, the silicon nitride film 15 is formed.

The interlayer insulating film 16 is formed between the plurality of memory cells MC. More specifically, on the side surfaces of the memory cells MC, the interlayer insulating film 16 is formed with the silicon nitride film 14, the silicon oxide film 17, and the silicon nitride film 15, or the silicon nitride film 15 interposed therebetween. The interlayer insulating film 16 is constituted by an applied oxide film, for example, a polysilazane film, formed by an applying method.

Furthermore, the word line WL is arranged on the upper electrode layer TE and the interlayer insulating film 16.

A sectional structure along the 23C-23C line of the memory cell MC is as follows.

As shown in FIG. 23C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed.

On the side surface of the first electrode layer EL1, the side surface of the diode DI, and the side surface of the second electrode layer EL2, the first side wall films, for example, the silicon nitride film 14, the silicon oxide film 17, and the silicon nitride film 15 are sequentially formed from the side surface side.

On the side surface of the switching element SW, the side surface of the third electrode layer EL3, the side surface of the upper electrode layer TE, and the side surface of the word line WL, a second side wall film, for example, the silicon nitride film 15 is formed.

The interlayer insulating film 16 is formed between the plurality of memory cells MC.

[4-4] Diode and Switching Element Constituting Memory Cell

Since the diode DI and the switching element SW of the memory cell MC according to the fourth embodiment are the same as those in the first embodiment, the diode DI and the switching element SW will not be described.

[4-5] Manufacturing Method

A method of manufacturing the semiconductor memory device according to the fourth embodiment is performed as follows.

In FIG. 16B illustrating the manufacturing method of the third embodiment described above, on the memory cells MC and the interlayer insulating film 12, the silicon nitride film 14 is formed by, for example, CVD, low-temperature CVD, or ALD. Furthermore, on the silicon nitride film 14, the silicon oxide film 17 is formed by, for example, CVD, low-temperature CVD, or ALD.

Subsequently, on a side surface of the diode DI, the silicon nitride film 14 and the silicon oxide film 17 serving as side wall films are formed. More specifically, by using RIE, the silicon nitride film 14 and the silicon oxide film 17 above the side surface of the diode DI are etched to leave the silicon nitride film 14 and the silicon oxide film 17 on the side surface of the diode DI.

On the memory cells MC, the silicon oxide film 17, and the interlayer insulating film 12, the silicon nitride film 15 is formed by, for example, CVD, low-temperature CVD, or ALD.

In FIG. 22C, on the memory cell MC and the interlayer insulating film 12, the silicon nitride film 14 is formed by, for example, CVD, low-temperature CVD, or ALD. Furthermore, the silicon oxide film 17 is formed on the silicon nitride film 14 by, for example, CVD, low-temperature CVD, or ALD.

Subsequently, on a side surface of the diode DI, the silicon nitride film 14 and the silicon oxide film 17 serving as side wall films are formed. More specifically, by using RIE, the silicon nitride film 14 and the silicon oxide film 17 above the side surface of the diode DI are etched to leave the silicon nitride film 14 and the silicon oxide film 17 on the side surface of the diode DI.

On the memory cells MC, the silicon oxide film 17, and the interlayer insulating film 12, the silicon nitride film 15 is formed by, for example, CVD, low-temperature CVD, or ALD.

Since the other steps are the same as those in the first embodiment, the steps will not be described.

[4-6] Modification of Fourth Embodiment

The fourth embodiment is an example in which the silicon nitride film 14, the silicon oxide film 17, and the silicon nitride film 15 are formed on a side surface of the diode as first side wall films and the silicon nitride film 15 is formed on a side surface of the word line WL as a second side wall film. However, the embodiment is not limited to this configuration. A silicon oxide film, a silicon nitride film, and a silicon nitride film may be formed from a side surface side of the diode as the first side wall films, and a silicon nitride film may be formed on the side surface of the word line WL as the second side wall film.

[4-7] Effect of Fourth Embodiment

In the fourth embodiment, since the silicon nitride film 14, the silicon oxide film 17, and the silicon nitride film 15 are formed on the side surface of the diode DI, an influence on the diode caused by fixed charges in the interlayer insulating film 16 can be prevented. In this manner, performance deterioration of a memory cell or an increase in power consumption can be prevented. A total film thickness of the silicon nitride film 14, the silicon oxide film 17, and the silicon nitride film 15 is about 10 to 20 nm. In this case, the silicon nitride film 14 is a film used to prevent electric field concentration and to prevent a backward current from increasing. The silicon oxide film 17 is a film used to secure a distance from the fixed charges, and is a low-k film. The silicon nitride film 15 prevents N and C serving as sources of fixed charges from being diffused from the interlayer insulating film 16.

Even though a silicon oxide film, a silicon nitride film, and a silicon nitride film are used in place of the silicon nitride film 14, the silicon oxide film 17, and the silicon nitride film 15 as the side wall films of the diode DI, the same effect as described above can be obtained. The other effects are the same as those in the third embodiment.

As described above, according to the fourth embodiment, a silicon nitride film having a minimum film thickness required to prevent oxidation is formed on a side surface of an interconnection, and a silicon nitride film having a film thickness larger than that of the silicon nitride film on the side surface of the interconnection is formed on a side surface of a rectifying element (for example, diode). In this manner, an influence on a rectifying element caused by fixed charges in an interlayer insulating film can be suppressed, and further the interconnection and an electrode can be prevented from being oxidized.

[5] Fifth Embodiment

[5-1] Overall Configuration

Since an overall configuration of a semiconductor memory device according to a fifth embodiment is the same as that of the first embodiment, the overall configuration will not be described.

[5-2] Memory Cell Array

A configuration of the cross-point memory cell array 2 according to the fifth embodiment will be described.

Figure 24A:
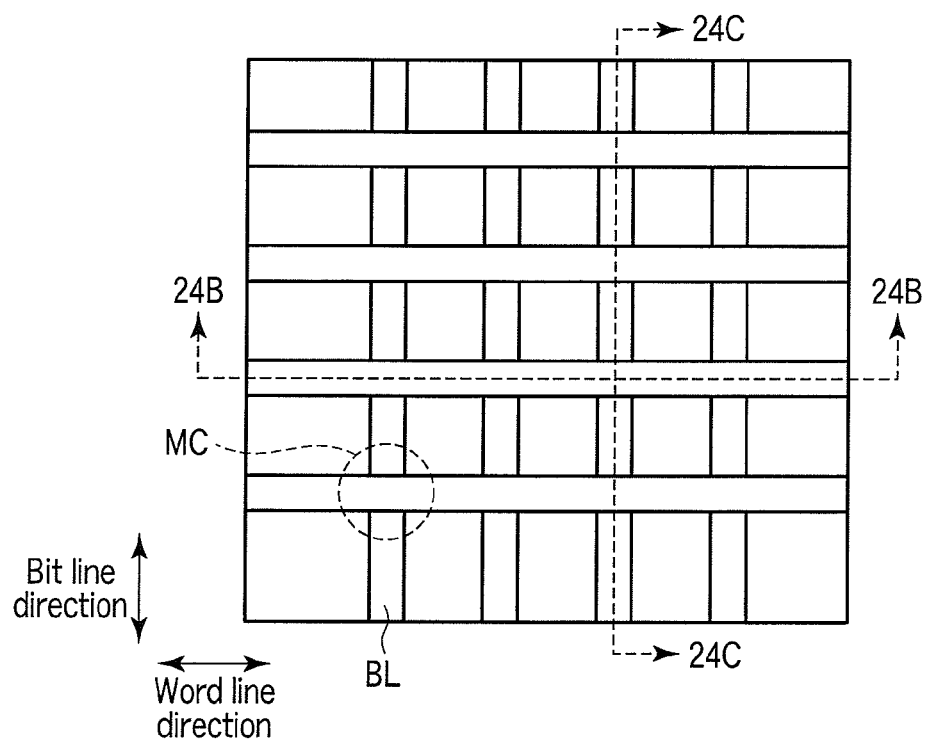
FIG. 24A is a plan view of a memory cell array of a semiconductor memory device according to a fifth embodiment.

FIG. 24A is a plan view of the memory cell array 2 according to the fifth embodiment. As shown in FIG. 24A, a plurality of first conductive lines extending in a bit line direction (first direction), for example, the bit lines BL are arranged at predetermined intervals in a word line direction (second direction). A plurality of second conductive lines extending in the word line direction, for example, the word lines WL are arranged at predetermined intervals in the bit line direction perpendicular to the bit line BL.

At crossing positions of the bit lines BL and the word lines WL, memory cells MC are arranged, respectively.

[5-3] Memory Cell

A sectional structure of the memory cell MC will be described below with reference to FIGS. 24B and 24C. FIG. 24B is a sectional view along a 24B-24B line (word line direction) in FIG. 24A. FIG. 24C is a sectional view along a 24C-24C line (bit line direction) in FIG. 24A.

The sectional structure along the 24B-24B line of the memory cell MC is as follows.

As shown in FIG. 24B, the memory cells MC on a first layer comprise rectifying elements, for example, diodes DI connected in series between the bit line BL and the word line WL, and switching elements SW.

On the semiconductor substrate 11, the interlayer insulating film 12 is formed. The bit line BL is formed on the interlayer insulating film 12, and the interlayer insulating film 12 is arranged between the bit lines BL.

Furthermore, on a side surface of the bit line BL, the barrier film 13 is formed, and the barrier film 13 is arranged between the bit line BL and the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cells MC on the first layer are formed between the bit line BL and the word line WL, and include the first electrode layer EL1, the diode DI, the second electrode layer EL2, the switching element SW, the third electrode layer EL3, and the upper electrode layer TE.

On a side surface of the first electrode layer EL1, a side surface of the diode DI, and a side surface of the second electrode layer EL2, a first side wall film is formed. The first side wall film includes, for example, the silicon nitride films 14 and 15. More specifically, on the side surface of the first electrode layer EL1, the side surface of the diode DI, and the side surface of the second electrode layer EL2, the silicon nitride film 14 and the silicon nitride film 15 are sequentially formed from the side surface side. For example, a film thickness of the silicon nitride film 14 is about 5 to 15 nm and a film thickness of the silicon nitride film 15 is 5 nm or less.

On a side surface of the switching element SW, a side surface of the third electrode layer EL3, and a side surface of the upper electrode layer TE, a second side wall film, for example, the silicon nitride film 15 is formed.

The interlayer insulating film 16 is formed between the plurality of memory cells MC. The interlayer insulating film 16 is constituted by an applied oxide film, for example, a polysilazane film, formed by an applying method. The word line WL is arranged on the upper electrode layer TE and the interlayer insulating film 16.

Furthermore, on the word line WL, a first electrode layer EL11, a diode DI11, a second electrode layer EL12, a switching element SW11, a third electrode layer EL13, and an upper electrode layer TE11 are sequentially formed.

A sectional structure along the 24C-24C line of the memory cell MC is as follows.

As shown in FIG. 24C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cells MC on the first layer are formed between the bit line BL and the word line WL.

On the side surface of the first electrode layer EL1, the side surface of the diode DI, and the side surface of the second electrode layer EL2, the first side wall films, for example, the silicon nitride film 14 and the silicon nitride film 15 are sequentially formed from the side surface side.

On the side surface of the switching element SW, the side surface of the third electrode layer EL3, the side surface of the upper electrode layer TE, and the side surface of the word line WL, a second side wall film, for example, the silicon nitride film 15 is formed. Furthermore, the interlayer insulating film 16 is formed between the plurality of memory cells on the first layer.

On the word line WL, the first electrode layer EL11, the diode DI11, the second electrode layer EL12, the switching element SW11, the third electrode layer EL13, and the upper electrode layer TE11 are sequentially formed. More specifically, on the word line WL, the memory cells MC on a second layer are formed.

On a side surface of the first electrode layer EL11, for example, the silicon nitride film 15 is formed. On a side surface of the diode DI11 and a side surface of the second electrode layer EL12, first side wall films, for example, the silicon nitride film 14 and the silicon nitride film 15 are sequentially formed from the side surface side.

On the side surface of the switching element SW11, a side surface of the third electrode layer EL13, and a side surface of the upper electrode layer TE11, a second side wall film, for example, the silicon nitride film 15 is formed. Furthermore, an interlayer insulating film 19 is formed between the plurality of memory cells MC on the second layer.

[5-4] Diode and Switching Element Constituting Memory Cell

Since the diode DI and the switching element SW of the memory cell MC according to the fifth embodiment are the same as those in the first embodiment, the diode and the switching element will not be described.

[5-5] Manufacturing Method

Figure 26A:
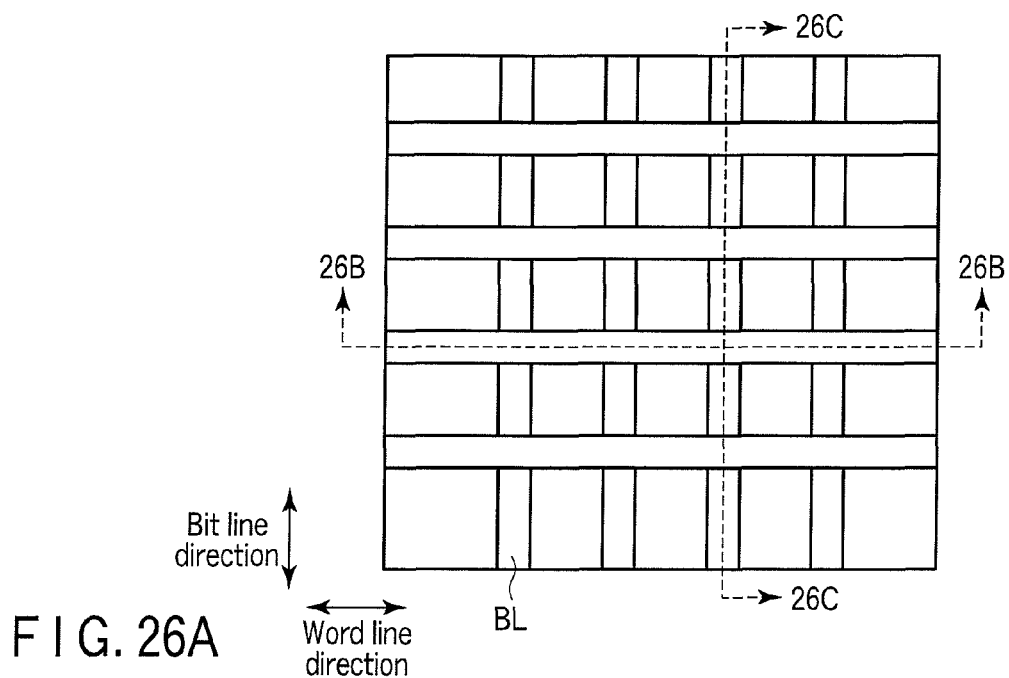
FIG. 26A is a plan view showing the method of manufacturing the semiconductor memory device according to the fifth embodiment.
Figure 26B:
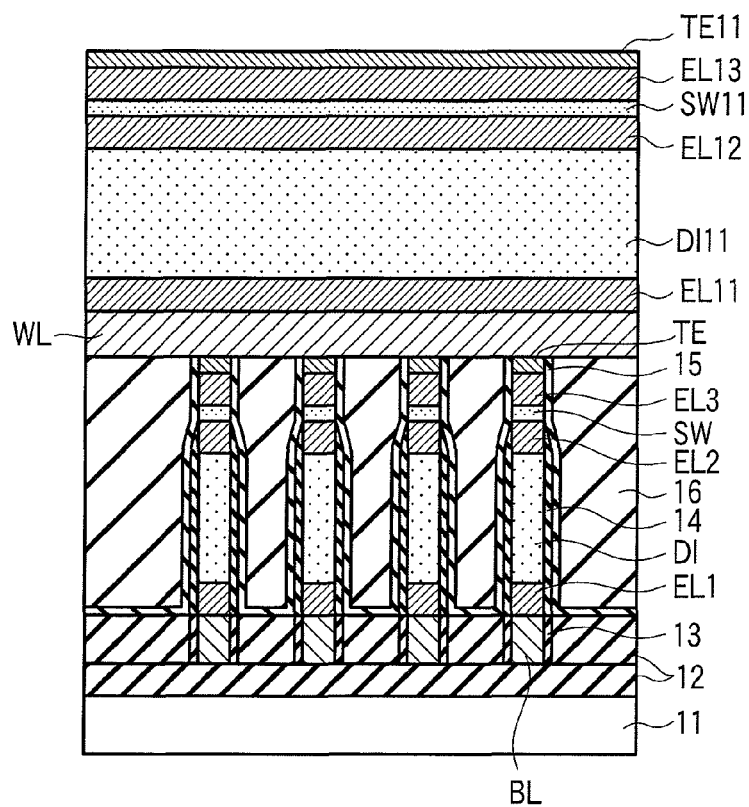
FIGS. 26B and 26C are sectional views showing the method of manufacturing the semiconductor memory device according to the fifth embodiment.

A method of manufacturing the semiconductor memory device according to the fifth embodiment will be described below. FIGS. 25A, 26A, . . . , 29A are plan views showing the manufacturing method. FIGS. 25B, 26B, . . . , 29B are sectional views along 25B, 26B, . . . , 29B lines in FIGS. 25A, 26A, . . . , 29A, respectively, and FIGS. 25C, 26C, . . . , 29C are sectional views along 25C, 26C, . . . , 29C lines in FIGS. 25A, 26A, . . . , 29A, respectively.

According to the manufacturing method shown in FIGS. 14B to 18B and FIGS. 14C to 18C, the bit line BL and the memory cells MC on the first layer are formed on the semiconductor substrate 11.

As shown in FIGS. 25A, 25B, and 25C, on the upper electrode layer TE and the interlayer insulating film 16, a film serving as the word line WL, the first electrode layer EL11, the diode DI11, the second electrode layer EL12, the switching element SW11, and the third electrode layer EL13 are formed.

In order to process these films, the upper electrode layer TE11 and a hard mask HM11 are formed on the third electrode layer EL13. Furthermore, a resist film is applied to an upper surface of the hard mask HM11, and the resist film is patterned to form a resist pattern RE11. The resist pattern RE11 has a line-like pattern to process the first electrode layer EL1, the diode DI, the second electrode layer EL2, the switching element SW, and the third electrode layer EL3 in the form of a line along the word line WL direction. The patterning of the resist film is performed by using, for example, a side wall transfer method or an ArF lithography technique.

Figure 26C:
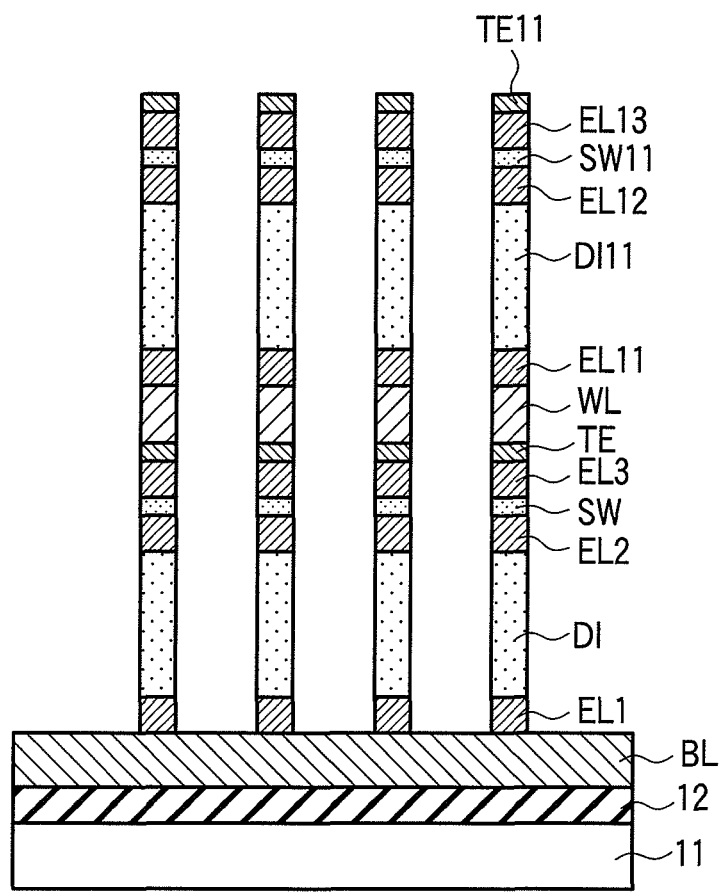

Thereafter, as shown in FIG. 26C, the hard mask HM11 and the upper electrode layer TE11 are etched by using the resist pattern RE11. Furthermore, the memory cells of the two layers are processed with the hard mask HM11. More specifically, by using the hard mask HM11, the third electrode layer EL13, the switching element SW11, the second electrode layer EL12, the diode DI11, the first electrode layer EL11, the film serving as the word line WL, the upper electrode layer TE, the third electrode layer EL3, the switching element SW, the second electrode layer EL2, the diode DI, and the first electrode layer EL1 are successively etched.

Figure 27A:
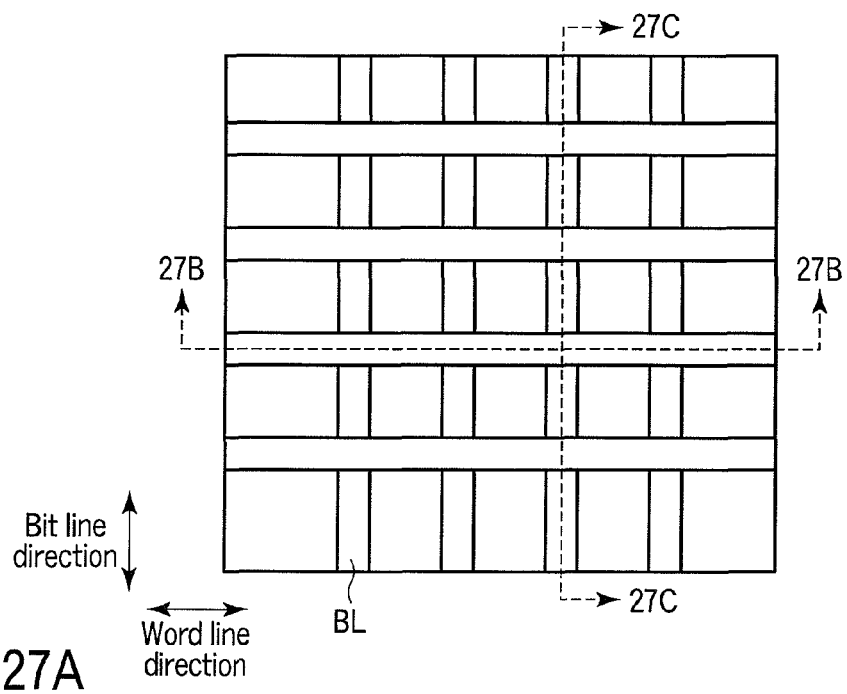
FIG. 27A is a plan view showing the method of manufacturing the semiconductor memory device according to the fifth embodiment.
Figure 27B:
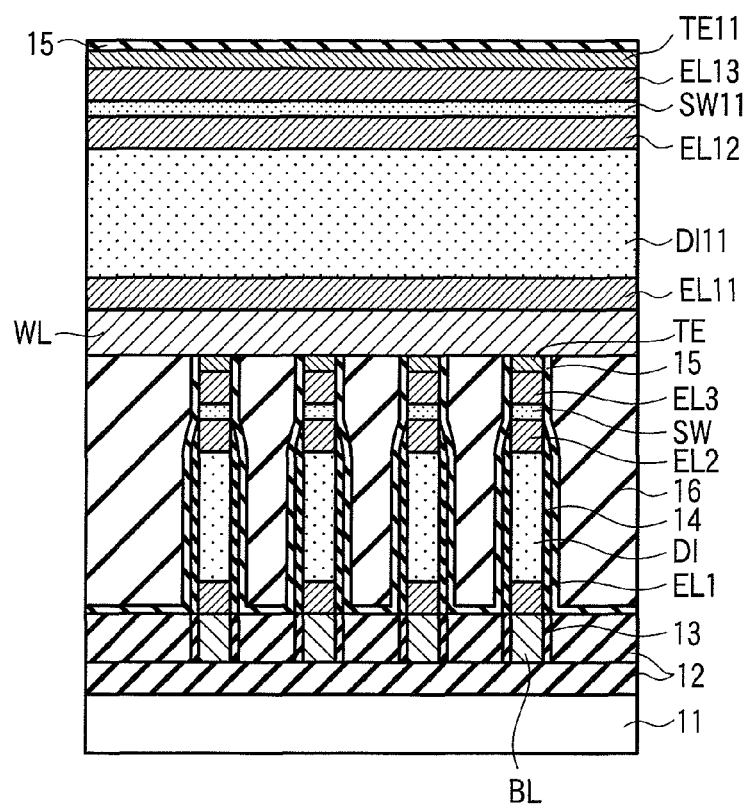

On the structure shown in FIG. 26C, i.e., on the memory cells MC of the two layers and the bit line BL, for example, the silicon nitride film 14 is formed by CVD, low-temperature CVD, or ALD. Subsequently, as shown in FIG. 27C, by using, for example, RIE, the silicon nitride film 14 serving as a side wall film is formed on the side surface of the diode DI. More specifically, the silicon nitride film 14 above the side surface of the diode DI is etched by using RIE to leave the silicon nitride film 14 on the side surface of the diode DI.

Furthermore, on the memory cells MC of the two layers, the silicon nitride film 14, and the bit line BL, the silicon nitride film 15 is formed by CVD, low-temperature CVD, or ALD. In this manner, a film thickness of the side wall film on the side surface of the word line WL is set to be different from that of the side wall film on the side surfaces of the diodes DI on the first layer.

Furthermore, on the memory cells MC, the silicon nitride film 15, and the interlayer insulating film 12, the interlayer insulating film 16 is formed by, for example, an applying method. Furthermore, steam oxidation (WVG oxidation) is performed to the interlayer insulating film 16 at about 400 to 600° C. to replace C in the interlayer insulating film 16 with $O_2$.

Figure 28A:
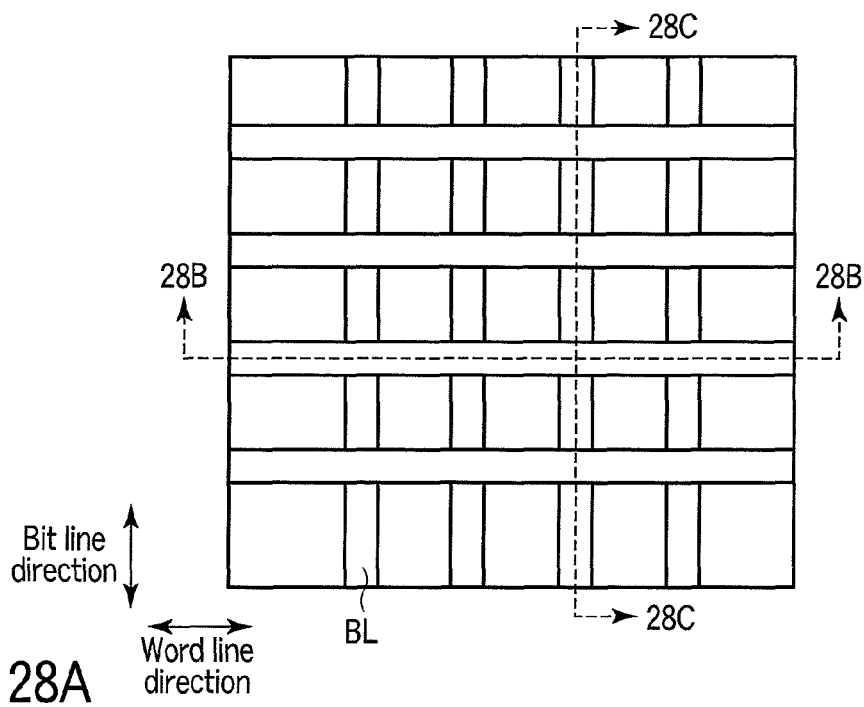
FIG. 28A is a plan view showing the method of manufacturing the semiconductor memory device according to the fifth embodiment.
Figure 28B:
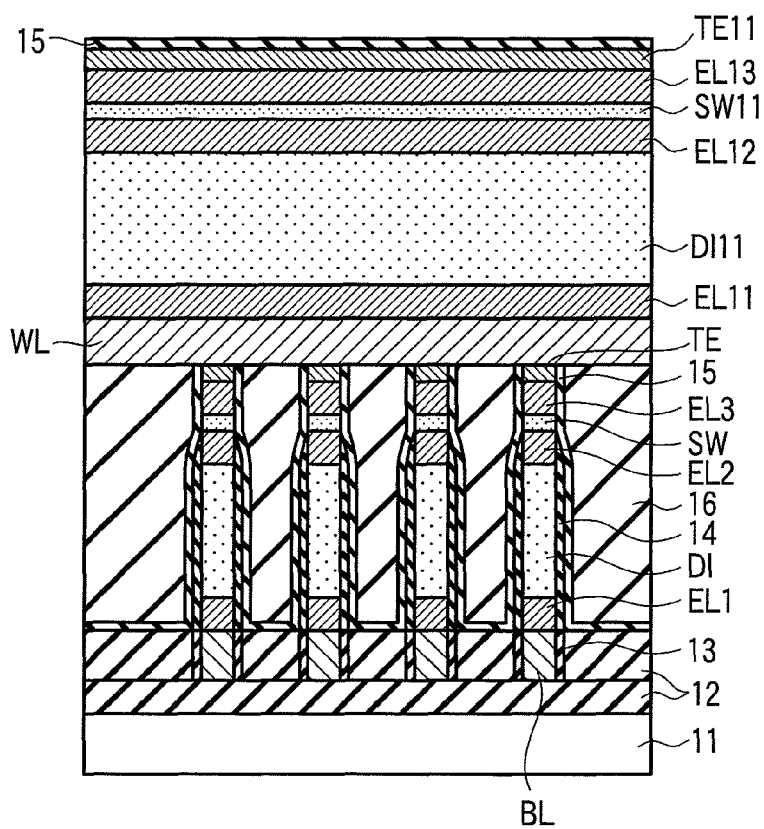

The structure shown in FIG. 27C is etched back, as shown in FIG. 28C, to remove the interlayer insulating film 16 to a portion under the diode DI11.

Figure 29C:
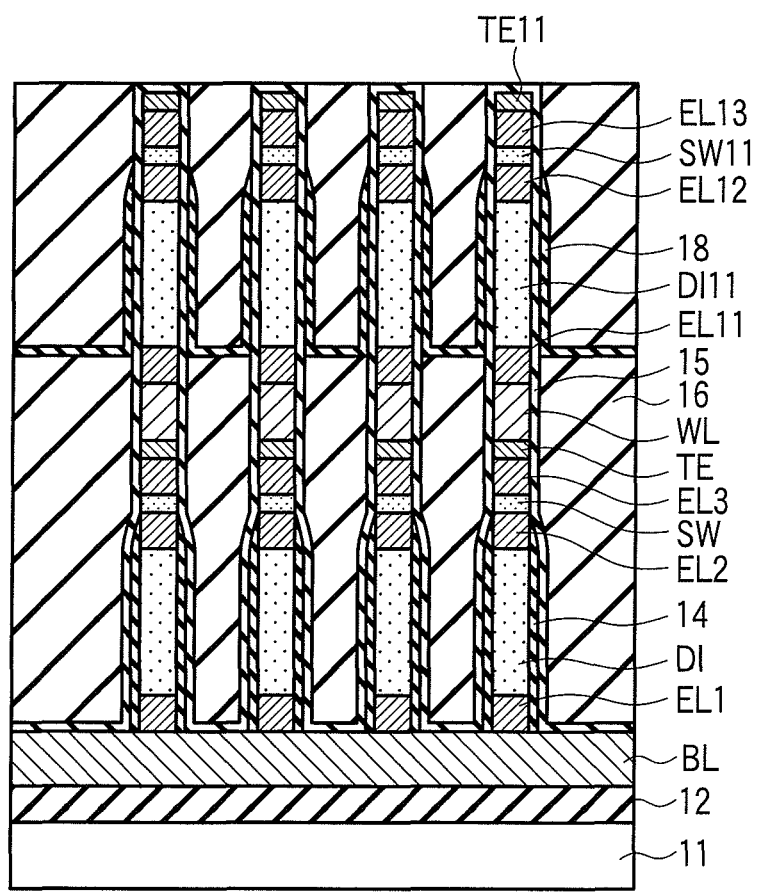

Thereafter, on the structure shown in FIG. 28C, i.e., on the silicon nitride film 15 and the interlayer insulating film 16, a silicon nitride film 18 is formed by, for example, CVD, low-temperature CVD, or ALD. Subsequently, as shown in FIG. 29C, by using, for example, RIE, the silicon nitride film 18 serving as a side wall film is formed on the side surface of the diode DI11. More specifically, the silicon nitride film 18 above the side surface of the diode DI11 is etched by using RIE to leave the silicon nitride film 18 on the side surface of the diode DI11.

Furthermore, on the memory cells MC of the second layer, the interlayer insulating film 19 is formed. Steam oxidation (WVG oxidation) is performed on the interlayer insulating film 19 at about 400 to 600° C. to replace C in the interlayer insulating film 19 with $O_2$. Subsequently, the interlayer insulating film 19 is polished by CMP. In this manner, the structure shown in FIGS. 24A, 24B, and 24C is formed.

In this manufacturing method, as described above, without using a method of forming an island-like pattern in one photolithography step (Photo Engraving Process: PEP) as the step of forming the memory cell MC, the memory cells MC are formed by using the step of forming an interconnection such as a word line or a bit line.

The above manufacturing method is repeated to make it possible to form the memory cells MC stacked on n layers by performing the PEP n+1 times (n is a natural number of 1 or more). In the third and fourth embodiments, the PEP needs to be performed 2n times to form the memory cells MC on the n layers. Therefore, in the fifth embodiment, in comparison with the third and fourth embodiments, the number of times of the PEP required to form the memory cells MC on the n layers can be reduced.

[5-6] Modification of Fifth Embodiment

The fifth embodiment is an example in which the silicon nitride films 14 and 15 are formed on side surfaces of the diodes DI on the first layer as first side wall films, and the silicon nitride film 15 is formed on a side surface of the word line WL as a second side wall film. However, the embodiment is not limited to this configuration. A silicon oxide film and a silicon nitride film may be formed from a side surface side of the diode DI as the first side wall films, and a silicon nitride film may be formed on a side surface of the word line WL as the second side wall film.

Similarly, the fifth embodiment is an example in which the silicon nitride films 15 and 18 are formed on a side surface of the diode DI11 on the second layer as first side wall films and the silicon nitride film 15 is formed on a side surface of the upper electrode layer TE11 as a second side wall film. However, the embodiment is not limited to this configuration. A silicon oxide film and a silicon nitride film may be formed from a side surface side of the diode DI11 as the first side wall films, and a silicon nitride film may be formed on a side surface of the upper electrode layer TE11 as the second side wall film.

[5-7] Effect of Fifth Embodiment

The fifth embodiment has the three effects described below.

First, an influence on a diode caused by fixed charges in an interlayer insulating film between memory cells can be suppressed. For example, when an $SiO_2$ film such as a polysilazane film containing large quantities of N and C is used as the interlayer insulating film, a backward current of the diode generated by bandbending is deteriorated due to an influence of fixed charges in the $SiO_2$ film. When the backward current is deteriorated, a load on a non-selected cell increases, which accelerates performance deterioration and increases power consumption.

In order to prevent an influence caused by the fixed charges, a silicon nitride film or a silicon oxide film including low fixed charges is used as a side wall film of a diode. For this reason, the fixed charges are distanced from the diode to make it possible to suppress the backward current. At this time, a certain finding about a film thickness of the side wall film of the diode is obtained, and a thickness of about 10 to 20 nm is required.

More specifically, in the fifth embodiment, since the silicon nitride films 14 and 15 (film thickness of 10 to 20 nm) are formed on the side surface of the diode DI, an influence on the diode caused by the fixed charges in the interlayer insulating film 16 can be prevented. In this manner, performance deterioration of the memory cell and an increase in power consumption can be prevented. Even though a silicon oxide film and a silicon nitride film are used as the side wall films of the diode DI in place of the silicon nitride films 14 and 15, the same effect as described above can be obtained.

Furthermore, since the silicon nitride films 15 and 18 (film thickness of 10 to 20 nm) are formed on the side surface of the diode DI11, an influence on the diode caused by the fixed charges in the interlayer insulating film 19 can be prevented. In this manner, performance deterioration of the memory cell and an increase in power consumption can be prevented. Even though a silicon oxide film and a silicon nitride film are used as the side wall films of the diode DI11 in place of the silicon nitride films 15 and 18, the same effect as described above can be obtained.

Second, when an interlayer insulating film is formed between memory cells, an interconnection can be advantageously prevented from being oxidized. For example, when polysilazane is to be formed, an organic film containing large quantities of Si and N is applied to a cross-point memory cell. Thereafter, a thermal oxidation step is performed to replace N or C in the applied film with O. In this case, it is understood that a metal film (for example, W) constituting the interconnection is oxidized by the thermal oxidation step.

However, when a silicon nitride film is formed with a predetermined film thickness between the applied film and the interconnection, the problem can be solved. However, this method has a drawback. When the silicon nitride film is thickened, a capacity of the interconnection increases accordingly, which accelerates performance deterioration. For this reason, a film thickness of the silicon nitride film between the applied film and the interconnection needs to be suppressed to about 5 nm.

More specifically, when the silicon nitride film 15 is formed on a side surface of the word line WL, oxidation of the word line WL caused by a process in formation of the interlayer insulating film 16 can be prevented. In this manner, an interconnection capacity is suppressed from increasing, and the performance deterioration of the memory cell can be prevented.

Third, an influence from an adjacent memory cell can be advantageously suppressed. In the cross-point memory cell array, when miniaturization is advanced to shorten a distance between adjacent memory cells, a problem occurs. That problem is the occurrence of GIDL, in which a leakage current flows from a diode of a non-selected memory cell to an interconnection through a thin interlayer insulating film. In particular, near a corner or a junction of the memory cells, a backward current of the diode increases because electric field concentration occurs. In this manner, performance deterioration of the memory cells or an increase in power consumption occurs.

In order to prevent this problem, the electric field concentration needs to be moderated. When the side wall film near the diode is constituted by a silicon nitride film having a high dielectric constant, an electric field near a junction which causes leakage from the diode can be reduced. In this manner, an influence from an adjacent memory cell can be reduced.

In the manufacturing method, the memory cells MC stacked on the n layers can be formed by performing PEP n+1 times (n is a natural number of 1 or more). In the third and fourth embodiments, the PEP needs to be performed 2n times to form the memory cells MC on the n layers. Therefore, in the fifth embodiment, in comparison with the third and fourth embodiments, the number of times of the PEP required to form the memory cells MC on the n layers can be reduced.

As described above, according to the fifth embodiment, a silicon nitride film having a minimum film thickness required to prevent oxidation is formed on a side surface of an interconnection, and a silicon nitride film having a film thickness larger than that of the silicon nitride film on the side surface of the interconnection is formed on a side surface of a rectifying element (for example, diode). In this manner, an influence on a rectifying element caused by fixed charges in an interlayer insulating film can be suppressed, and further the interconnection and an electrode can be prevented from being oxidized.

[6] Sixth Embodiment

[6-1] Overall Configuration

Since an overall configuration of a semiconductor memory device according to a sixth embodiment is the same as that of the first embodiment, the overall configuration will not be described.

[6-2] Memory Cell Array

A configuration of the cross-point memory cell array 2 according to the sixth embodiment will be described.

FIG. 30A is a plan view of the memory cell array 2 according to the sixth embodiment. As shown in FIG. 30A, a plurality of first conductive lines extending in a bit line direction (first direction), for example, the bit lines BL are arranged at predetermined intervals in a word line direction (second direction). A plurality of second conductive lines extending in the word line direction, for example, the word lines WL are arranged at predetermined intervals in the bit line direction perpendicular to the bit line BL.

At crossing positions of the bit lines BL and the word lines WL, memory cells MC are arranged, respectively.

[6-3] Memory Cell

Figure 30C:
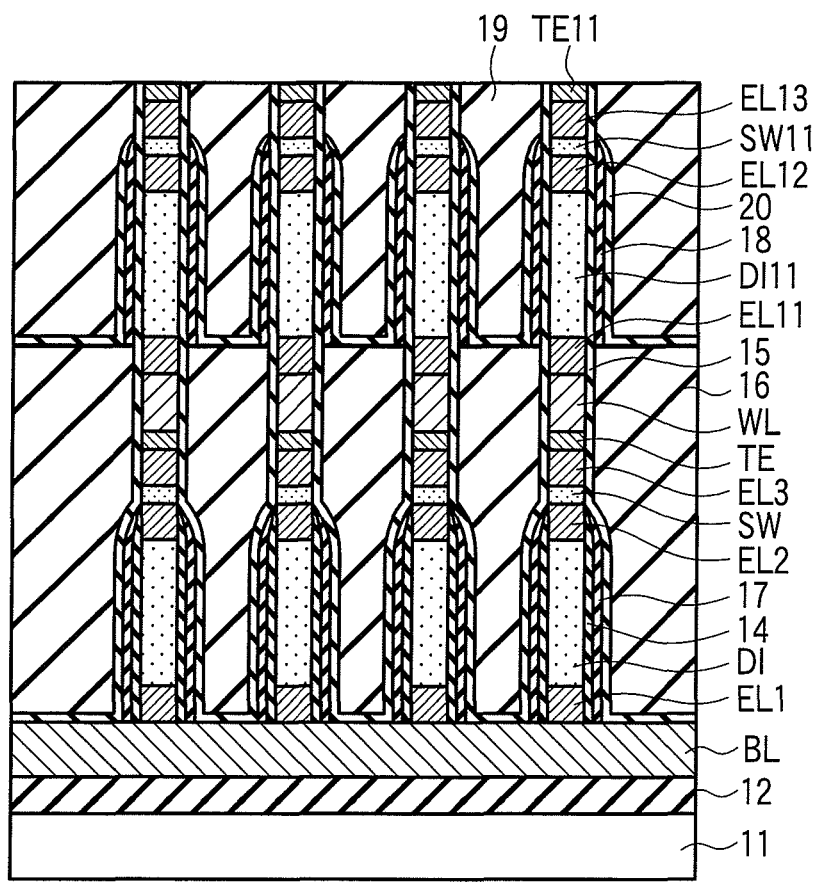
FIG. 30C is a sectional view along a 30C-30C line in FIG. 30A.

A sectional structure of the memory cell MC will be described below with reference to FIGS. 30B and 30C. FIG. 30B is a sectional view along a 30B-30B line (word line direction) in FIG. 30A. FIG. 30C is a sectional view along a 30C-30C line (bit line direction) in FIG. 30A.

The sectional structure along the line 30B-30B line of the memory cell MC is as follows.

As shown in FIG. 30B, the memory cells MC on a first layer comprise rectifying elements, for example, diodes DI connected in series between the bit line BL and the word line WL, and switching elements SW.

On the semiconductor substrate 11, the interlayer insulating film 12 is formed. The bit line BL is formed on the interlayer insulating film 12, and the interlayer insulating film 12 is arranged between the bit lines BL.

Furthermore, on a side surface of the bit line BL, the barrier film 13 is formed, and the barrier film 13 is arranged between the bit line BL and the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cells MC on the first layer are formed between the bit line BL and the word line WL, and include the first electrode layer EL1, the diode DI, the second electrode layer EL2, the switching element SW, the third electrode layer EL3, and the upper electrode layer TE.

On a side surface of the first electrode layer EL1, a side surface of the diode DI, and a side surface of the second electrode layer EL2, a first side wall film is formed. The first side wall film includes, for example, the silicon nitride film 14, the silicon oxide film 17, and the silicon nitride film 15. More specifically, on the side surface of the first electrode layer EL1, the side surface of the diode DI, and the side surface of the second electrode layer EL2, the silicon nitride film 14, the silicon oxide film 17, and the silicon nitride film 15 are sequentially formed from the side surface side. For example, a film thickness of the silicon nitride film 14 is about 1 nm, a film thickness of the silicon oxide film 17 is about 5 nm, and the film thickness of the silicon nitride film 15 is 5 nm or less.

On a side surface of the switching element SW, a side surface of the third electrode layer EL3, and a side surface of the upper electrode layer TE, a second side wall film, for example, the silicon nitride film 15 is formed.

The interlayer insulating film 16 is formed between the plurality of memory cells MC on the first layer. The interlayer insulating film 16 is constituted by an applied oxide film, for example, a polysilazane film, formed by an applying method. The word line WL is arranged on the upper electrode layer TE and the interlayer insulating film 16.

Furthermore, on the word line WL, the first electrode layer EL11, the diode DI11, the second electrode layer EL12, the switching element SW11, the third electrode layer EL13, and the upper electrode layer TE11 are sequentially formed.

A sectional structure along the 30C-30C line of the memory cell MC is as follows.

As shown in FIG. 30C, the interlayer insulating film 12 is formed on the semiconductor substrate 11. The bit line BL is formed on the interlayer insulating film 12.

On the bit line BL, the first electrode layer EL1, the diode DI, the second electrode layer EL2, the switching element SW, the third electrode layer EL3, and the upper electrode layer TE are sequentially formed. On the upper electrode layer TE, the word line WL is formed. More specifically, the memory cells MC on the first layer are formed between the bit line BL and the word line WL.

On the side surface of the first electrode layer EL1, the side surface of the diode DI, and the side surface of the second electrode layer EL2, the first side wall films, for example, the silicon nitride film 14, the silicon oxide film 17, and the silicon nitride film 15 are sequentially formed from the side surface side.

On the side surface of the switching element SW, the side surface of the third electrode layer EL3, the side surface of the upper electrode layer TE, and a side surface of the word line WL, a second side wall film, for example, the silicon nitride film 15 is formed. Furthermore, the interlayer insulating film 16 is formed between the plurality of memory cells MC on the first layer.

On the word line WL, the first electrode layer EL11, the diode DI11, the second electrode layer EL12, the switching element SW11, the third electrode layer EL13, and the upper electrode layer TE11 are sequentially formed. More specifically, on the word line WL, the memory cells MC on a second layer are formed.

On a side surface of the first electrode layer EL11, for example, the silicon nitride film 15 is formed. On a side surface of the diode DI11 and a side surface of the second electrode layer EL12, first side wall films, for example, the silicon nitride film 15, a silicon oxide film 18, and a silicon nitride film 20 are sequentially formed from the side surface side.

On the side surface of the switching element SW11, a side surface of the third electrode layer EL13, and a side surface of the upper electrode layer TE11, a second side wall film, for example, the silicon nitride film 15 is formed. Furthermore, the interlayer insulating film 19 is formed between the plurality of memory cells MC on the second layer.

[6-4] Diode and Switching Element Constituting Memory Cell

Since a diode and a switching element of the memory cell MC according to the sixth embodiment are the same as those in the first embodiment, the diode and the switching element will not be described.

[6-5] Manufacturing Method

A method of manufacturing the semiconductor memory device according to the sixth embodiment is performed as follows.

In FIG. 26C illustrating the manufacturing method of the fifth embodiment described above, on the memory cells MC and the bit line BL, the silicon nitride film 14 is formed by, for example, CVD, low-temperature CVD, or ALD. Furthermore, on the silicon nitride film 14, the silicon oxide film 17 is formed by, for example, CVD, low-temperature CVD, or ALD.

Subsequently, on a side surface of the diode DI, the silicon nitride film 14 and the silicon oxide film 17 serving as side wall films are formed. More specifically, by using RIE, the silicon nitride film 14 and the silicon oxide film 17 above the side surface of the diode DI are etched to leave the silicon nitride film 14 and the silicon oxide film 17 on the side surface of the diode DI.

On the memory cells MC, the silicon oxide film 17, and the bit line BL, the silicon nitride film 15 is formed by, for example, CVD, low-temperature CVD, or ALD.

In FIG. 28C, on the silicon nitride film 15 and the interlayer insulating film 16, the silicon oxide film 18 is formed by, for example, CVD, low-temperature CVD, or ALD.

Furthermore, the silicon nitride film 20 is formed on the silicon oxide film 18 by, for example, CVD, low-temperature CVD, or ALD.

Subsequently, on a side surface of the diode DI11, the silicon nitride film 15, the silicon oxide film 18, and the silicon nitride film 20 serving as side wall films are formed. More specifically, by using RIE, the silicon oxide film 18 and the silicon nitride film 20 above the side surface of the diode DI11 are etched to leave the silicon nitride film 15, the silicon oxide film 18, and the silicon nitride film 20 on the side surface of the diode DI.

Since the other steps are the same as those in the fifth embodiment, the steps will not be described.

[6-6] Modification of Sixth Embodiment

The sixth embodiment is an example in which the silicon nitride film 14, the silicon oxide film 17, and the silicon nitride film 15 are formed on side surfaces of the diodes DI on the first layer as first side wall films, and the silicon nitride film 15 is formed on a side surface of the word line WL as a second side wall film. However, the embodiment is not limited to this configuration. A silicon oxide film, a silicon nitride film, and a silicon nitride film may be formed from a side surface side of the diode DI as the first side wall films, and a silicon nitride film may be formed on a side surface of the word line WL as the second side wall film.

Similarly, the sixth embodiment is an example in which the silicon nitride films 15, the silicon oxide film 18, and the silicon nitride film 20 are formed on a side surface of the diode DI11 on the second layer as first side wall films and the silicon nitride film 15 is formed on a side surface of the upper electrode layer TE11 as a second side wall film. However, the embodiment is not limited to this configuration. A silicon oxide film, a silicon nitride film, and a silicon nitride film may be formed from a side surface side of the diode DI11 as the first side wall films, and a silicon nitride film may be formed as the second side wall film.

[6-7] Effect of Sixth Embodiment

In the sixth embodiment, since the silicon nitride film 14, the silicon oxide film 17, and the silicon nitride film 15 are formed on the side surface of the diode DI, an influence on the diode caused by fixed charges in the interlayer insulating film 16 can be prevented. In this manner, performance deterioration of a memory cell and an increase in power consumption can be prevented. A total film thickness of the silicon nitride film 14, the silicon oxide film 17, and the silicon nitride film 15 is about 10 to 20 nm. In this case, the silicon nitride film 14 is a film used to prevent electric field concentration and to prevent a backward current from increasing. The silicon oxide film 17 is a film used to secure a distance from the fixed charges, and is a low-k film. The silicon nitride film 15 prevents N and C serving as sources of fixed charges from being diffused from the interlayer insulating film 16.

Even though a silicon oxide film, a silicon nitride film, and a silicon nitride film are used in place of the silicon nitride film 14, the silicon oxide film 17, and the silicon nitride film 15 as the side wall films of the diode DI, the same effect as described above can be obtained.

Since the silicon nitride film 15, the silicon oxide film 18, and the silicon nitride film 20 are formed on the side surface of the diode DI11, an influence on the diode caused by fixed charges in the interlayer insulating film 19 can be prevented. In this manner, performance deterioration of a memory cell and an increase in power consumption can be prevented. A total film thickness of the silicon nitride film 15, the silicon oxide film 18, and the silicon nitride film 20 is about 10 to 20 nm. In this case, the silicon nitride film 15 is a film used to prevent electric field concentration and to prevent a backward current from increasing. The silicon oxide film 18 is a film used to secure a distance from the fixed charges, and is a low-k film. The silicon nitride film 20 prevents N and C serving as sources of fixed charges from being diffused from the interlayer insulating film 19.

Even though a silicon oxide film, a silicon nitride film, and a silicon nitride film are used in place of the silicon nitride film 15, the silicon oxide film 18, and the silicon nitride film 20 as the side wall films of the diode DI11, the same effect as described above can be obtained. The other effects are the same as those in the fifth embodiment.

As described above, according to the sixth embodiment, a silicon nitride film having a minimum film thickness required to prevent oxidation is formed on a side surface of an interconnection, and a silicon nitride film having a film thickness larger than that of the silicon nitride film on the side wall of the interconnection is formed on a side wall of a rectifying element (for example, diode). In this manner, an influence on a rectifying element caused by fixed charges in an interlayer insulating film can be suppressed, and the interconnection and an electrode can be further prevented from being oxidized.

The embodiments can provide a semiconductor memory device which can suppress an influence on a rectifying element caused by fixed charges in an interlayer film formed between memory cells and can further prevent an interconnection and an electrode from being oxidized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first conductive line extending in a first direction;
    a second conductive line extending in a second direction crossing the first direction;
    a rectifying element connected between the first conductive line and the second conductive line;
    a switching element connected in series with the rectifying element between the first conductive line and the second conductive line;
    a first side wall film formed on a side surface of the rectifying element; and
    a second side wall film formed on a side surface of at least one of the first conductive line and the second conductive line, at least one of a film structure and a film thickness of the second side wall film being different from that of the first side wall film.

2. The semiconductor memory device of claim 1,
    wherein, as the first side wall film, a first silicon nitride film, a first silicon oxide film, and a second silicon nitride film are formed on the side surface of the rectifying element in this order, and
    the second side wall film includes the second silicon nitride film formed on the side surface of at least one of the first conductive line and the second conductive line.

3. The semiconductor memory device of claim 1,
    wherein, as the first side wall film, a first silicon oxide film, a first silicon nitride film, and a second silicon nitride film are formed on the side surface of the rectifying element in this order, and
    the second side wall film includes the second silicon nitride film formed on the side surface of at least one of the first conductive line and the second conductive line.

4. The semiconductor memory device of claim 1,
    wherein, as the first side wall film, a first silicon nitride film and a second silicon nitride film are formed on the side surface of the rectifying element in this order, and
    the second side wall film includes the second silicon nitride film formed on the side surface of at least one of the first conductive line and the second conductive line.

5. The semiconductor memory device of claim 1,
    wherein, as the first side wall film, a first silicon oxide film and a first silicon nitride film are formed on the side surface of the rectifying element in this order, and
    the second side wall film includes the first silicon nitride film formed on the side surface of at least one of the first conductive line and the second conductive line.

6. The semiconductor memory device of claim 1,
    further comprising an interlayer insulating film on the side surface of the rectifying element, a side surface of the switching element, and the side surface of at least one of the first conductive line and the second conductive line,
    wherein the interlayer insulating film includes an applied oxide film formed by application.

7. The semiconductor memory device of claim 1, wherein the rectifying element includes a diode.

8. The semiconductor memory device of claim 1, wherein at least one of the first conductive line and the second conductive line includes a metal material.

9. The semiconductor memory device of claim 1, wherein the switching element includes a variable resistance element made of a material whose resistance changes depending on at least one of voltage, current, and heat.

10. The semiconductor memory device of claim 1, wherein the switching element includes a phase change element made of a material whose physicality such as a resistance or a capacitance changes by a phase change.

11. The semiconductor memory device of claim 1, further comprising:
    a first electrode layer between the first conductive line and the rectifying element;
    a second electrode layer between the rectifying element and the switching element; and
    a third electrode layer between the switching element and the second conductive line.

* * * * *